(12) United States Patent
Fukuda et al.

(10) Patent No.: US 12,532,470 B2
(45) Date of Patent: Jan. 20, 2026

(54) SEMICONDUCTOR MEMORY DEVICE

(71) Applicant: Kioxia Corporation, Tokyo (JP)

(72) Inventors: Natsuki Fukuda, Yokkaichi Mie (JP); Tadashi Iguchi, Yokkaichi Mie (JP)

(73) Assignee: Kioxia Corporation, Tokyo (JP)

( * ) Notice: Subject to any disclaimer, the term of this patent is extended or adjusted under 35 U.S.C. 154(b) by 678 days.

(21) Appl. No.: 17/892,940

(22) Filed: Aug. 22, 2022

(65) Prior Publication Data

US 2023/0088929 A1     Mar. 23, 2023

(30) Foreign Application Priority Data

Sep. 21, 2021  (JP) ................................. 2021-153406

(51) Int. Cl.
*H10B 43/27*   (2023.01)
*H10B 41/27*   (2023.01)

(52) U.S. Cl.
CPC ............ *H10B 43/27* (2023.02); *H10B 41/27* (2023.02)

(58) Field of Classification Search
CPC ................................ H10B 43/27; H10B 41/27
See application file for complete search history.

(56) References Cited

U.S. PATENT DOCUMENTS

| | | | |
|---|---|---|---|
| 9,754,963 B1 | 9/2017 | Kawamura et al. | |
| 10,910,391 B2 | 2/2021 | Hashimoto et al. | |
| 2020/0035694 A1* | 1/2020 | Kaminaga | H10D 88/00 |
| 2023/0080606 A1* | 3/2023 | Lee | H10B 41/27 |
| | | | 257/314 |
| 2023/0081373 A1* | 3/2023 | Kang | H10B 43/50 |
| | | | 257/314 |

* cited by examiner

*Primary Examiner* — Christopher A Johnson
(74) *Attorney, Agent, or Firm* — Foley & Lardner LLP

(57) ABSTRACT

A semiconductor memory device includes a substrate including a first region and a second region, a plurality of first conductive layers, a first semiconductor layer disposed in the first region, an electric charge accumulating layer, a contact electrode disposed in the second region and connected to one of the plurality of first conductive layers, and a plurality of first structures and a plurality of second structures disposed in the second region. The first structure includes a second semiconductor layer opposed to the plurality of first conductive layers and including a semiconductor material in common with the first semiconductor layer, and a first insulating layer disposed between the plurality of first conductive layers and the second semiconductor layer and including an insulating material in common with the electric charge accumulating layer. The second structure does not include the semiconductor material or the insulating material.

17 Claims, 80 Drawing Sheets

SEMICONDUCTOR MEMORY DEVICE

CROSS-REFERENCE TO RELATED APPLICATIONS

This application is based upon and claims the benefit of Japanese Patent Application No. 2021-153406, filed on Sep. 21, 2021, the entire contents of which are incorporated herein by reference.

BACKGROUND

Field

Embodiments described herein relate generally to a semiconductor memory device.

Description of the Related Art

There has been known a semiconductor memory device including a substrate, a plurality of conductive layers arranged in a direction intersecting with a surface of the substrate, a semiconductor layer extending in the direction intersecting with the surface of the substrate, and opposed to the plurality of conductive layers, and electric charge accumulating layers disposed between these conductive layers and the semiconductor layer.

DETAILED DESCRIPTION

Figure 1:
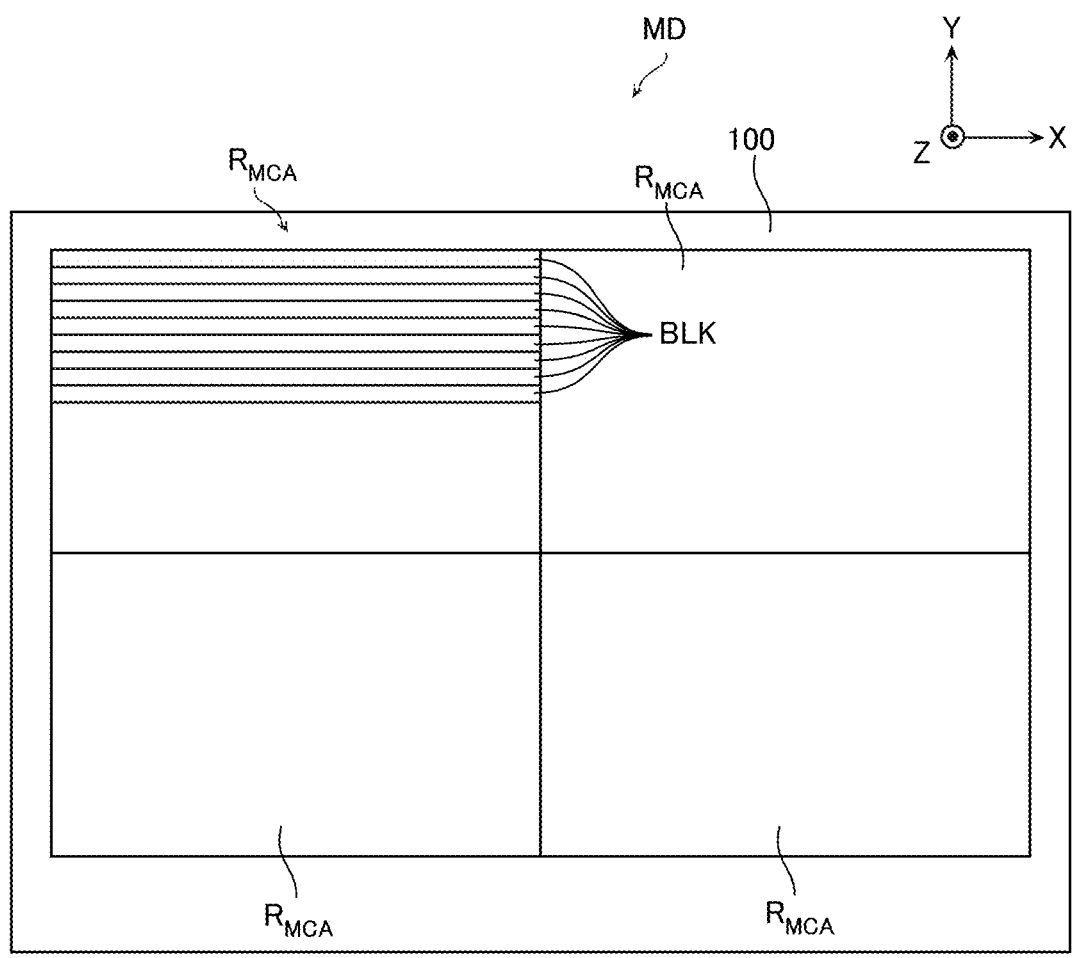
FIG. 1 is a schematic plan view illustrating a part of a configuration of a semiconductor memory device according to a first embodiment.

A semiconductor memory device according to one embodiment comprises: a substrate; a plurality of first conductive layers; a first semiconductor layer; an electric charge accumulating layer; a contact electrode; and a plurality of first structures and a plurality of second structures. The substrate includes a first region and a second region arranged in a first direction. The plurality of first conductive layers are arranged in a second direction intersecting with a surface of the substrate, and extend in the first direction across the first region and the second region. The first semiconductor layer is disposed in the first region, extends in the second direction, and is opposed to the plurality of first conductive layers. The electric charge accumulating layer is disposed between the plurality of first conductive layers and the first semiconductor layer. The contact electrode is disposed in the second region, extends in the second direction, and is connected to one of the plurality of first conductive layers. The plurality of first structures and the plurality of second structures are disposed in the second region, extend in the second direction, and have outer peripheral surfaces surrounded by the plurality of first conductive layers. The first structure includes a second semiconductor layer and a first insulating layer. The second semiconductor layer extends in the second direction, is opposed to the plurality of first conductive layers, and includes a semiconductor material in common with the first semiconductor layer. The first insulating layer is disposed between the plurality of first conductive layers and the second semiconductor layer, and includes an insulating material in common with the electric charge accumulating layer. The second structure does not include the semiconductor material or the insulating material.

Next, the semiconductor memory devices according to embodiments are described in detail with reference to the drawings. The following embodiments are only examples, and not described for the purpose of limiting the present invention. The following drawings are schematic, and for convenience of description, a part of a configuration and the like is sometimes omitted. Parts common in a plurality of embodiments are attached by same reference numerals and their descriptions may be omitted.

In this specification, when referring to a "semiconductor memory device", it may mean a memory die and may mean a memory system including a controller die, such as a memory chip, a memory card, and a Solid State Drive (SSD). Further, it may mean a configuration including a host computer, such as a smartphone, a tablet terminal, and a personal computer.

A "control circuit" in this specification may mean a peripheral circuit, such as a sequencer, disposed in a memory die, may mean a controller die, a controller chip, or the like connected to a memory die, and may mean a configuration including both of them.

In this specification, when it is referred that a first configuration "is electrically connected" to a second configuration, the first configuration may be directly connected to the second configuration, or the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when it is referred that the first configuration "is connected between" the second configuration and a third configuration, it may mean that the first configuration, the second configuration, and the third configuration are connected in series and the second configuration is connected to the third configuration via the first configuration.

In this specification, a direction parallel to an upper surface of the substrate is referred to as an X-direction, a direction parallel to the upper surface of the substrate and perpendicular to the X-direction is referred to as a Y-direction, and a direction perpendicular to the upper surface of the substrate is referred to as a Z-direction.

In this specification, a direction along a predetermined plane may be referred to as a first direction, a direction along this predetermined plane and intersecting with the first direction may be referred to as a second direction, and a direction intersecting with this predetermined plane may be referred to as a third direction. These first direction, second direction, and third direction may each correspond to any of the X-direction, the Y-direction, and the Z-direction and need not correspond to these directions.

Expressions such as "above" and "below" in this specification are based on the substrate. For example, a direction away from the substrate along the Z-direction is referred to as above and a direction approaching the substrate along the Z-direction is referred to as below. A lower surface and a lower end of a certain configuration mean a surface and an end portion at the substrate side of this configuration. An upper surface and an upper end of a certain configuration mean a surface and an end portion at a side opposite to the substrate of this configuration. A surface intersecting with the X-direction or the Y-direction is referred to as a side surface and the like.

In this specification, when referring to a "width", a "length", a "thickness", or the like in a predetermined direction of a configuration, a member, or the like, this may mean a width, a length, a thickness, or the like in a cross-sectional surface or the like observed with a Scanning electron microscopy (SEM), a Transmission electron microscopy (TEM), or the like.

First Embodiment

[Structure]

Figure 2:
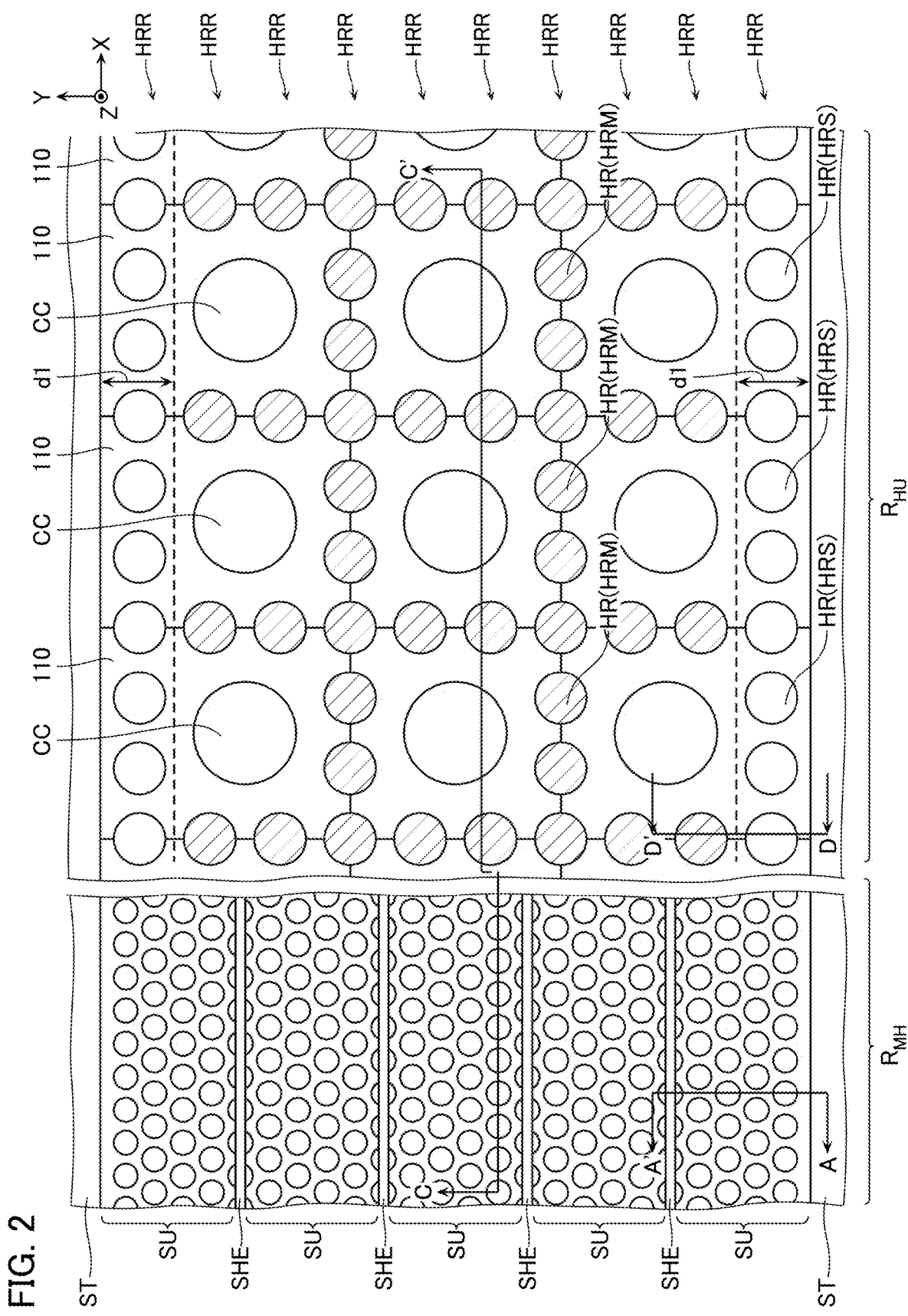
FIG. 2 is an enlarged schematic plan view illustrating a part of FIG. 1.
Figure 3:
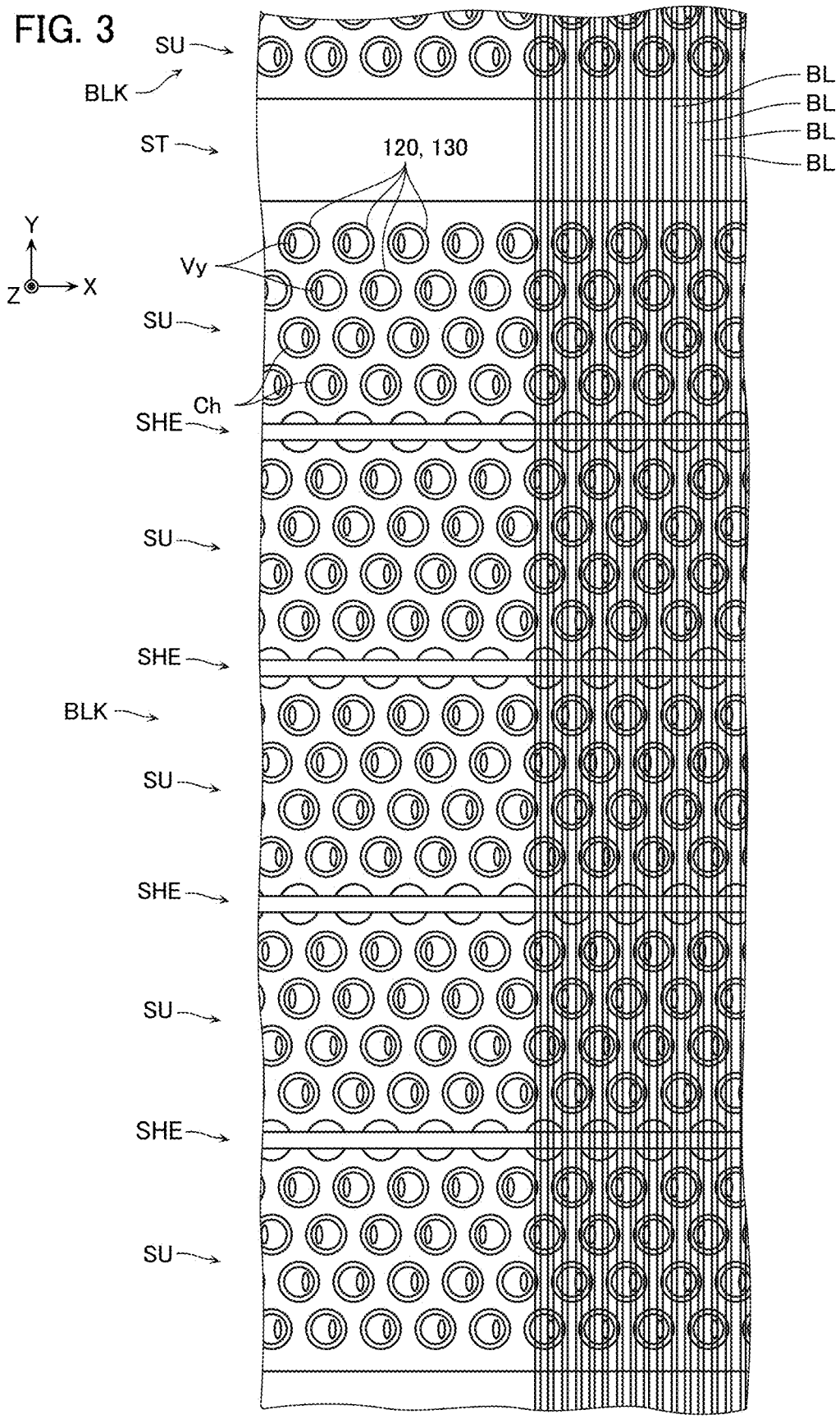
FIG. 3 is an enlarged schematic plan view illustrating a part of FIG. 2.
Figure 4:
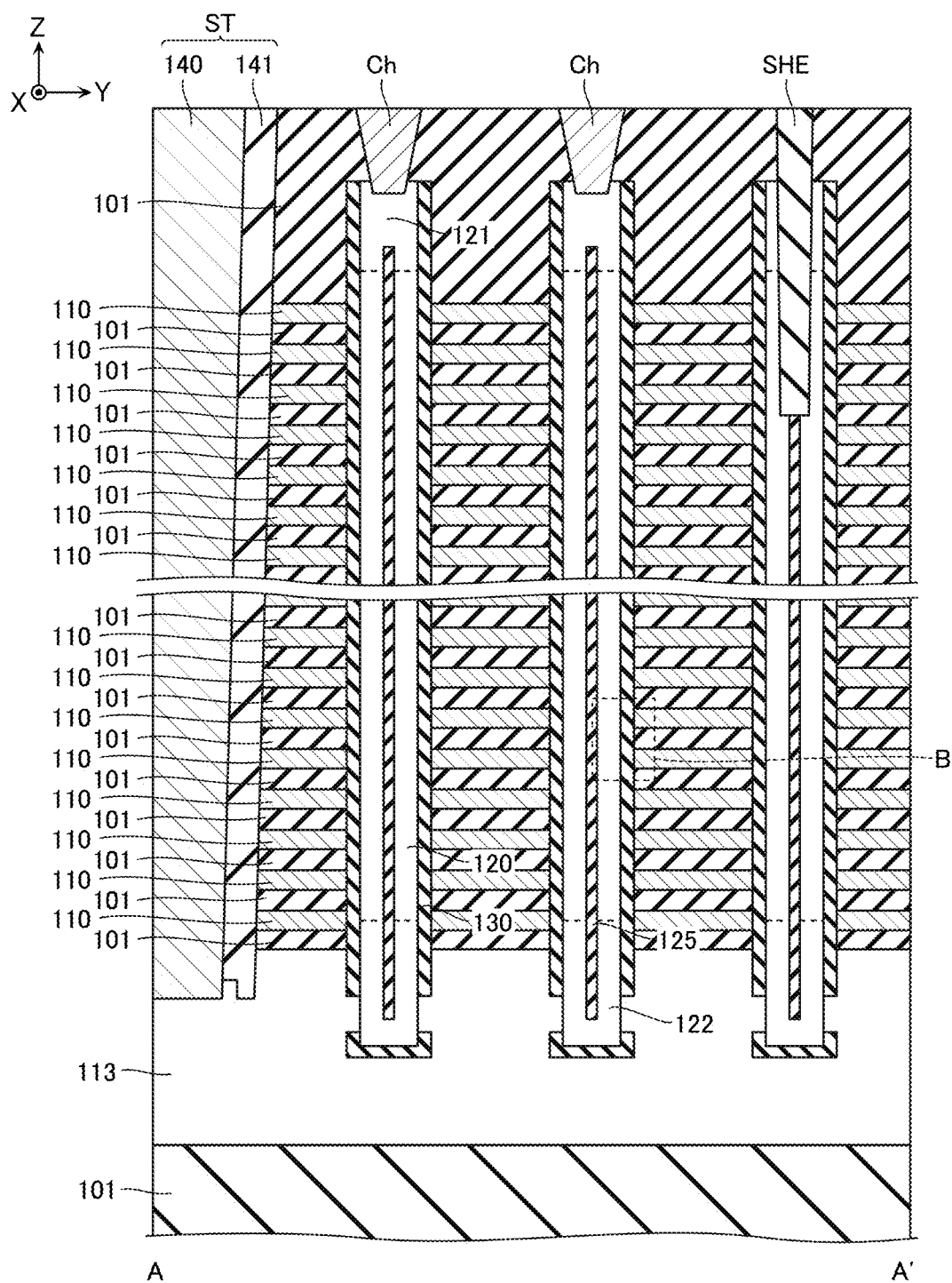
FIG. 4 is a schematic cross-sectional view taking the structure illustrated in FIG. 2 along the line A-A' and viewed along the arrow direction.
Figure 5:
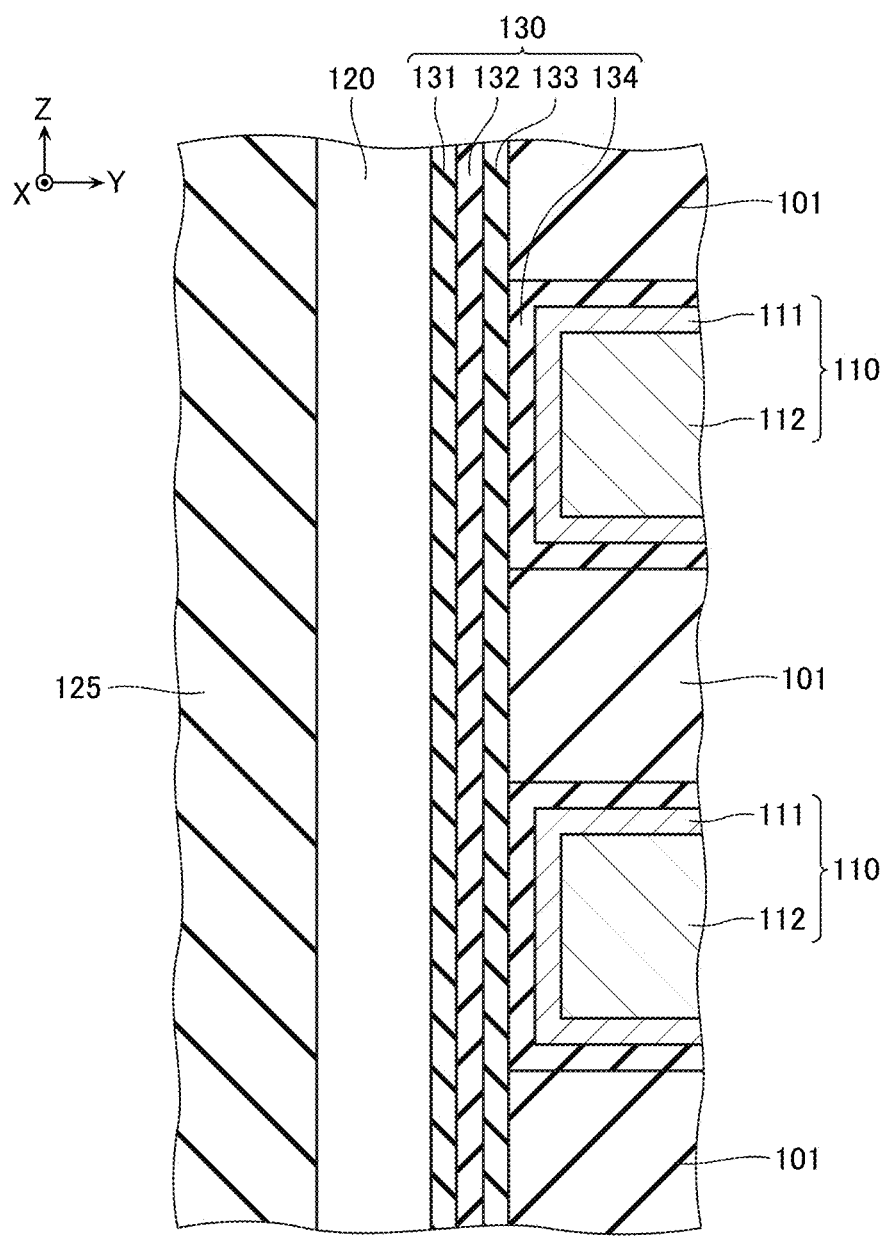
FIG. 5 is a schematic enlarged view of a part indicated by B in FIG. 4.
Figure 6:
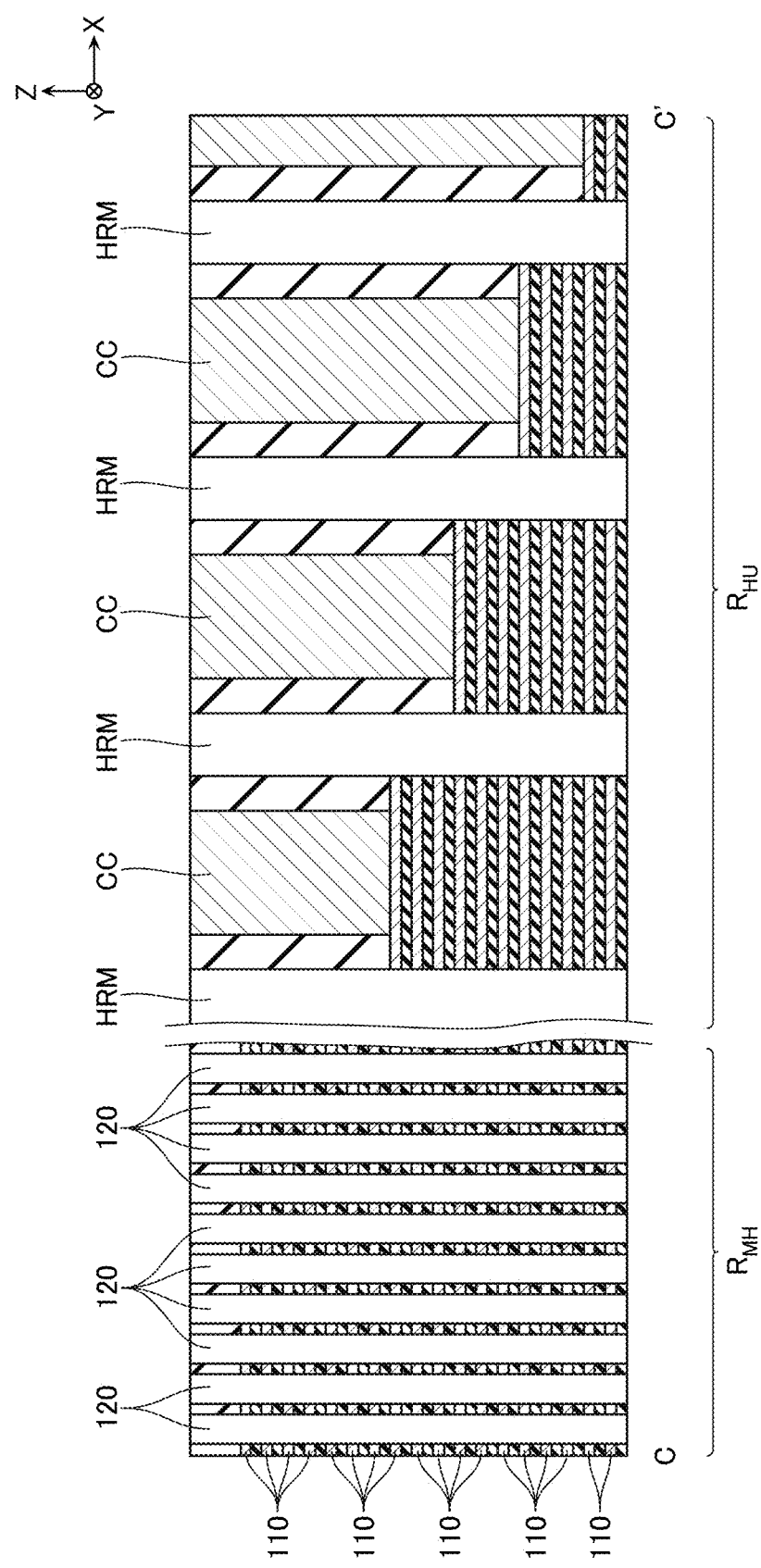
FIG. 6 is a schematic cross-sectional view taking the structure illustrated in FIG. 2 along the line C-C' and viewed along the arrow direction.
Figure 7:
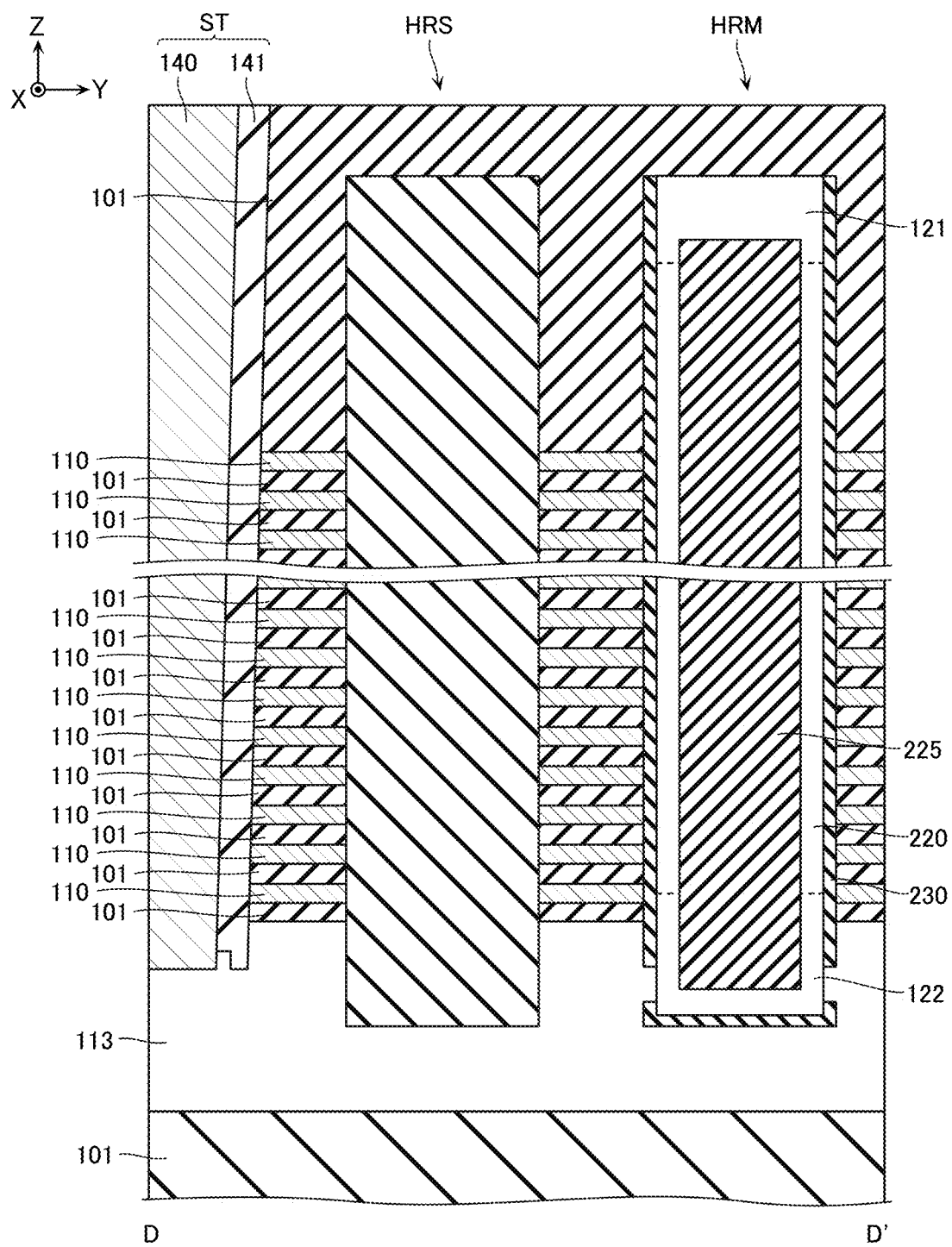
FIG. 7 is a schematic cross-sectional view taking the structure illustrated in FIG. 2 along the line D-D' and viewed along the arrow direction.

FIG. 1 is a schematic plan view illustrating a part of a configuration of a semiconductor memory device according to a first embodiment. FIG. 2 is an enlarged schematic plan view illustrating a part of FIG. 1. FIG. 3 is an enlarged schematic plan view illustrating a part of FIG. 2. FIG. 4 is a schematic cross-sectional view taking the structure illustrated in FIG. 2 along the line A-A' and viewed along the arrow direction. FIG. 5 is a schematic enlarged view of a part indicated by B in FIG. 4. While FIG. 5 illustrates a YZ cross-sectional surface, a structure similar to that in FIG. 5 is observed even when a cross-sectional surface along the center axis of a semiconductor layer 120 other than the YZ cross-sectional surface (such as a XZ cross-sectional surface) is observed. FIG. 6 is a schematic cross-sectional view taking the structure illustrated in FIG. 2 along the line C-C' and viewed along the arrow direction. FIG. 7 is a schematic cross-sectional view taking the structure illustrated in FIG. 2 along the line D-D' and viewed along the arrow direction.

The semiconductor memory device according to the first embodiment includes a memory die MD. For example, as illustrated in FIG. 1, the memory die MD includes a semiconductor substrate 100. In the illustrated example, the semiconductor substrate 100 is provided with four memory cell array regions $R_{MCA}$ arranged in the X-direction and the Y-direction. Further, each memory cell array region $R_{MCA}$ is provided with a plurality of memory blocks BLK arranged in the Y-direction.

For example, as illustrated in FIG. 2, the memory block BLK includes five string units SU arranged in the Y-direction. Between two memory blocks BLK mutually adjacent in the Y-direction, an inter-block structure ST extending in the X-direction is disposed. Between two string units SU mutually adjacent in the Y-direction, an inter-string unit insulating layer SHE, such as silicon oxide ($SiO_2$), extending in the X-direction is disposed.

The memory block BLK includes a memory hole region $R_{MH}$ and a hook-up region $R_{HU}$ arranged in the X-direction.

For example, as illustrated in FIG. 4, the memory hole region $R_{MH}$ includes a plurality of conductive layers 110 arranged in the Z-direction, a plurality of the semiconductor layers 120 extending in the Z-direction, and a respective plurality of gate insulating layers 130 disposed between the plurality of conductive layers 110 and the plurality of semiconductor layers 120.

The conductive layer 110 is an approximately plate-shaped conductive layer extending in the X-direction. For example, as illustrated in FIG. 5, the conductive layer 110 may include a stacked film of a barrier conductive layer 111, such as titanium nitride (TiN), and a metal layer 112, such as tungsten (W). Further, the conductive layer 110 may include the metal layer 112, such as molybdenum (Mo) and ruthenium (Ru). Further, for example, in a case where the conductive layer 110 includes the metal layer 112, such as molybdenum (Mo), the conductive layer 110 may include or need not include the barrier conductive layer 111, such as titanium nitride (TiN). Further, the conductive layer 110 may include, for example, polycrystalline silicon containing impurities, such as phosphorus (P) or boron (B). Between the respective adjacent plurality of conductive layers 110 arranged in the Z-direction, an insulating layer 101, such as silicon oxide ($SiO_2$), is disposed.

For example, as illustrated in FIG. 4, a conductive layer 113 is disposed below the conductive layers 110. The conductive layer 113 may include, for example, polycrystalline silicon containing N-type impurities, such as phosphorus (P), or P-type impurities, such as boron (B). Further, for example, a metal, such as tungsten (W), a conductive layer, such as tungsten silicide, or any other conductive layer may be disposed on a lower surface of the conductive layer 113. Further, between the conductive layer 113 and the conductive layer 110, the insulating layer 101, such as silicon oxide ($SiO_2$), is disposed.

The conductive layer 113 functions as, for example, a source line of a NAND flash memory. The source line is disposed in common for all the memory blocks BLK included in, for example, the memory cell array region $R_{MCA}$ (FIG. 1).

Among the plurality of conductive layers 110, one or a plurality of the conductive layers 110 positioned in the lowermost layer function as, for example, a source-side select gate line and gate electrodes of a plurality of source-side select transistors of the NAND flash memory. The one or plurality of conductive layers 110 are electrically independent for each of the memory blocks BLK.

A plurality of conductive layers 110 positioned above this function as word lines and gate electrodes of a plurality of memory transistors (memory cells) of the NAND flash memory. These conductive layers 110 are electrically independent for each of the memory blocks BLK.

One or a plurality of the conductive layers 110 positioned above this function as a drain-side select gate line and gate electrodes of a plurality of drain-side select transistors of the NAND flash memory. These conductive layers 110 have smaller widths in the Y-direction than the other conductive layers 110. Further, between two conductive layers 110 mutually adjacent in the Y-direction, the inter-string unit insulating layer SHE is disposed. These conductive layers 110 are electrically independent for each of the string units SU.

For example, as illustrated in FIG. 3, the semiconductor layers 120 are arranged in a predetermined pattern in the X-direction and the Y-direction. The semiconductor layer 120 functions as channel regions of a plurality of memory transistors (memory cells) and select transistors connected in series. The semiconductor layer 120 includes, for example, polycrystalline silicon (Si) or the like. For example, as illustrated in FIG. 4, the semiconductor layer 120 has an approximately cylindrical shape, and an insulating layer 125, such as silicon oxide, is provided at the center portion. Further, the semiconductor layers 120 have outer peripheral surfaces each surrounded by the conductive layers 110 and are opposed to the conductive layers 110.

On an upper end portion of the semiconductor layer 120, an impurity region 121 containing N-type impurities, such as phosphorus (P), is disposed. In the example of FIG. 4, a boundary line between the upper end portion of the semiconductor layer 120 and a lower end portion of the impurity region 121 is indicated by a dashed line. The impurity region 121 is connected to a bit line BL (FIG. 3) via a contact electrode Ch and a contact electrode Vy (FIG. 3).

On a lower end portion of the semiconductor layer 120, an impurity region 122 containing N-type impurities, such as phosphorus (P), or P-type impurities, such as boron (B), is disposed. In the example of FIG. 4, a boundary line between the lower end portion of the semiconductor layer 120 and an upper end portion of the impurity region 122 is indicated by a dashed line. The impurity region 122 is connected to the conductive layer 113.

The gate insulating layer 130 has an approximately cylindrical shape covering the outer peripheral surface of the semiconductor layer 120. For example, as illustrated in FIG. 5, the gate insulating layer 130 includes a tunnel insulating layer 131, an electric charge accumulating layer 132, a block insulating layer 133, and parts of a plurality of high dielectric constant insulating layers 134 stacked between the semiconductor layer 120 and the conductive layers 110. The tunnel insulating layer 131 and the block insulating layer 133 are, for example, insulating films such as silicon oxide ($SiO_2$). The electric charge accumulating layer 132 is, for example, a film capable of accumulating electric charges, such as silicon nitride ($Si_3N_4$). The high dielectric constant insulating layer 134 is, for example, a metal oxide film of alumina ($Al_2O_3$) or the like. The tunnel insulating layer 131, the electric charge accumulating layer 132, and the block insulating layer 133 have approximately cylindrical shapes, and extend in the Z-direction along the outer peripheral surface of the semiconductor layer 120. A plurality of the high dielectric constant insulating layers 134 are disposed corresponding to the plurality of conductive layers 110, and disposed on upper surfaces, lower surfaces, and opposed surfaces to the semiconductor layer 120, of the conductive layers 110. Among the high dielectric constant insulating layer 134, a portion disposed on the opposed surface to the semiconductor layer 120 of the conductive layer 110 functions as a part of the gate insulating layer 130.

FIG. 5 illustrates an example of the gate insulating layer 130 including the insulating electric charge accumulating layer 132, such as silicon nitride. However, the gate insulating layer 130 may include, for example, a floating gate, such as polycrystalline silicon containing N-type or P-type impurities.

For example, as illustrated in FIG. 2, the hook-up region $R_{HU}$ includes end portions in the X-direction of the plurality of conductive layers 110. Further, the hook-up region $R_{HU}$ includes a plurality of contact electrodes CC arranged in the X-direction and the Y-direction. Further, the hook-up region $R_{HU}$ includes a plurality (the number is 10 in the illustrated example) of supporting structure regions HRR arranged in the Y-direction.

As illustrated in FIG. 6, the contact electrode CC extends in the Z-direction and has its lower end connected to the conductive layer 110. The contact electrode CC may include, for example, a stacked film of a barrier conductive film, such as titanium nitride (TiN), and a metal film, such as tungsten (W). In the example of FIG. 2, the plurality of contact electrodes CC are arranged in the X-direction in three rows. A plurality of contact electrodes CC included in one of these three rows are connected to, for example, the 3n+1-th (n is an integer of 0 or more) conductive layer 110 counted from above. Further, a plurality of contact electrodes CC included in one of these three rows are connected to, for example, the 3n+2-th conductive layer 110 counted from above. Further, a plurality of contact electrodes CC included in one of these three rows are, for example, connected to, for example, the 3n+3-th conductive layer 110 counted from above.

A plurality of the supporting structure region HRR each include a plurality of supporting structures HR arranged in the X-direction.

In the example of FIG. 2, the first and tenth supporting structure regions HRR counted from one side in the Y-direction (such as the Y-direction negative side) includes a plurality of supporting structures HRS arranged in a predetermined pitch in the X-direction. For example, as illustrated in FIG. 7, the supporting structure HRS has an approximately columnar shape extending in the Z-direction. An upper end of the supporting structure HRS is disposed above an upper surface of the uppermost conductive layer 110. A lower end of the supporting structure HRS is disposed below a lower surface of the lowermost conductive layer 110. The supporting structure HRS includes, for example, silicon oxide ($SiO_2$).

In FIG. 2, dotted lines indicate respective boundaries of ranges of a distance d1 from an end portion on one side (such as the Y-direction negative side) and an end portion on the other side (such as the Y-direction positive side) in the Y-direction of the conductive layer 110. The first and tenth supporting structure regions HRR counted from one side in the Y-direction are disposed in regions outside of these two dotted lines. The second to ninth supporting structure regions HRR counted from one side in the Y-direction are disposed in regions inside of these two dotted lines.

In the example of FIG. 2, the fourth and seventh supporting structure regions HRR counted from one side in the Y-direction include a plurality of supporting structures HRM arranged in a predetermined pitch in the X-direction. For example, as illustrated in FIG. 7, the supporting structure HRM has an approximately columnar shape extending in the Z-direction. An upper end of the supporting structure HRM is disposed above the upper surface of the uppermost conductive layer 110. A lower end of the supporting structure HRM is disposed below the lower surface of the lowermost conductive layer 110. The supporting structure HRM includes, for example, a semiconductor layer 220 extending in the Z-direction, and an insulating layer 230 disposed between the plurality of conductive layers 110 and the semiconductor layer 220.

The semiconductor layer 220 is basically configured similarly to the semiconductor layer 120. However, the semiconductor layer 220 does not function as the channel regions of the memory transistors (memory cell) or the select transistor. Further, the semiconductor layer 220 is not connected to the bit line BL (FIG. 3). Further, an insulating layer 225, such as silicon oxide, is provided at the center portion of the semiconductor layer 220.

The insulating layer 230 is configured similarly to the gate insulating layer 130.

In the example of FIG. 2, the second, third, fifth, sixth, eighth, and ninth supporting structure regions HRR counted from one side in the Y-direction include a plurality of supporting structures HRM arranged in the X-direction. In these supporting structure regions HRR, a plurality of the supporting structures HRM are arranged avoiding the contact electrodes CC. That is, the plurality of supporting structures HRM included in the supporting structure region HRR are spaced from the contact electrodes CC. Further, each of these supporting structures HRM is disposed between two contact electrodes CC mutually adjacent in the X-direction.

Among the supporting structures HR disposed in the hook-up region $R_{HU}$, 30% or more may be the supporting structures HRM. More preferably, among the supporting structures HR disposed in the hook-up region $R_{HU}$ 50% or more may be the supporting structures HRM.

For example, as illustrated in FIG. 4, the inter-block structure ST includes a conductive layer 140 extending in the Z-direction and the X-direction, and an insulating layer 141, such as silicon oxide, disposed on a side surface in the Y-direction of the conductive layer 140. The conductive layer 140 is connected to the conductive layer 113. The conductive layer 140 may include, for example, a stacked film of a barrier conductive film, such as titanium nitride (TiN), and a metal film, such as tungsten (W).

[Manufacturing Method]

Next, with reference to FIG. 8 to FIG. 31, the manufacturing method of the semiconductor memory device according to the first embodiment is described. FIG. 8, FIG. 12, FIG. 14, FIG. 18, FIG. 20, and FIG. 22 to FIG. 29 are schematic cross-sectional views for describing the same manufacturing method, and illustrate cross-sectional surfaces corresponding to FIG. 4. FIG. 9 to FIG. 11, FIG. 30, and FIG. 31 are schematic cross-sectional views for describing the same manufacturing method, and illustrate cross-sectional surfaces corresponding to FIG. 6. FIG. 13, FIG. 15 to FIG. 17, FIG. 19, and FIG. 21 are schematic cross-sectional views for describing the same manufacturing method, and illustrate cross-sectional surfaces corresponding to FIG. 7.

In the manufacture of the semiconductor memory device according to the embodiment, first, wirings, transistors, and the like (not illustrated) that constitute peripheral circuits (not illustrated) are formed in the semiconductor substrate 100 (FIG. 1). Further, the insulating layer 101 is formed on upper surfaces of these structures.

Figure 8:
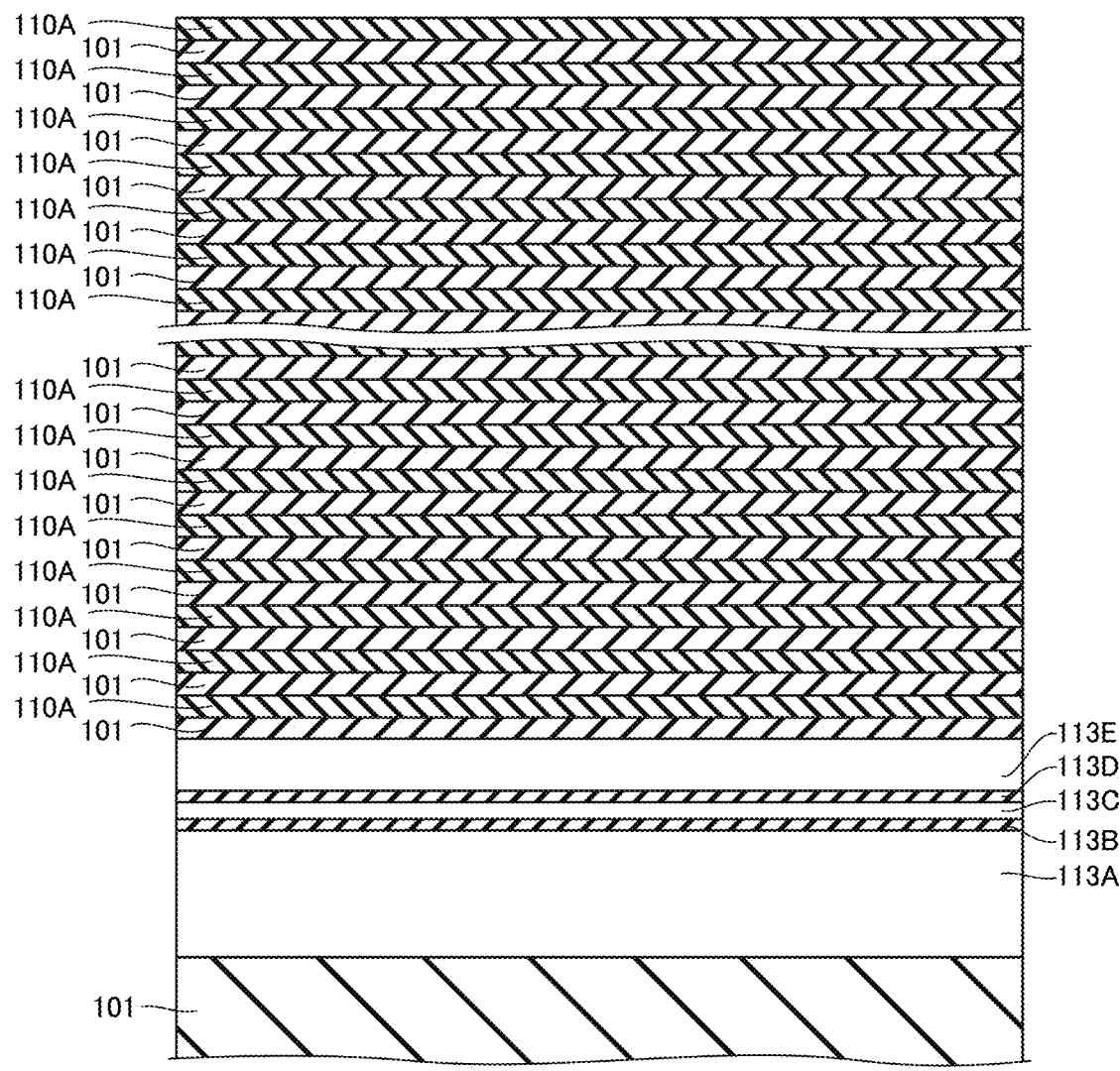
FIG. 8 is a schematic cross-sectional view for describing a manufacturing method of the semiconductor memory device according to the first embodiment.
Figure 9:
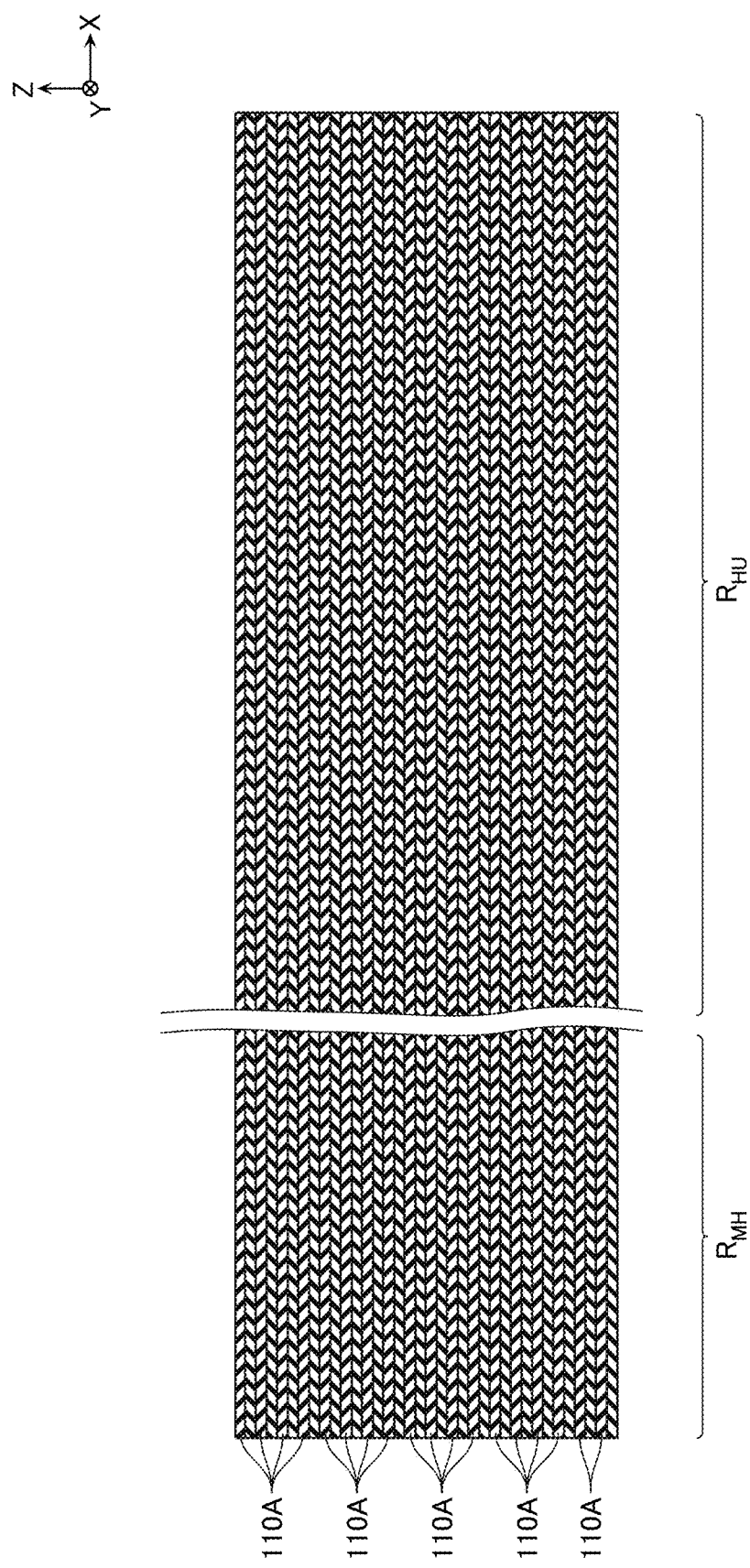
FIG. 9 is a schematic cross-sectional view for describing the same manufacturing method.

Next, for example, as illustrated in FIG. 8 and FIG. 9, a semiconductor layer 113A, such as silicon, a sacrifice layer 113B, such as silicon oxide, a sacrifice layer 113C, such as silicon, a sacrifice layer 113D, such as silicon oxide, and a semiconductor layer 113E, such as silicon, are formed on the insulating layer 101. Further, a plurality of the insulating layers 101 and a plurality of sacrifice layers 110A are formed alternately. The sacrifice layer 110A includes, for example, silicon nitride ($Si_3N_4$). This process is performed by a method, such as Chemical Vapor Deposition (CVD) or the like.

Figure 10:
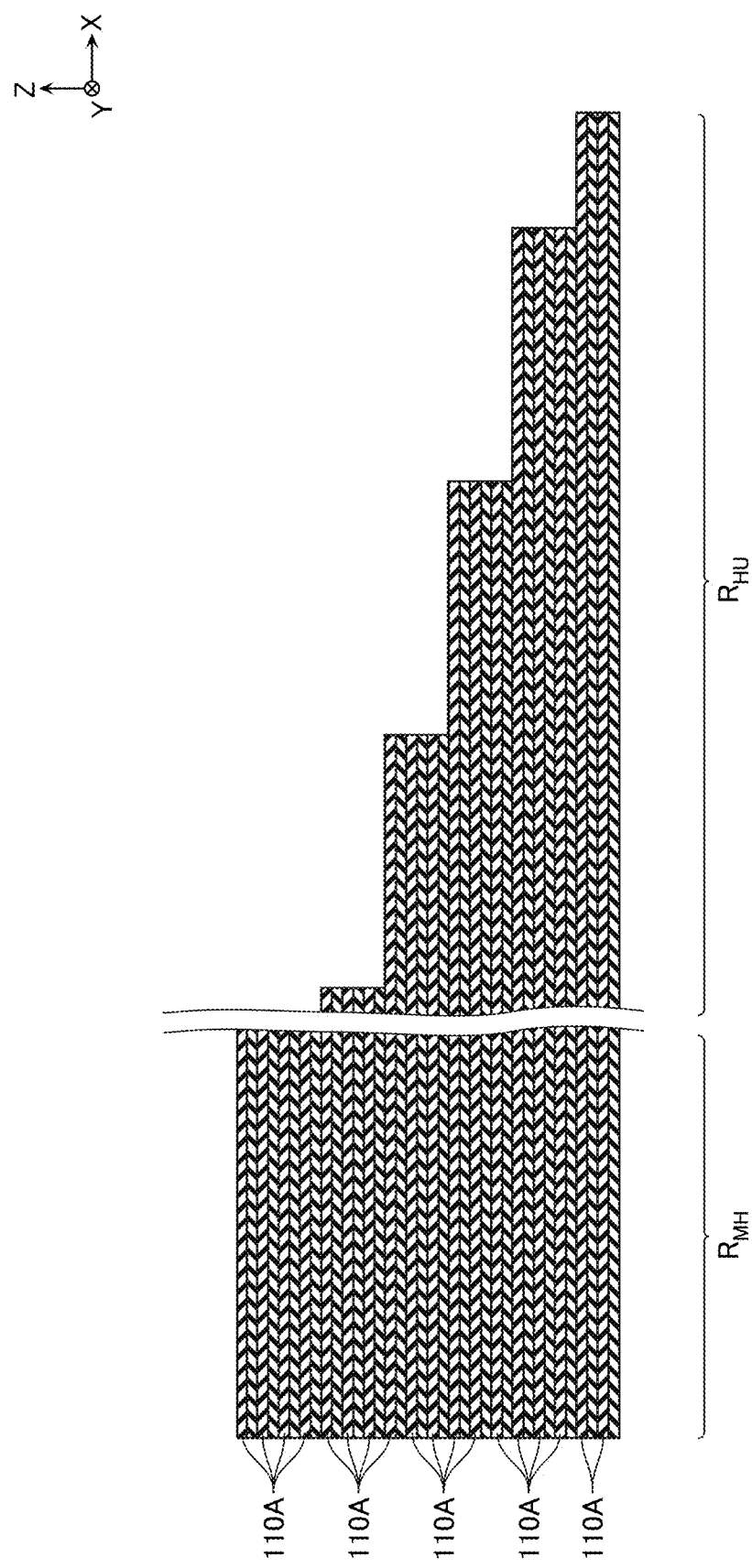
FIG. 10 is a schematic cross-sectional view for describing the same manufacturing method.

Next, for example, as illustrated in FIG. 10, an approximately staircase-shaped structure is formed in the hook-up region $R_{HU}$. In this process, for example, a resist is formed on an upper surface of a structure as described with reference to FIG. 8 and FIG. 9, and a patterning is performed on the resist by a method, such as photolithography. Further, a process of selectively removing the sacrifice layer 110A, a process of selectively removing the insulating layer 101, and a process of isotropically removing the resist are repeatedly performed.

Figure 11:
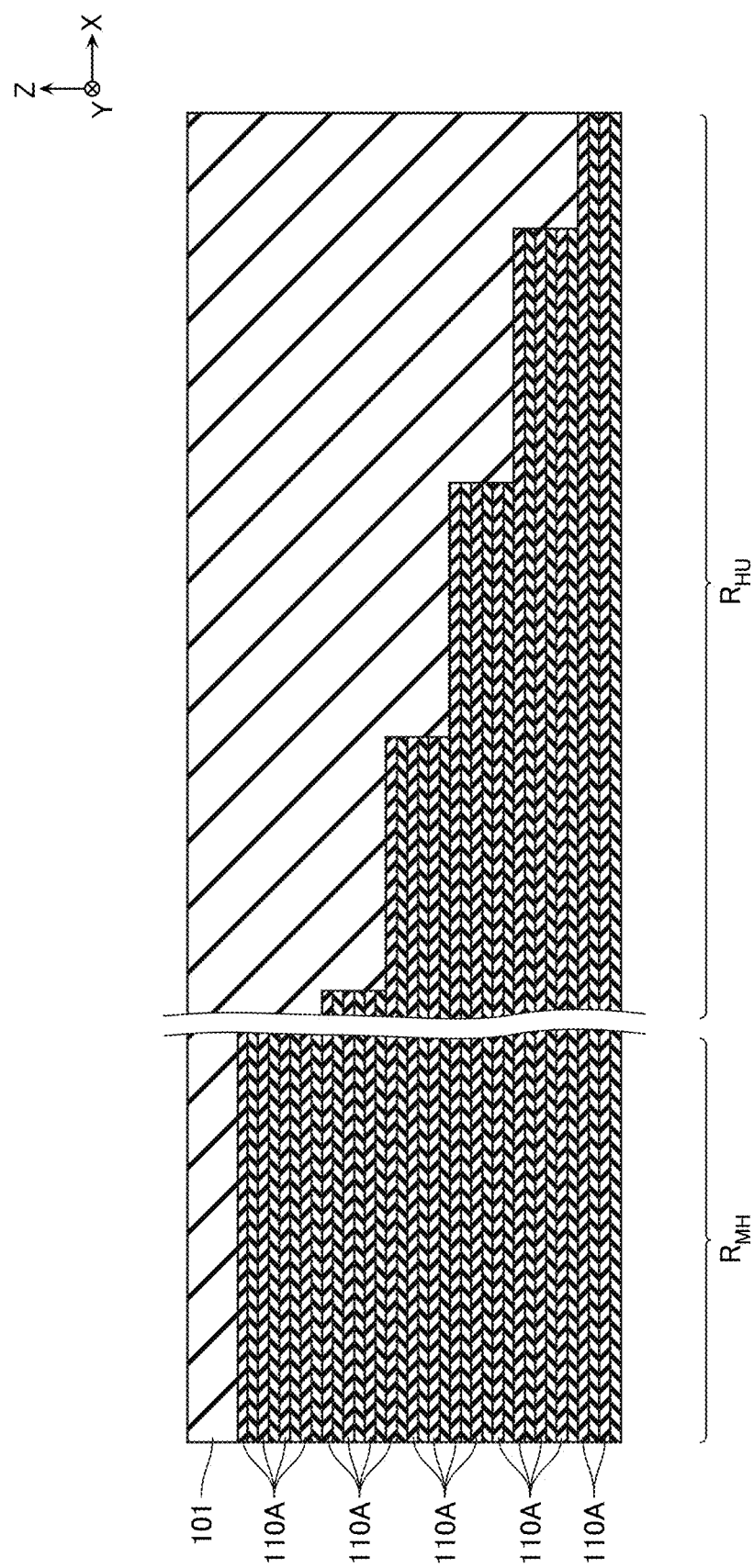
FIG. 11 is a schematic cross-sectional view for describing the same manufacturing method.

Next, for example, as illustrated in FIG. 11, the insulating layer 101 is formed on an upper surface of the structure described with reference to FIG. 10. This process is performed by a method, such as CVD or the like.

Figure 12:
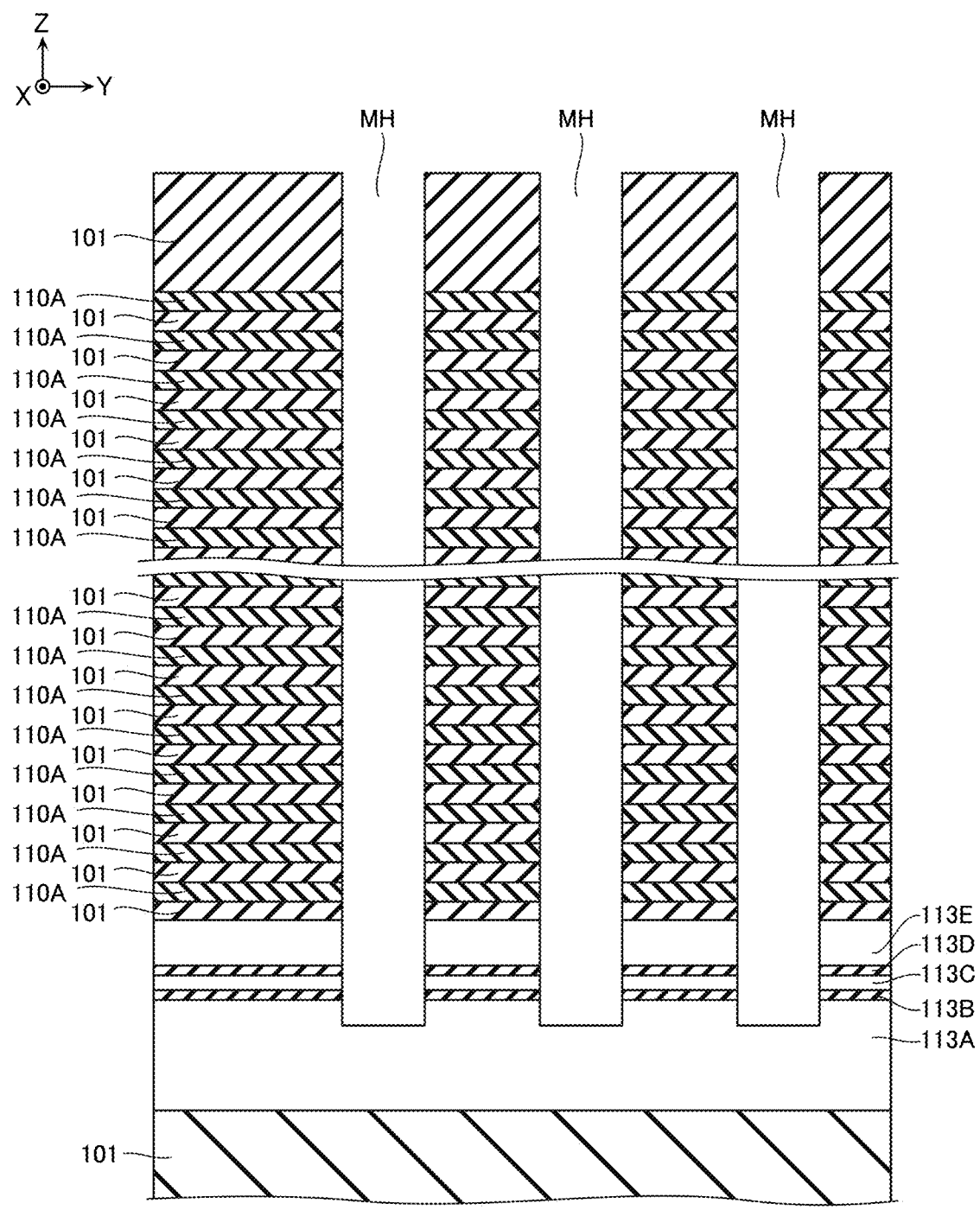
FIG. 12 is a schematic cross-sectional view for describing the same manufacturing method.
Figure 13:
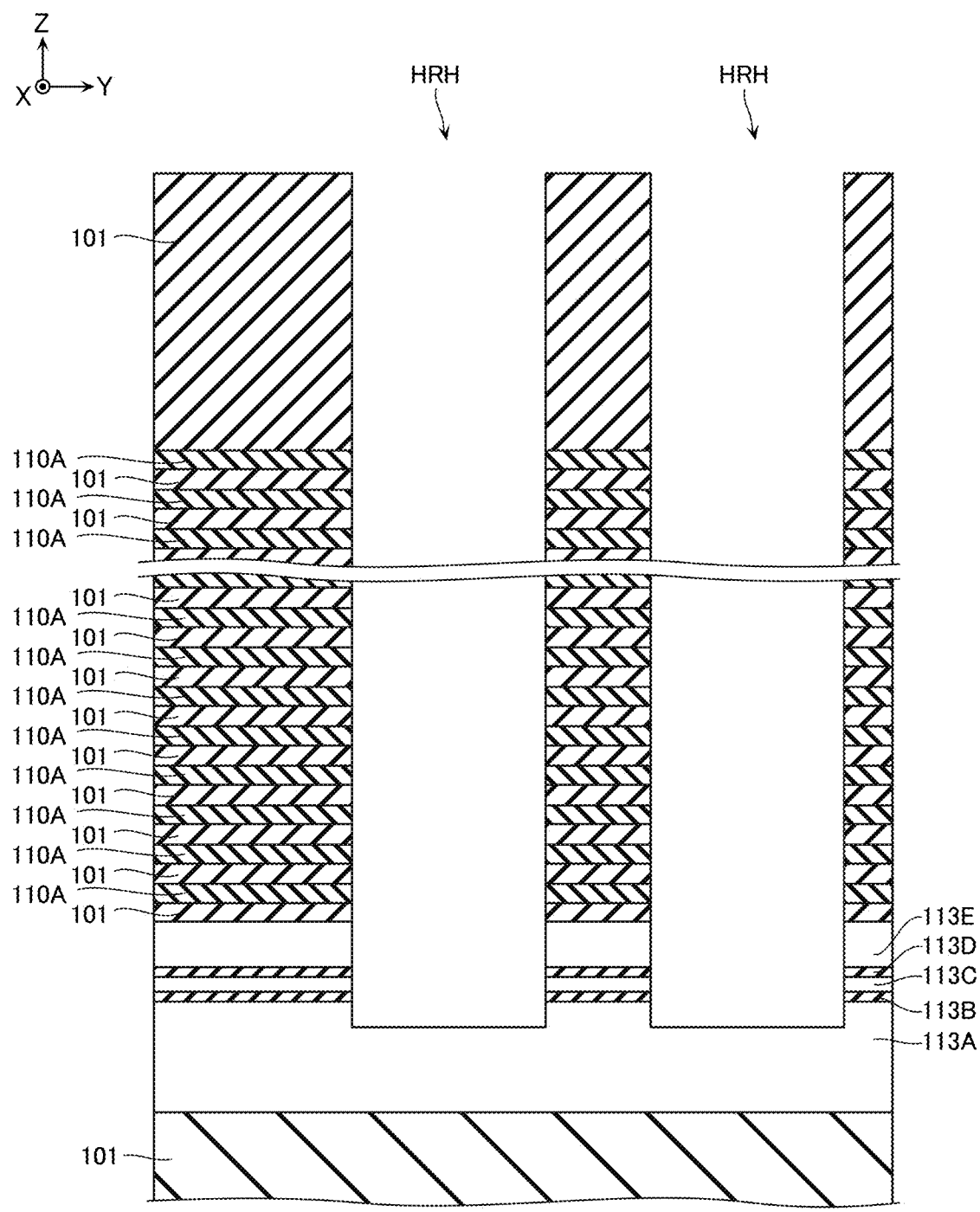
FIG. 13 is a schematic cross-sectional view for describing the same manufacturing method.

Next, for example, as illustrated in FIG. 12 and FIG. 13, a plurality of memory holes MH are formed in positions corresponding to the plurality of the semiconductor layers 120. Further, a plurality of via holes HRH are formed in positions corresponding to the plurality of supporting structures HR. The memory hole MH and the via hole HRH are through holes that extend in the Z-direction, penetrate the insulating layers 101 and the sacrifice layers 110A, the semiconductor layer 113E, the sacrifice layer 113D, the sacrifice layer 113C and the sacrifice layer 113B, and expose an upper surface of the semiconductor layer 113A. This process is performed by a method, such as RIE or the like.

Figure 14:
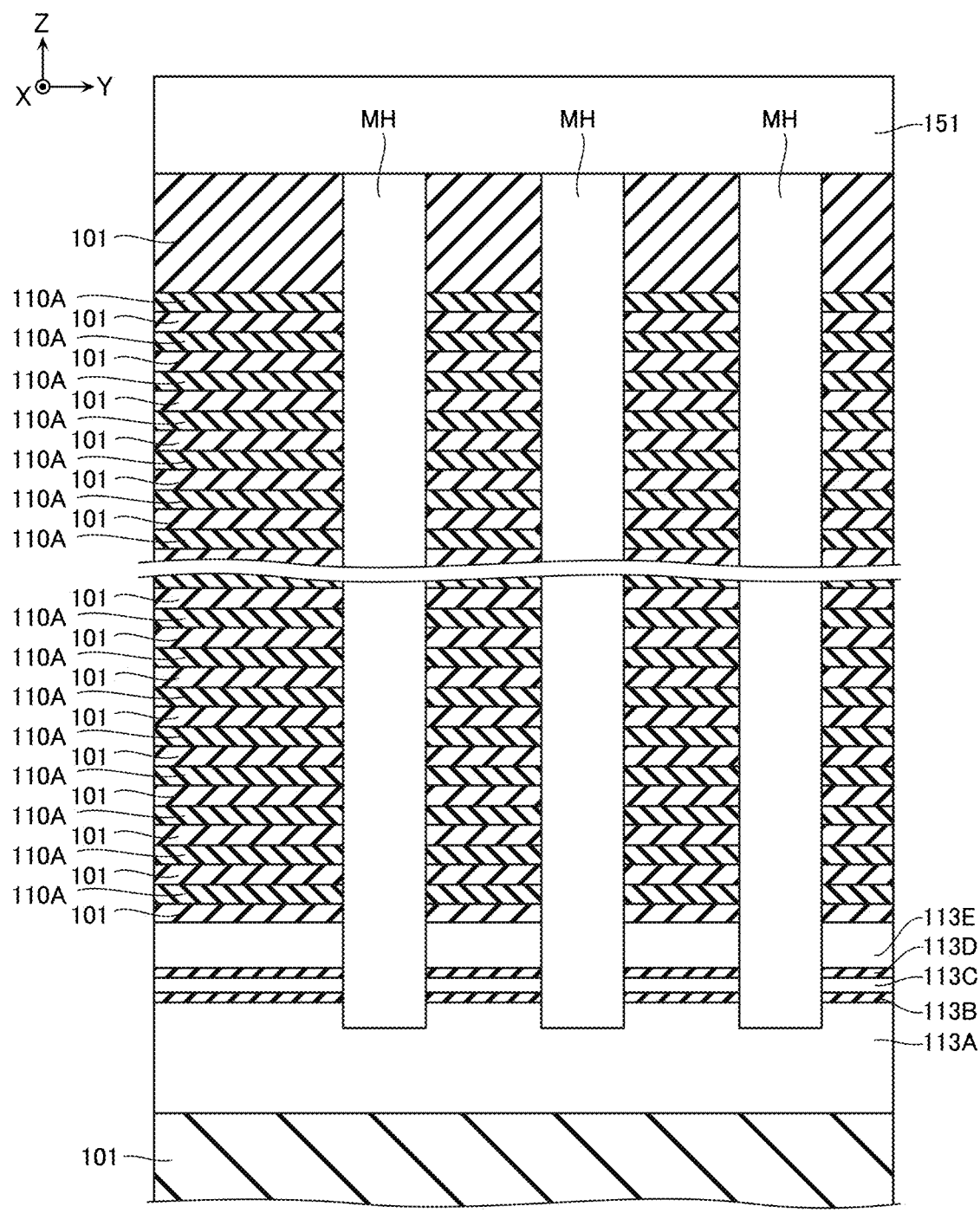
FIG. 14 is a schematic cross-sectional view for describing the same manufacturing method.
Figure 15:
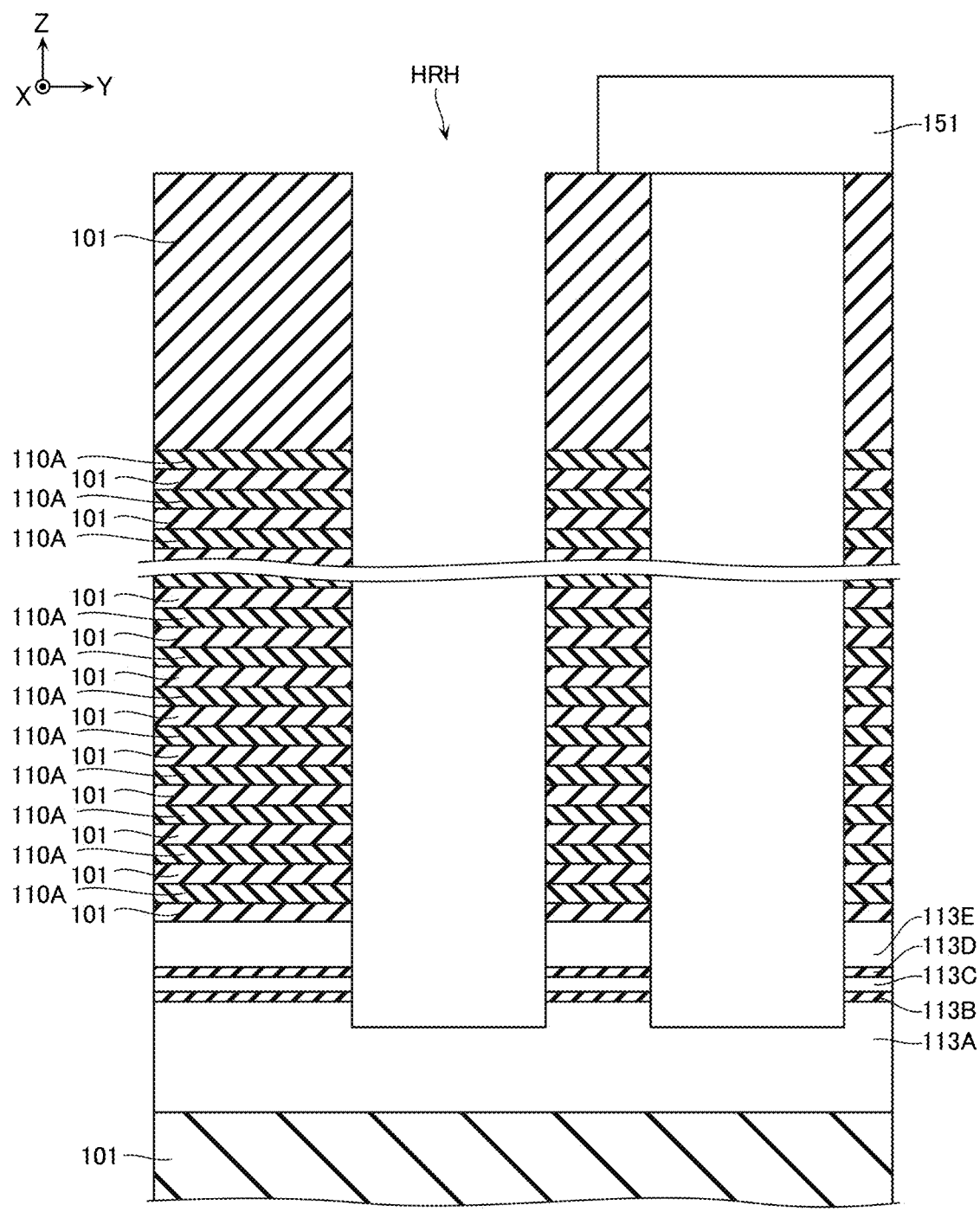
FIG. 15 is a schematic cross-sectional view for describing the same manufacturing method.

Next, for example, as illustrated in FIG. 14 and FIG. 15, a resist 151 is formed on an upper surface of the configuration described with reference to FIG. 12 and FIG. 13. The resist 151 covers the plurality of memory holes MH, and the via hole HRH corresponding to the supporting structure HRM. Further, the resist 151 does not cover the via hole HRH corresponding to the supporting structure HRS.

Figure 16:
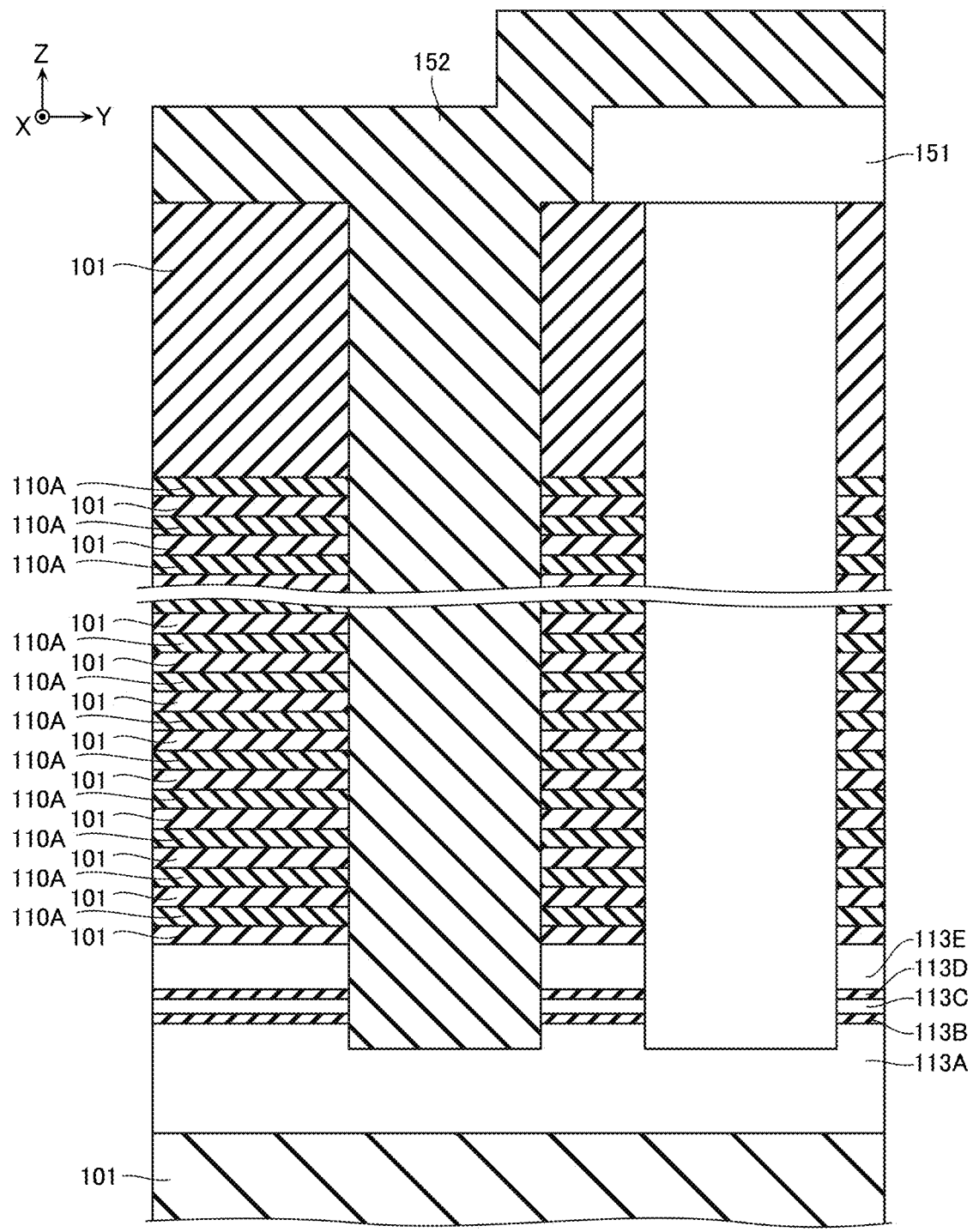
FIG. 16 is a schematic cross-sectional view for describing the same manufacturing method.

Next, for example, as illustrated in FIG. 16, an insulating layer 152, such as silicon oxide ($SiO_2$), is formed inside the via hole HRH corresponding to the supporting structure HRS. This process is performed by a method, such as CVD or the like.

Figure 17:
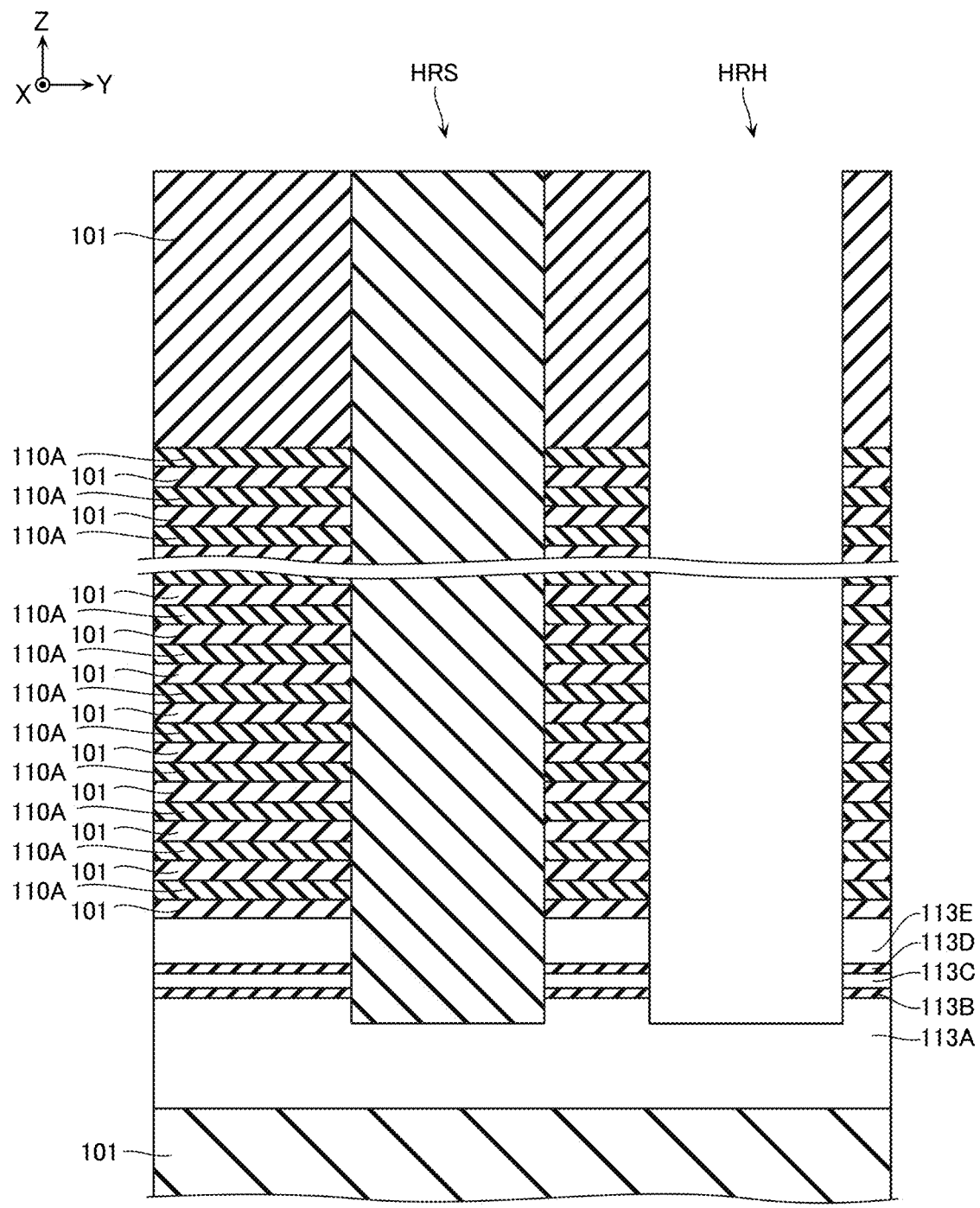
FIG. 17 is a schematic cross-sectional view for describing the same manufacturing method.

Next, for example, as illustrated in FIG. 17, a part of the insulating layer 152 is removed to form the supporting structure HRS. Further, the resist 151 is peeled off.

Figure 18:
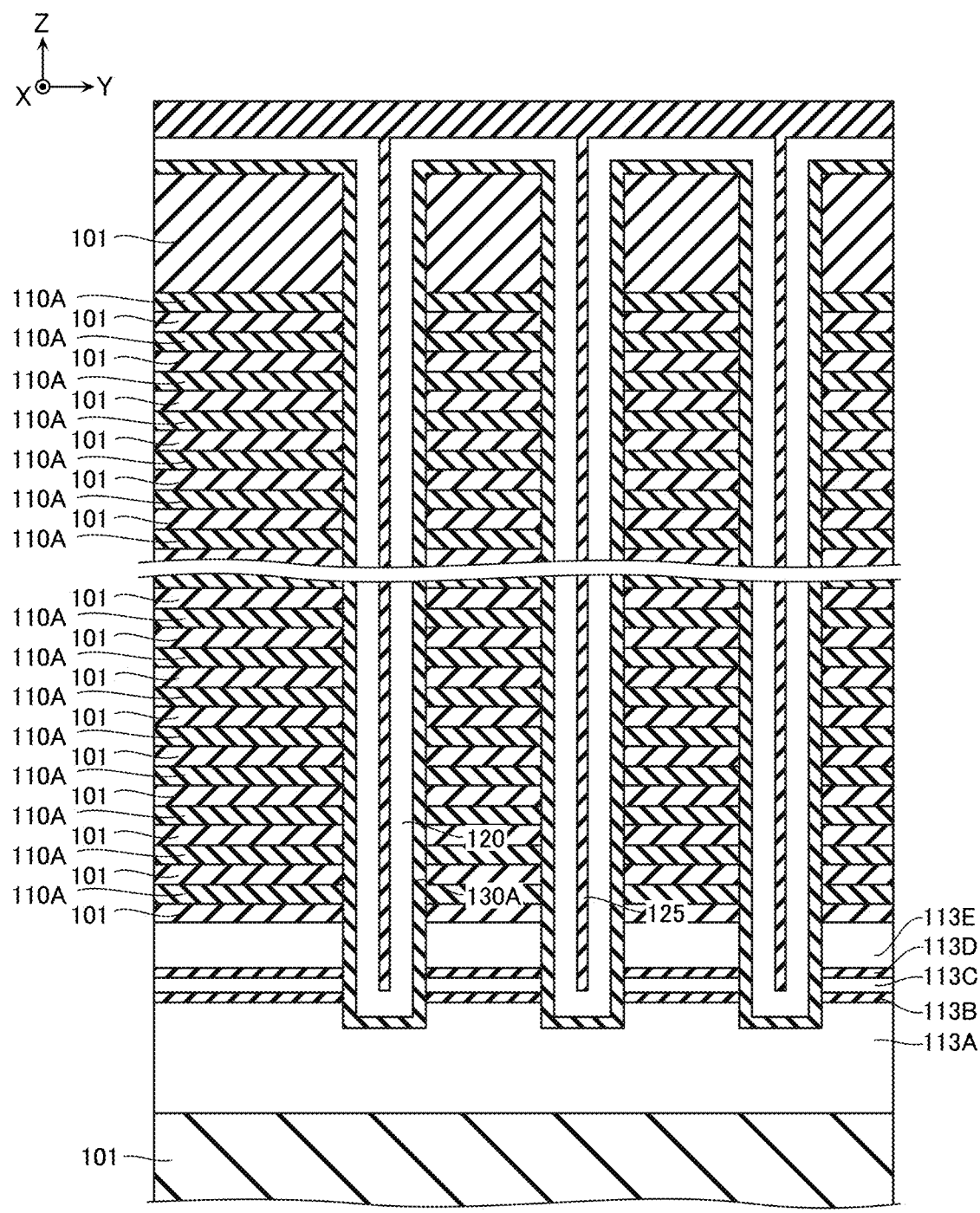
FIG. 18 is a schematic cross-sectional view for describing the same manufacturing method.
Figure 19:
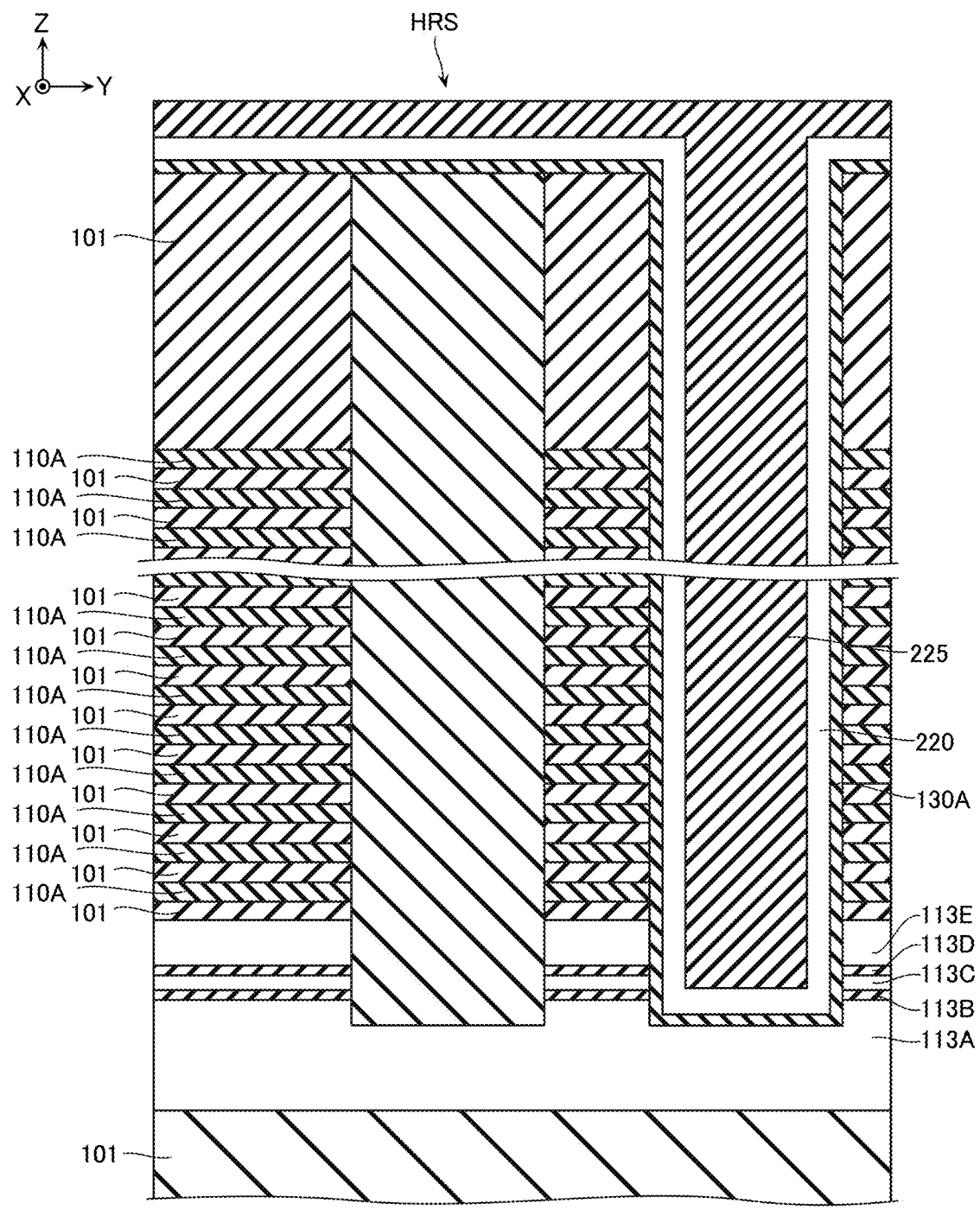
FIG. 19 is a schematic cross-sectional view for describing the same manufacturing method.

Next, for example, as illustrated in FIG. 18 and FIG. 19, insulating layers 130A, the semiconductor layers 120, 220, and the insulating layers 125, 225 are formed on an upper surface of the uppermost insulating layer 101, inner peripheral surfaces of the memory holes MH, and the inner peripheral surfaces of the via holes HRH corresponding to the supporting structures HRM. The insulating layer 130A includes, for example, parts of the tunnel insulating layer 131, the electric charge accumulating layer 132, and the block insulating layer 133. This process is performed by a method, such as CVD or the like.

Figure 20:
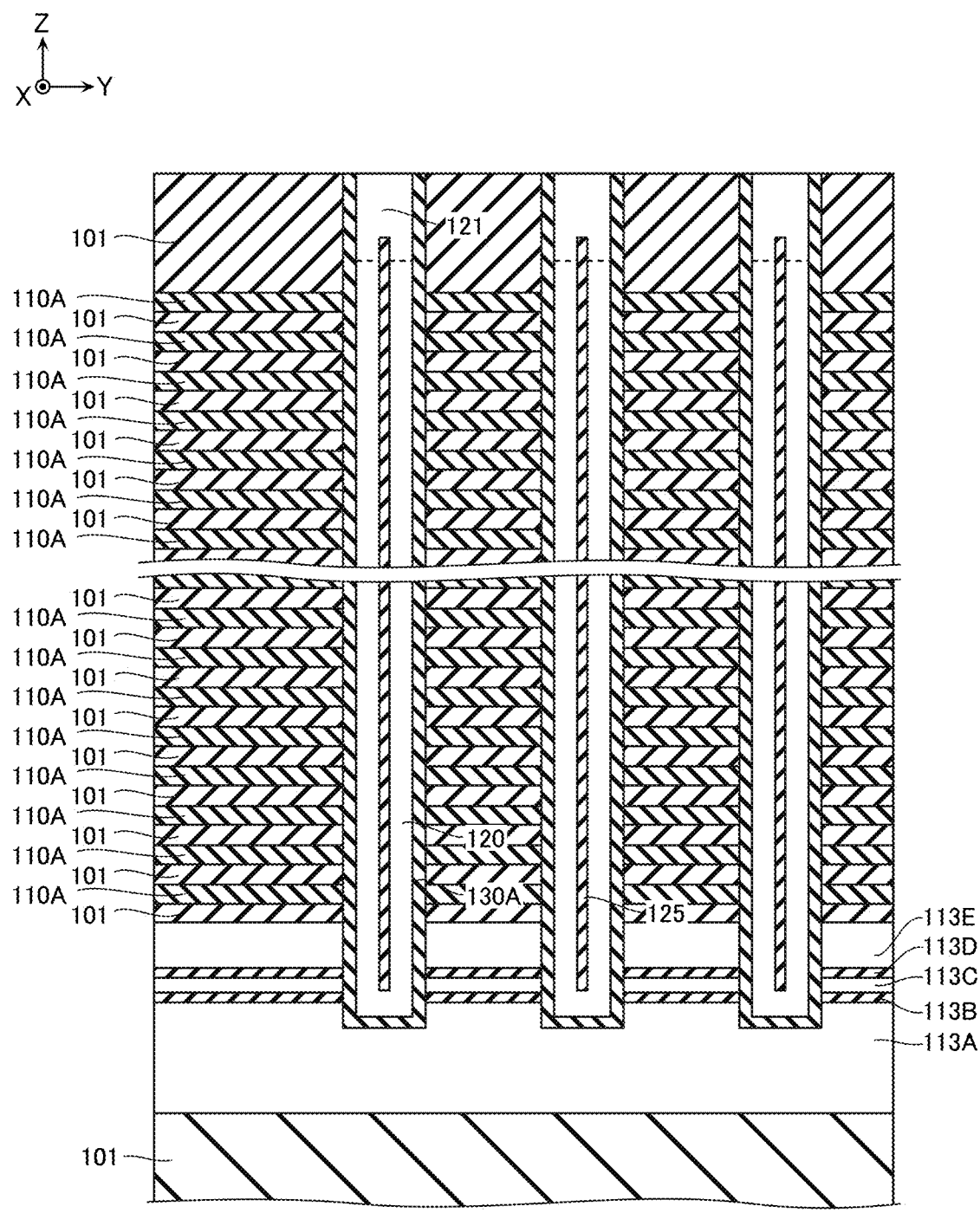
FIG. 20 is a schematic cross-sectional view for describing the same manufacturing method.
Figure 21:
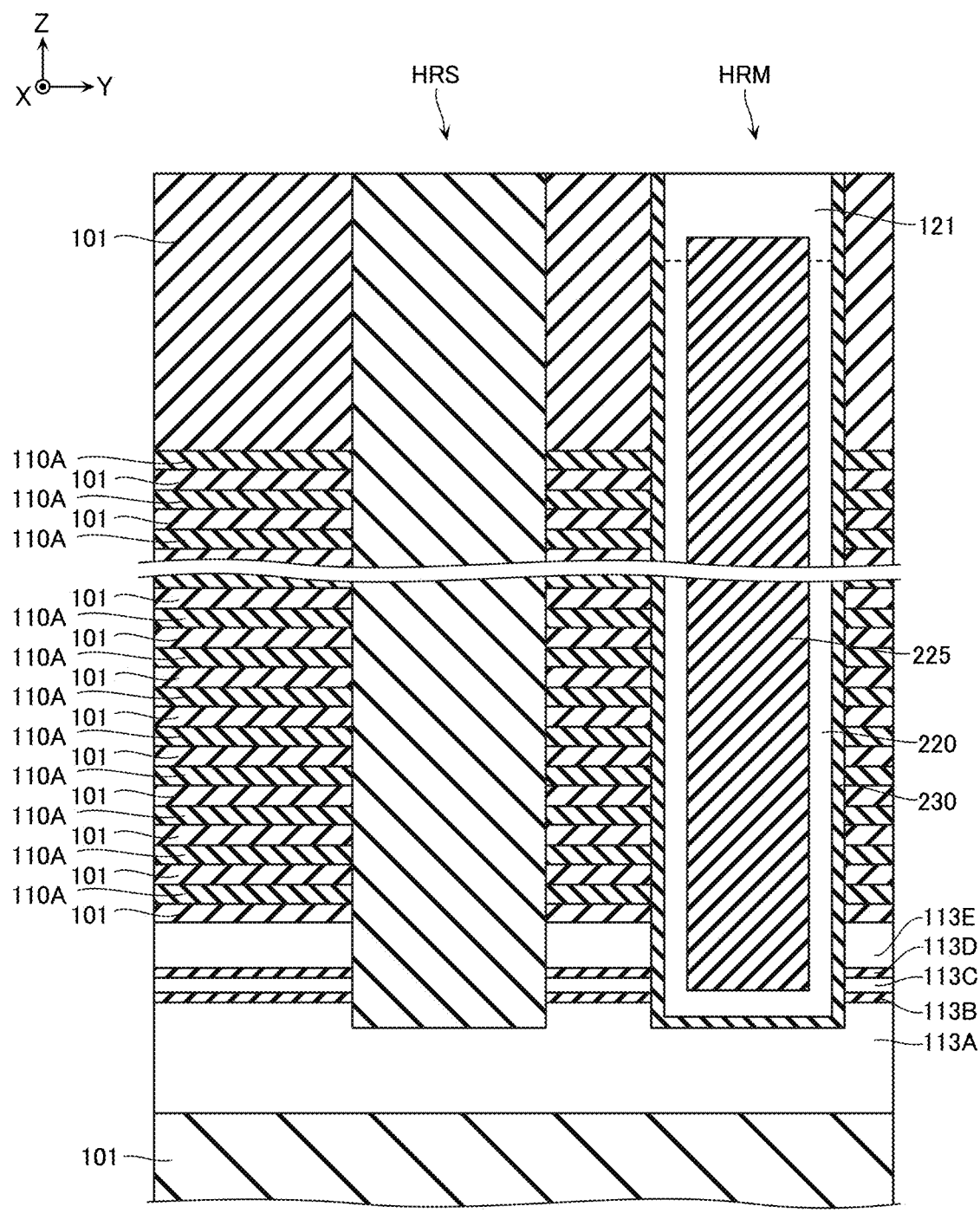
FIG. 21 is a schematic cross-sectional view for describing the same manufacturing method.

Next, for example, as illustrated in FIG. 20 and FIG. 21, parts of the insulating layers 125, 225, the semiconductor layers 120, 220, and the insulating layer 130A are removed. Further, the impurity region 121 is formed on upper end portions of the semiconductor layers 120, 220. This process is performed by methods, such as RIE and CVD or the like.

Figure 22:
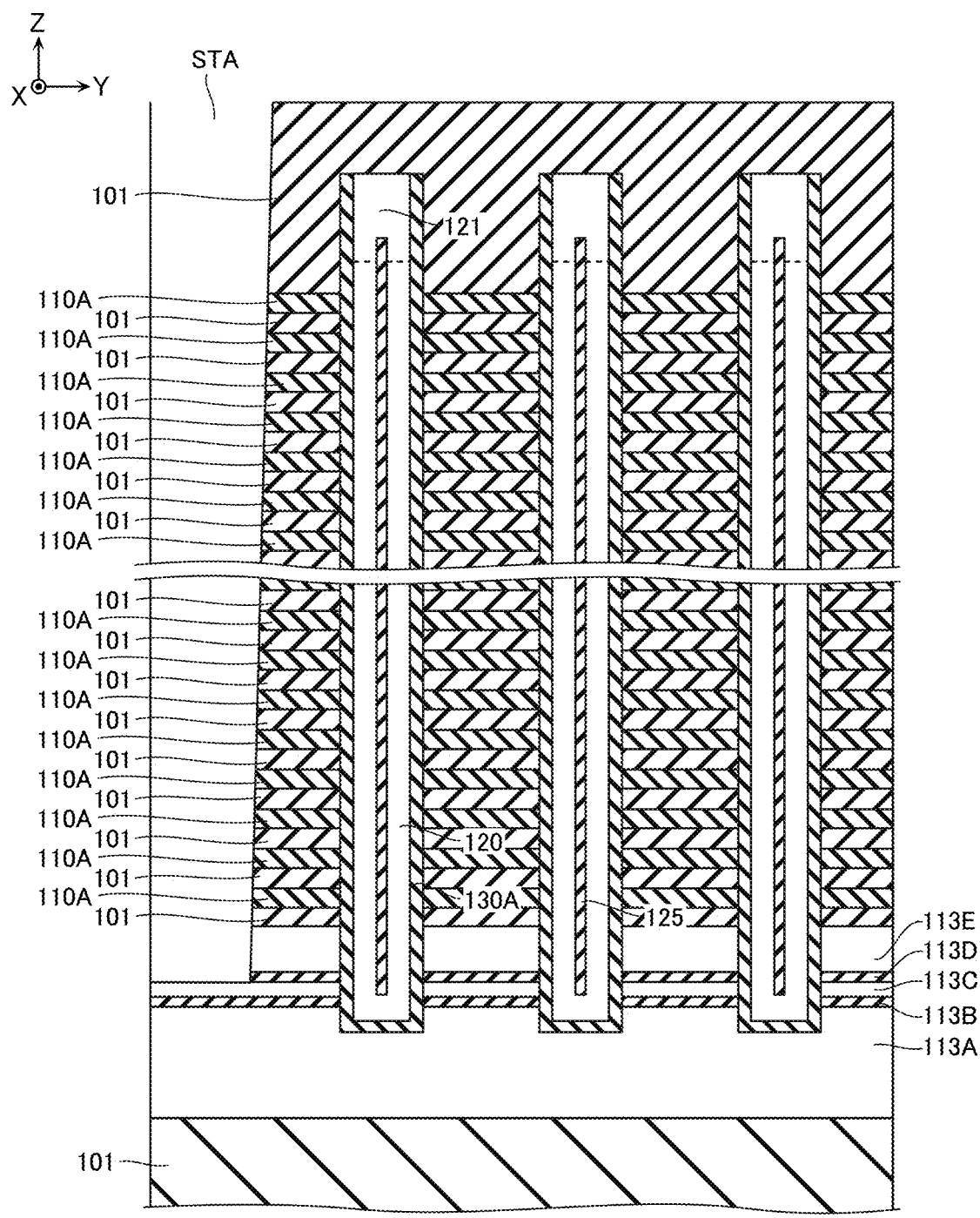
FIG. 22 is a schematic cross-sectional view for describing the same manufacturing method.

Next, for example, as illustrated in FIG. 22, a trench STA is formed. The trench STA extends in the Z-direction and the X-direction, separates the insulating layer 101 and the sacrifice layer 110A, the semiconductor layer 113E, and the sacrifice layer 113D in the Y-direction, and exposes an upper surface of the sacrifice layer 113C. This process is performed by a method, such as RIE or the like.

Figure 23:
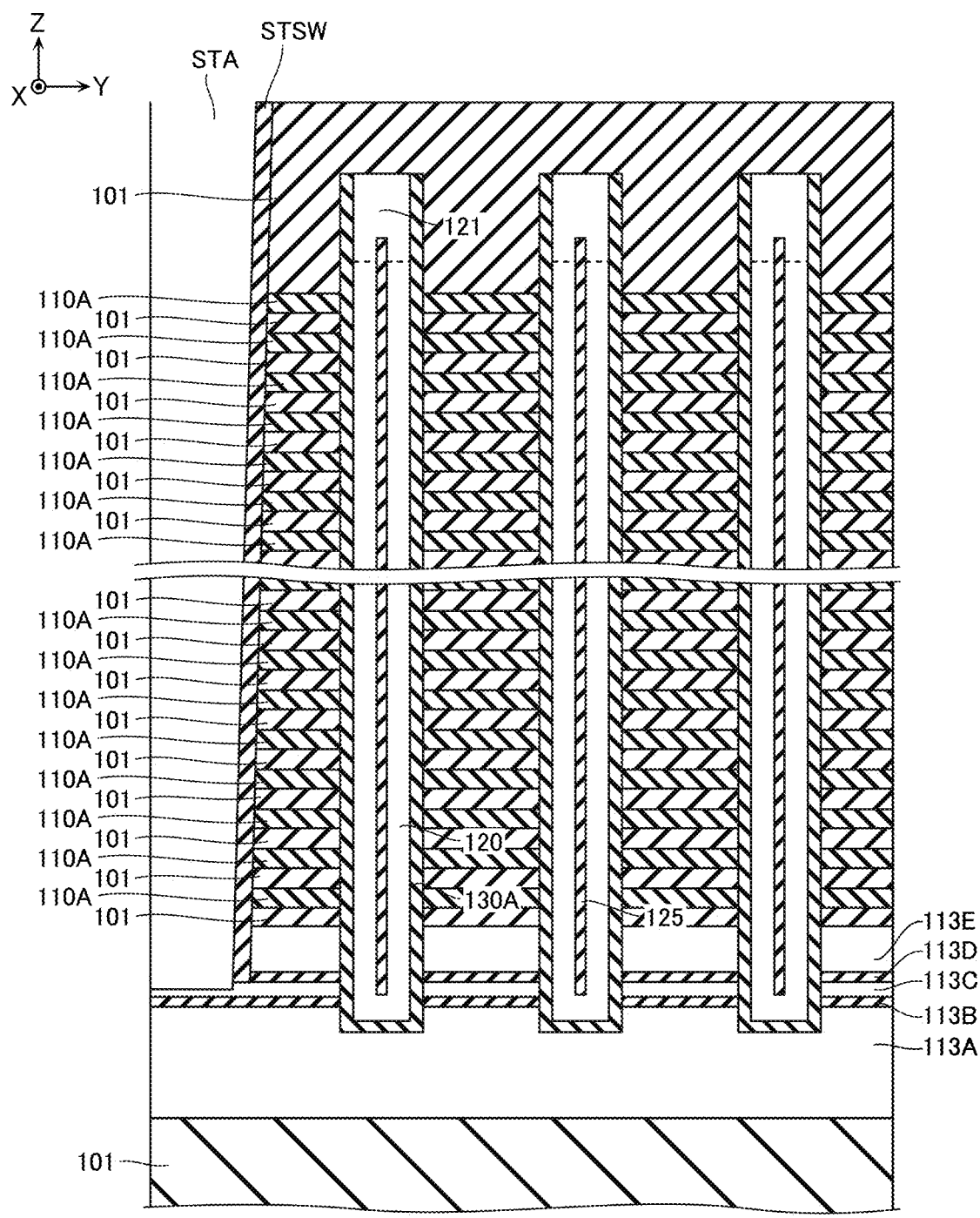
FIG. 23 is a schematic cross-sectional view for describing the same manufacturing method.

Next, for example, as illustrated in FIG. 23, a protective film STSW, such as silicon nitride, is formed on a side surface in the Y-direction of the trench STA. In this process, for example, an insulating film, such as silicon nitride, is formed on a side surface and a bottom surface in the Y-direction of the trench STA by a method, such as CVD. Further, by a method, such as RIE, a portion covering the bottom surface of the trench STA among the insulating film is removed.

Figure 24:
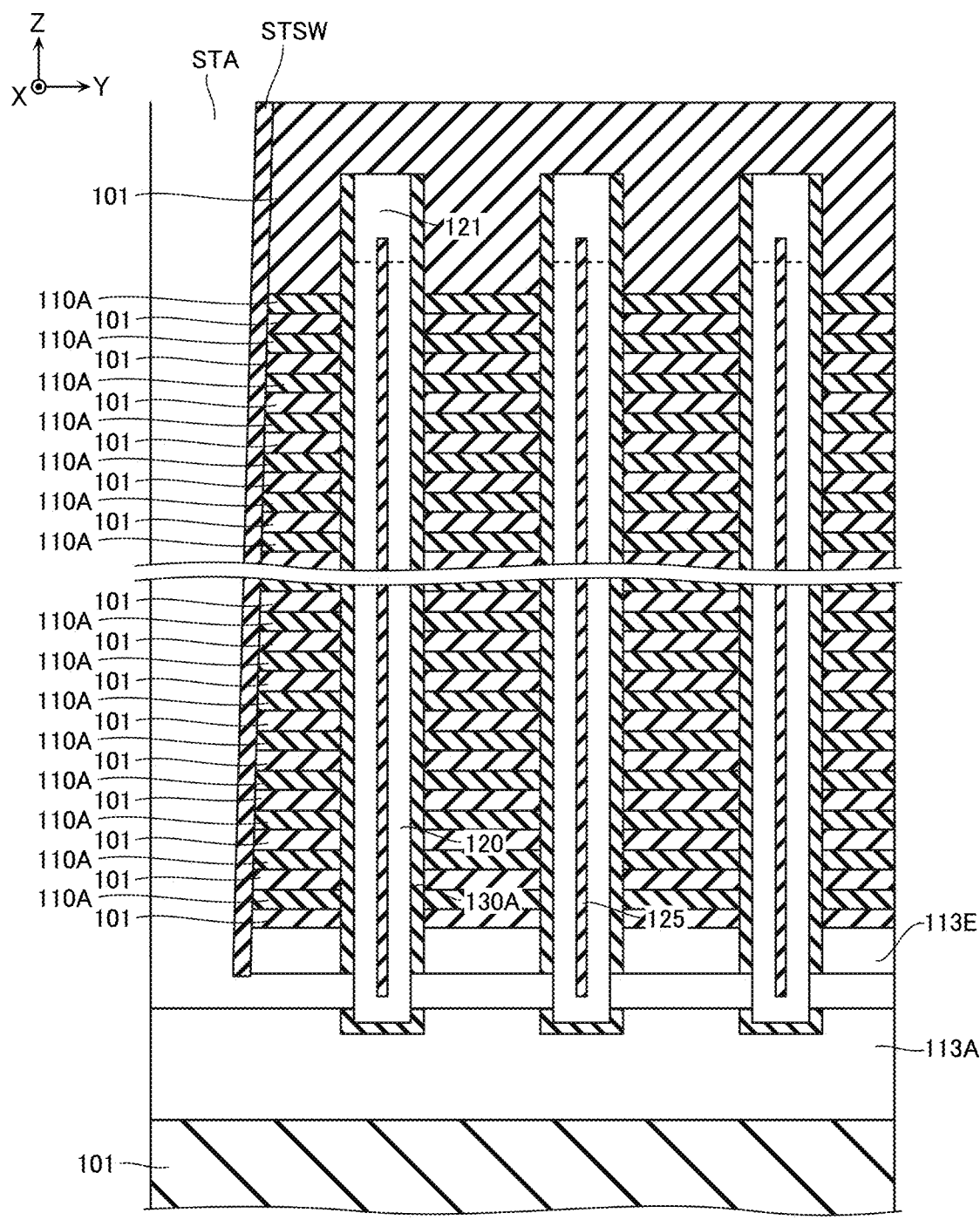
FIG. 24 is a schematic cross-sectional view for describing the same manufacturing method.

Next, for example, as illustrated in FIG. 24, the sacrifice layers 113B, 113C, 113D and a part of the insulating layer 130A are removed to expose a part of the semiconductor layer 120. This process is performed by a method, such as wet etching or the like.

Figure 25:
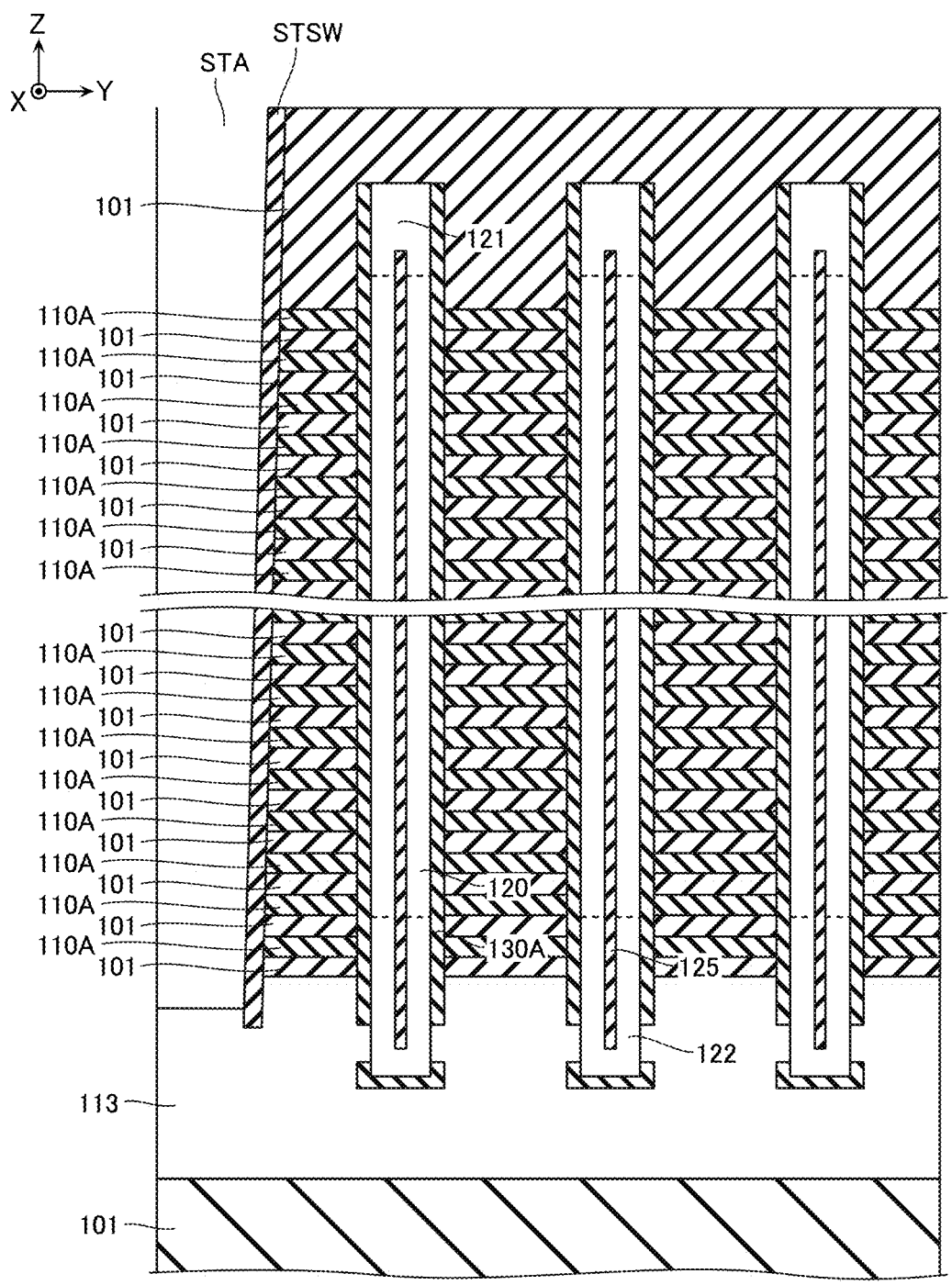
FIG. 25 is a schematic cross-sectional view for describing the same manufacturing method.

Next, for example, as illustrated in FIG. 25, the conductive layer 113 is formed. This process is performed by a method, such as epitaxial growth or the like.

Figure 26:
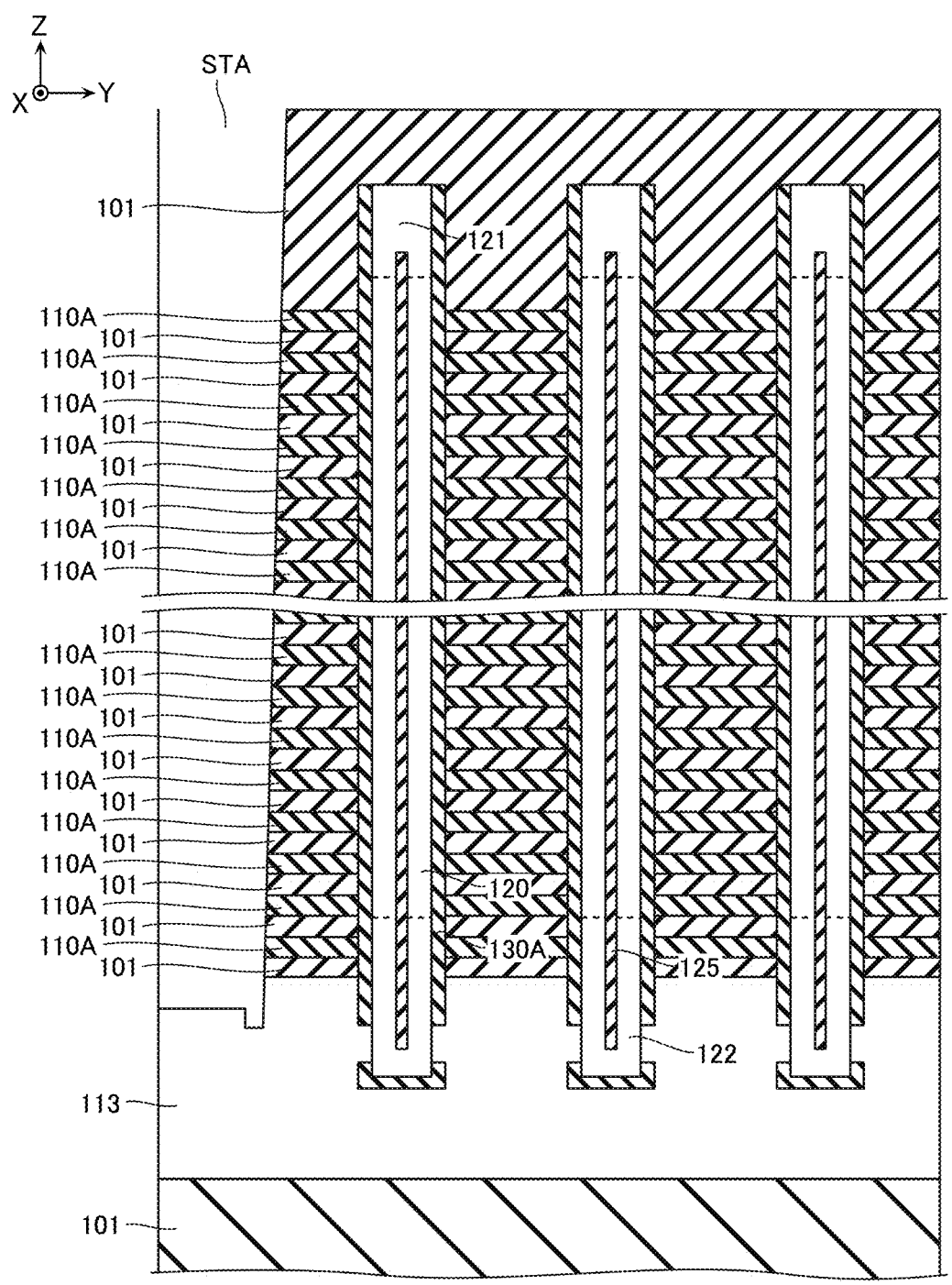
FIG. 26 is a schematic cross-sectional view for describing the same manufacturing method.

Next, for example, as illustrated in FIG. 26, the protective film STSW is removed. This process is performed by a method, such as wet etching or the like.

Figure 27:
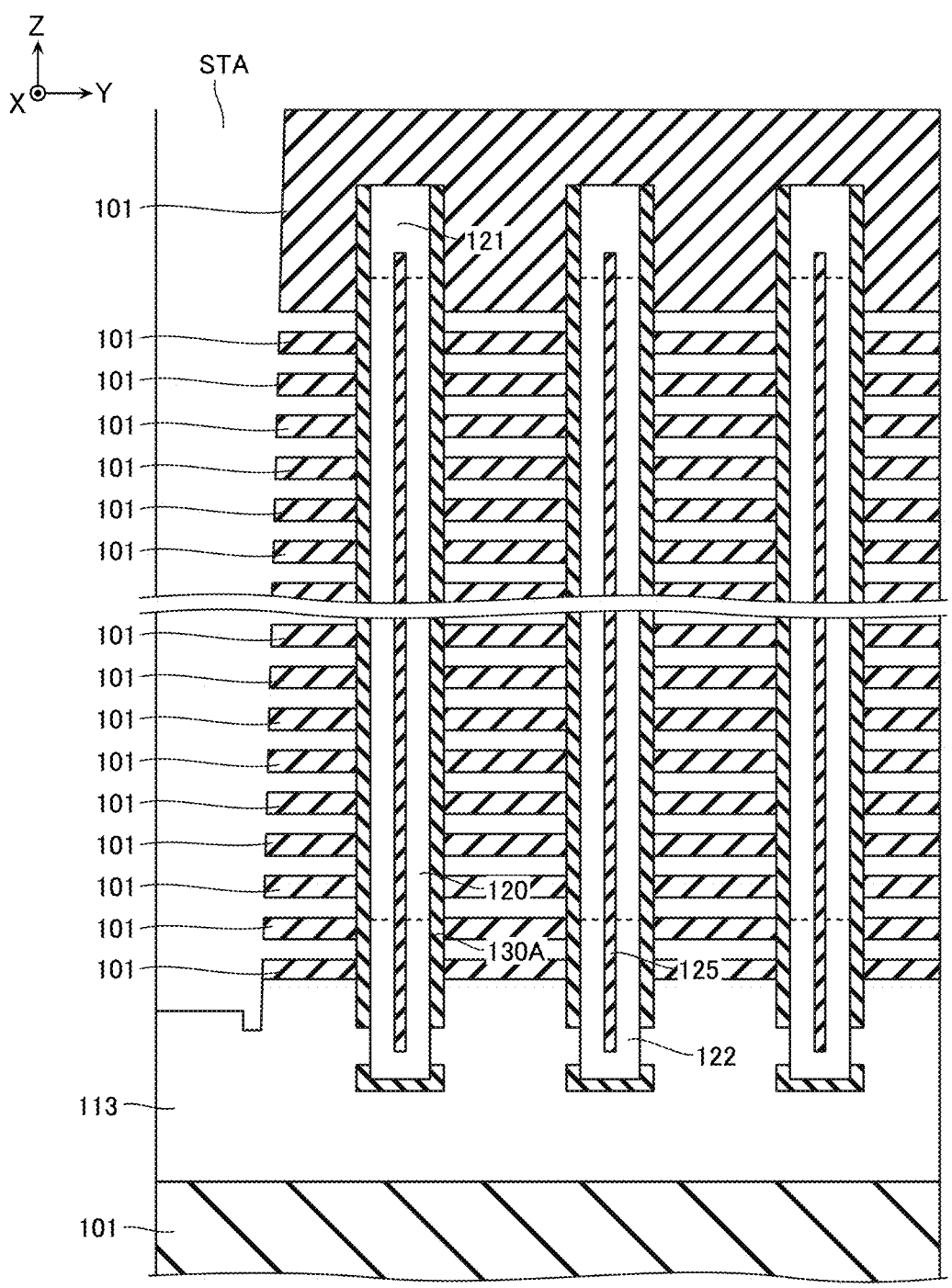
FIG. 27 is a schematic cross-sectional view for describing the same manufacturing method.

Next, for example, as illustrated in FIG. 27, the sacrifice layers 110A are removed via the trench STA. Accordingly, a hollow structure including the plurality of insulating layers 101 arranged in the Z-direction, the structure inside the memory hole MH supporting the insulating layers 101 (the semiconductor layers 120, the insulating layers 130A, and the insulating layers 125), and the supporting structure HR are formed. This process is performed by a method, such as wet etching or the like.

Figure 28:
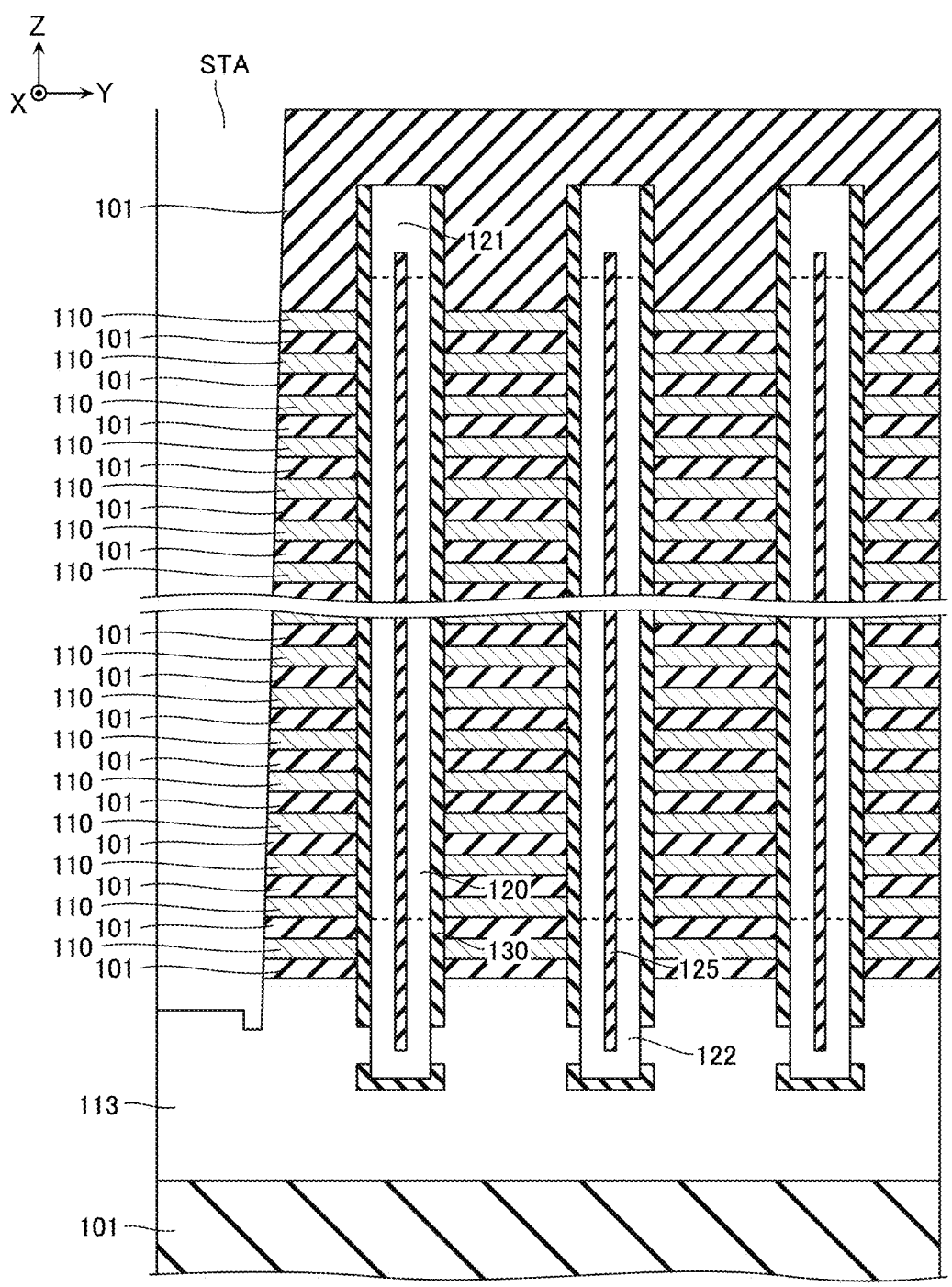
FIG. 28 is a schematic cross-sectional view for describing the same manufacturing method.

Next, for example, as illustrated in FIG. 28, the conductive layers 110 are formed. This process is performed by a method, such as CVD or the like. In this process, the high dielectric constant insulating layers 134 (FIG. 5) are also formed before the conductive layers 110 are formed.

Figure 29:
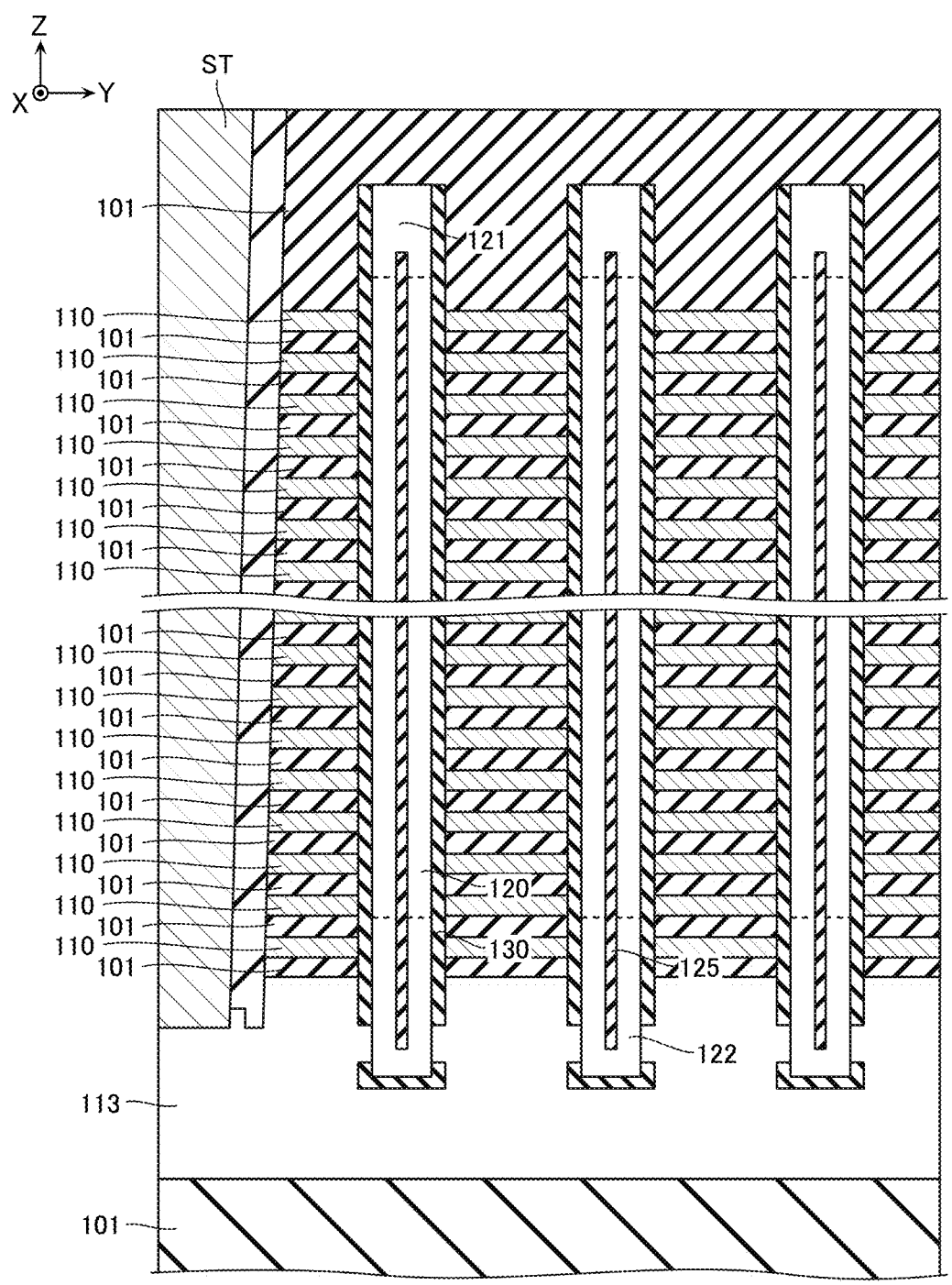
FIG. 29 is a schematic cross-sectional view for describing the same manufacturing method.

Next, for example, as illustrated in FIG. 29, the inter-block structure ST is formed inside the trench STA. This process is performed by methods, such as CVD and RIE or the like.

Figure 30:
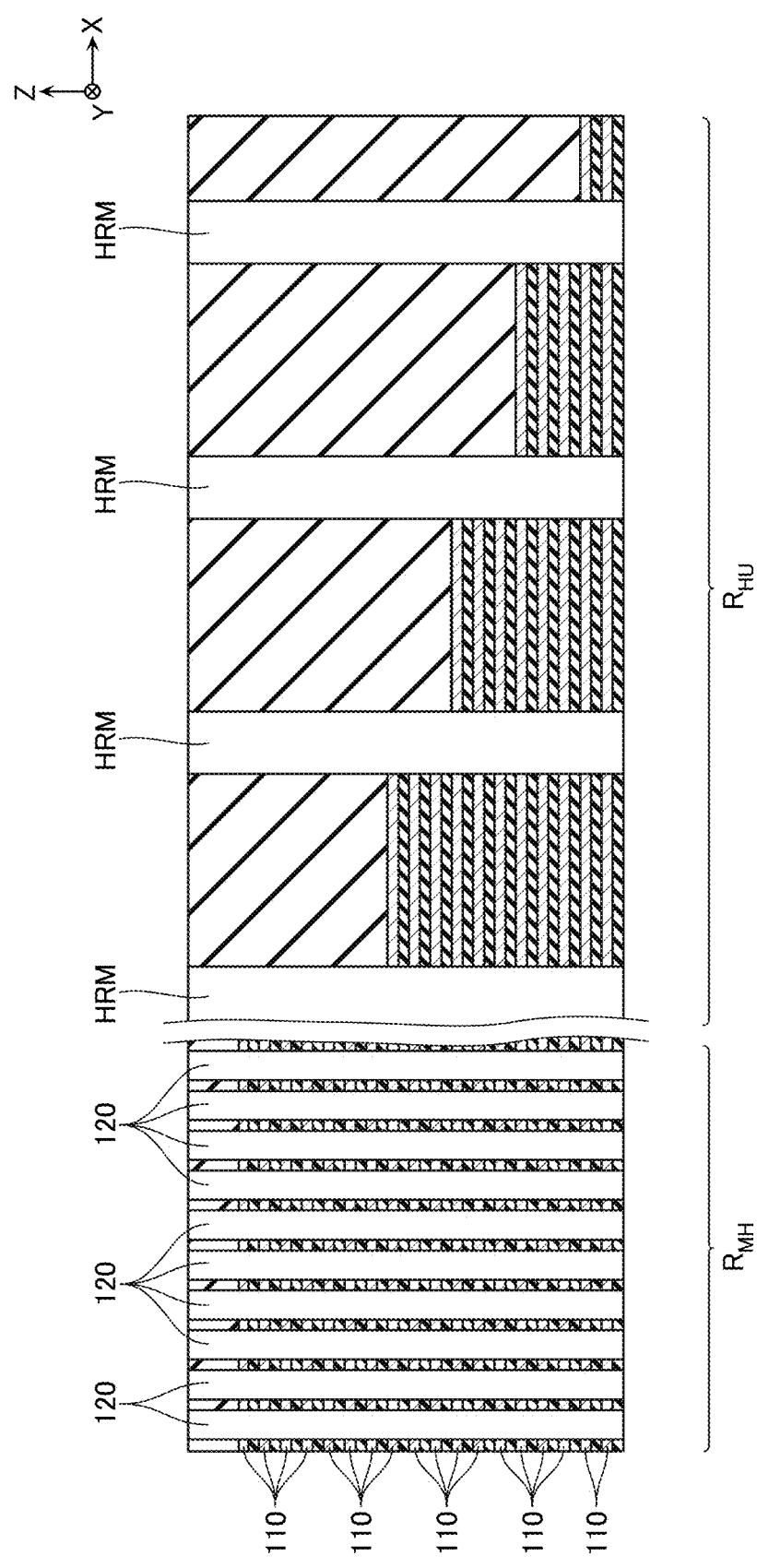
FIG. 30 is a schematic cross-sectional view for describing the same manufacturing method.
Figure 31:
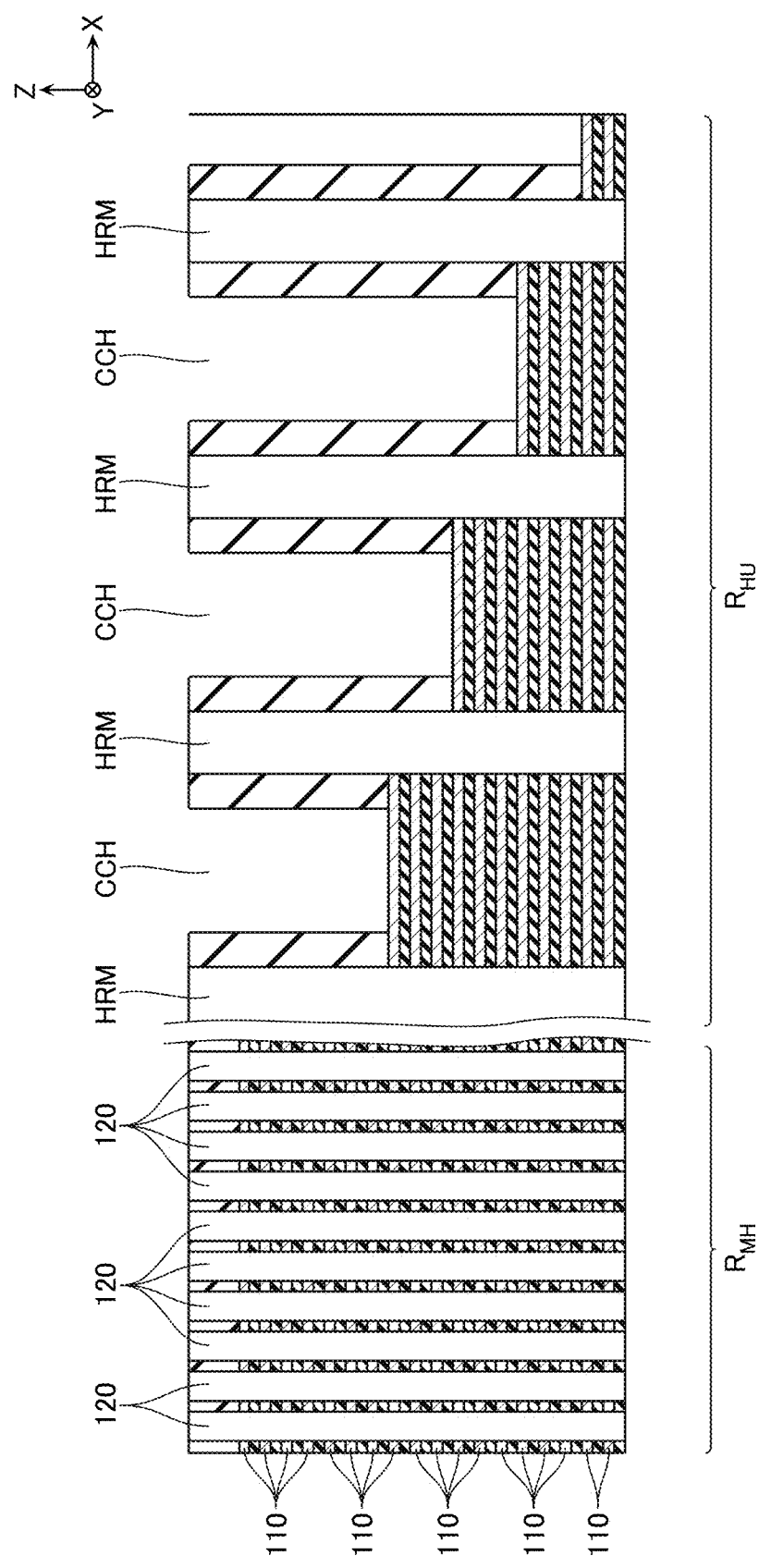
FIG. 31 is a schematic cross-sectional view for describing the same manufacturing method.

Next, for example, as illustrated in FIG. 30 and FIG. 31, a plurality of contact holes CCH are formed in positions corresponding to the plurality of contact electrodes CC. The contact hole CCH is a through hole that extends in the Z-direction, penetrates the insulating layers 101, and exposes the upper surface of the conductive layer 110. This process is performed by a method, such as RIE or the like.

Next, for example, as illustrated in FIG. 6, the contact electrodes CC are formed inside the contact holes CCH. This process is performed by CVD or the like.

Subsequently, by forming wirings and the like, the semiconductor memory device according to the first embodiment is formed.

[Effect]

As described above, in the process described with reference to FIG. 27, the hollow structure including the plurality of insulating layers 101 arranged in the Z-direction, the structures inside the memory holes MH supporting the insulating layers 101, and the supporting structures HR are formed. When such a method is employed, the influence of expansion stresses of the insulating layers 101 covering the upper surfaces of the staircase-shaped structure in the hook-up region $R_{HU}$ may possibly distort the staircase-shaped structure. To reduce such a distortion of the staircase-shaped structure, the hook-up region $R_{HU}$ includes the supporting structures HR for supporting the staircase-shaped structure.

Here, in association with high integration of the semiconductor memory device, a width of the memory block BLK (see FIG. 1 and FIG. 2) in the Y-direction is also decreasing. Accordingly, a distance between the supporting structure HR and the inter-block structure ST described with reference to FIG. 2 and the like is gradually shortening. Here, when all the supporting structures HR are the supporting structures HRM, and the electric charge accumulating layers 132 in the supporting structures HRM are exposed into the trench STA, the electric charge accumulating layers 132 are removed in the process described with reference to FIG. 27, and the hollow structure cannot be preferably supported in some cases.

Meanwhile, the configuration of the memory hole MH and the supporting structure HRM have the common film configurations and approximately the same thermal shrinkage rates. In contrast, the supporting structure HRS has a film configuration that is different from these configurations, and has a thermal shrinkage rate different from these configurations. Therefore, when all the supporting structures HR are the supporting structures HRS, the hollow structure formed in the process described with reference to FIG. 27 may possibly be distorted significantly in the hook-up region $R_{HU}$, and thus a level difference may occur on an upper surface of the hollow structure (the upper surface of the uppermost insulating layer 101).

Therefore, in the first embodiment, regions near the inter-block structure ST include the supporting structures HRS, and the other regions include the supporting structures HRM. Such a configuration can preferably support the hollow structure while reducing occurrence of the level difference as described above.

Second Embodiment

Figure 32:
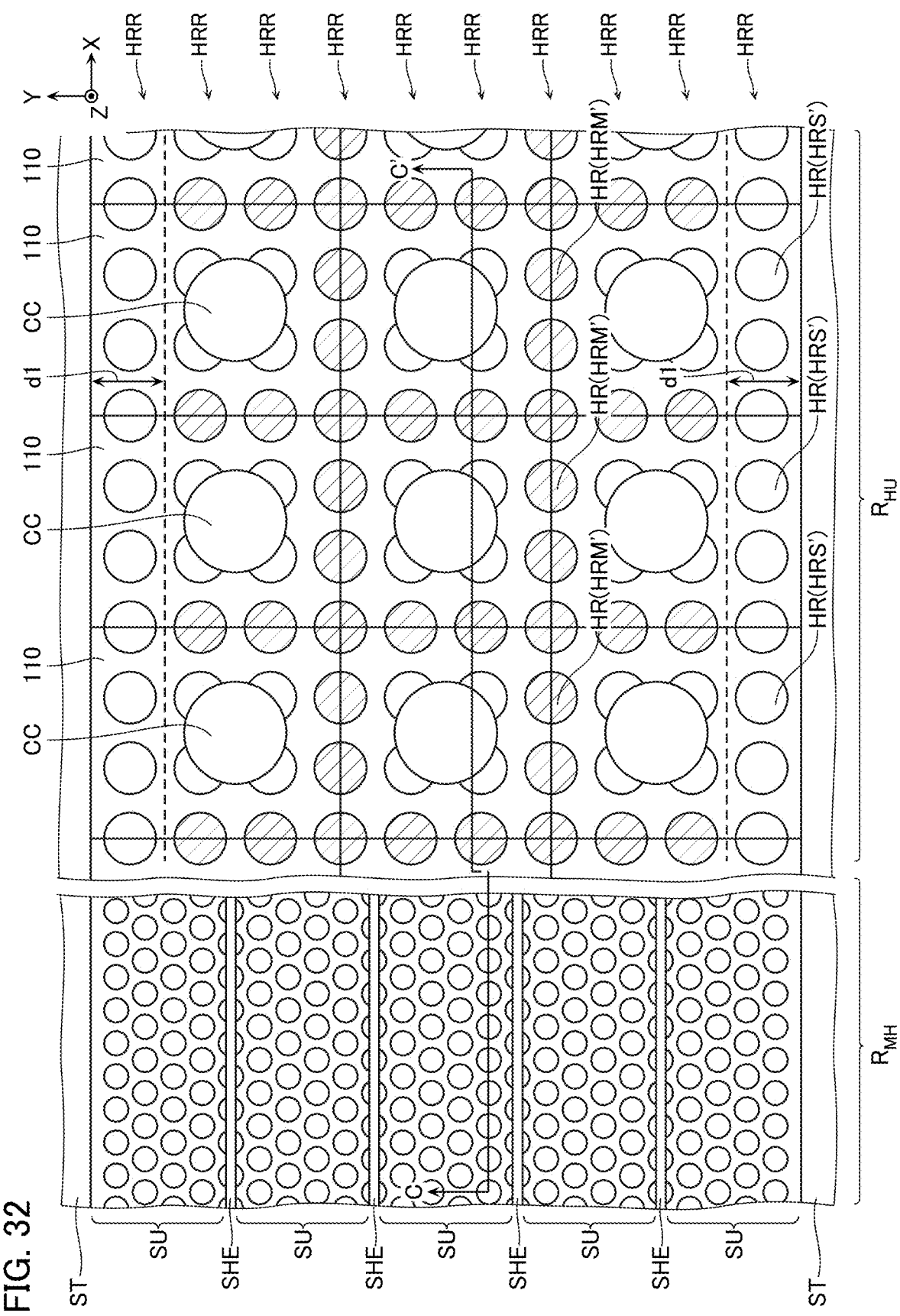
FIG. 32 is a schematic plan view illustrating a part of a configuration of a semiconductor memory device according to a second embodiment.
Figure 33:
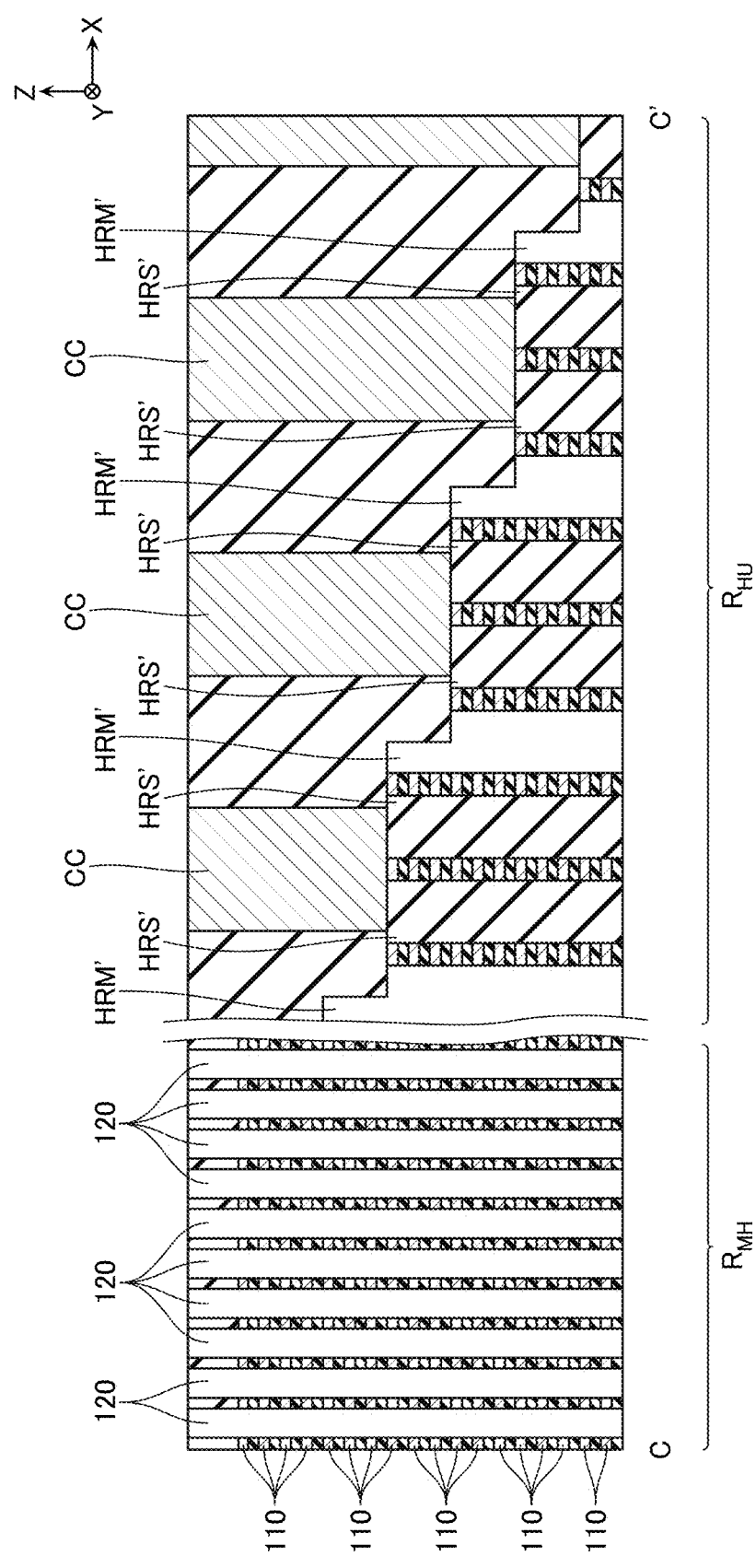
FIG. 33 is a schematic cross-sectional view taking the structure illustrated in FIG. 32 along the line C-C' and viewed along the arrow direction.

Next, with reference to FIG. 32 and FIG. 33, the semiconductor memory device according to the second embodiment is described. FIG. 32 is a schematic plan view illustrating a part of the configuration of the semiconductor memory device according to the second embodiment. FIG. 33 is a schematic cross-sectional view taking the structure illustrated in FIG. 32 along the line C-C', and viewed along the arrow direction.

The semiconductor memory device according to the second embodiment is basically configured similarly to the semiconductor memory device according to the first embodiment.

However, the semiconductor memory device according to the second embodiment includes supporting structures HRM', HRS' instead of the supporting structures HRM, HRS. The supporting structures HRM', HRS' are basically configured similarly to the supporting structures HRM, HRS. However, as described with reference to FIG. 7, the upper ends of the supporting structures HRM, HRS are disposed above the upper surface of the uppermost conductive layer 110. On the other hand, as illustrated in FIG. 33, upper ends of the supporting structures HRM', HRS' are disposed at height positions of the upper surfaces of the respective corresponding conductive layers 110.

In the example of FIG. 32, the second, third, fifth, sixth, eighth, and ninth supporting structure regions HRR counted from one side in the Y-direction include a plurality of supporting structures HR arranged at a predetermined pitch in the X-direction. A part of these supporting structures HR are disposed in positions overlapping with the contact electrodes CC viewed from the Z-direction. In such positions, the supporting structures HRS' are disposed as the supporting structures HR. As illustrated in FIG. 33, the upper ends of these supporting structures HRS' are connected to the lower ends of the contact electrodes CC. Further, a part of these supporting structures HR are disposed in positions not overlapping with the contact electrodes CC viewed from the Z-direction. In such positions, the supporting structures HRM' are disposed as the supporting structures HR.

[Manufacturing Method]

Next, with reference to FIG. 34 to FIG. 39, the manufacturing method of the semiconductor memory device according to the second embodiment is described. FIG. 34 to FIG. 39 are schematic cross-sectional views for describing the same manufacturing method, and illustrate cross-sectional surfaces corresponding to FIG. 33.

In the manufacture of the semiconductor memory device according to the embodiment, first, among the manufacturing processes of the semiconductor memory device according to the first embodiment, the processes are performed up to the process described with reference to FIG. 8 and FIG. 9.

Figure 34:
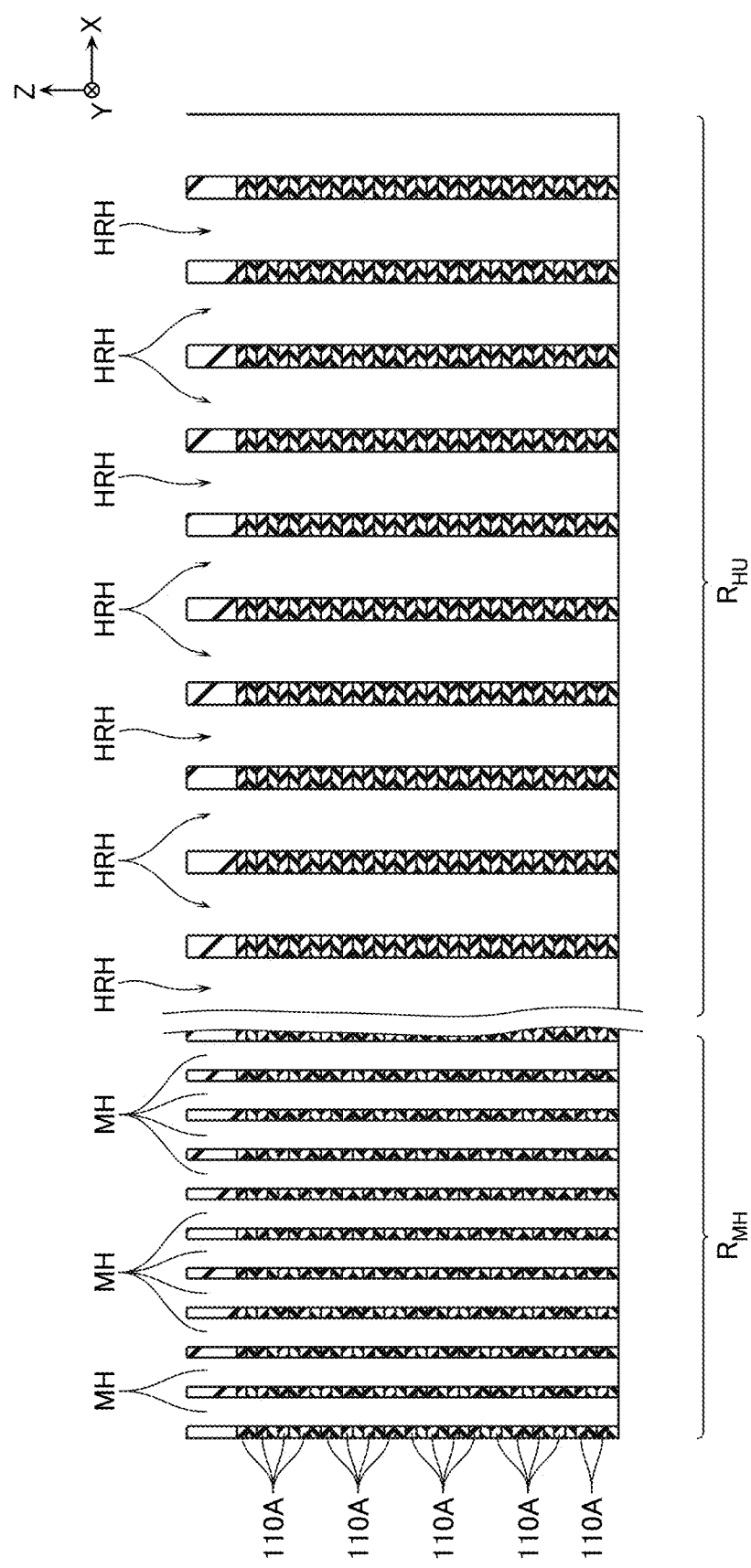
FIG. 34 is a schematic cross-sectional view for describing a manufacturing method of the semiconductor memory device according to the second embodiment.

Next, as illustrated in FIG. 34, a plurality of memory holes MH and a plurality of via holes HRH are formed. This process is performed similarly to, for example, the processes described with reference to FIG. 12 and FIG. 13.

Figure 35:
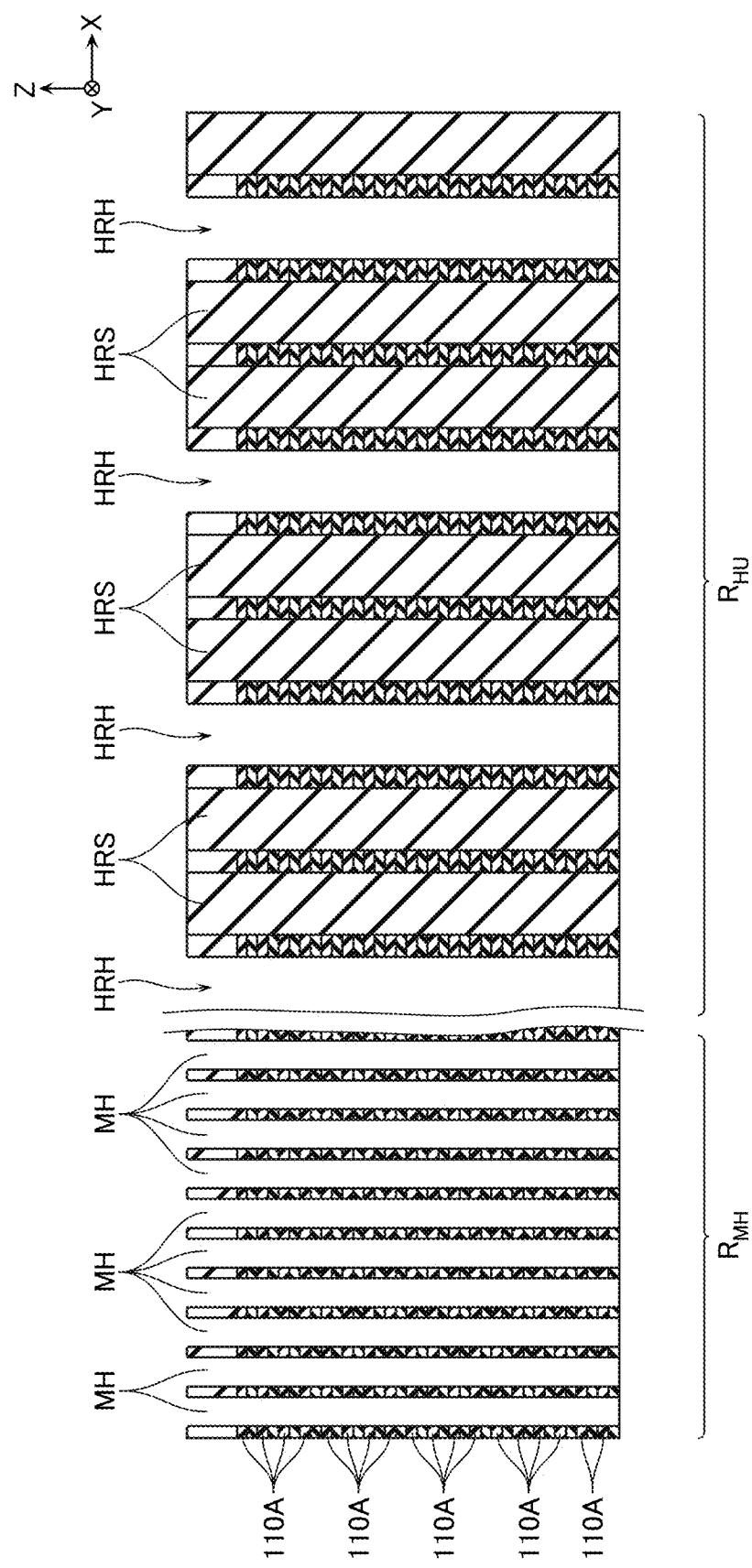
FIG. 35 is a schematic cross-sectional view for describing the same manufacturing method.

Next, as illustrated in FIG. 35, a plurality of supporting structures HRS are formed. This process is performed similarly to, for example, the processes described with reference to FIG. 14 to FIG. 17.

Figure 36:
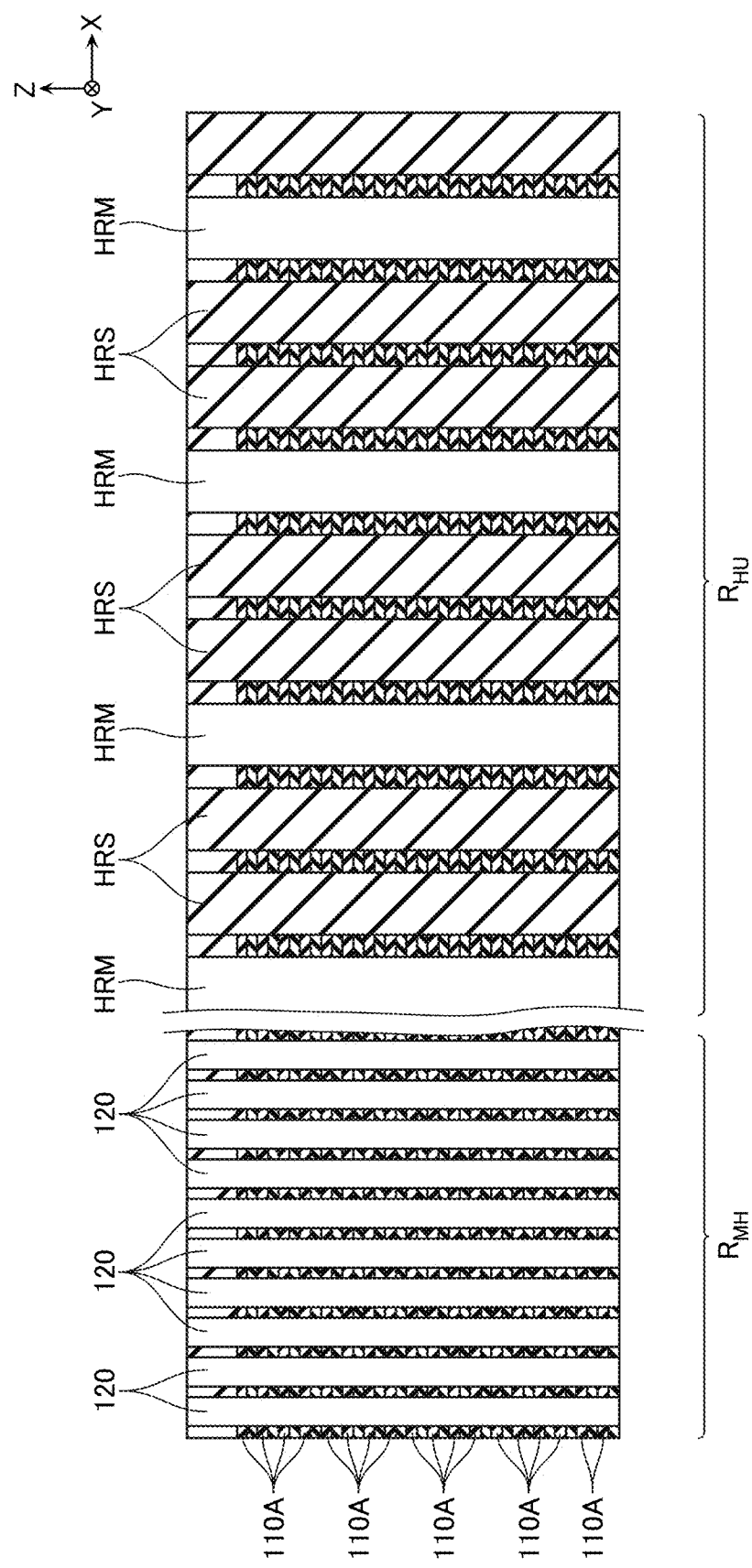
FIG. 36 is a schematic cross-sectional view for describing the same manufacturing method.

Next, as illustrated in FIG. 36, the configurations inside the plurality of memory holes MH and the plurality of supporting structures HRM are formed. This process is performed similarly to, for example, the processes described with reference to FIG. 18 to FIG. 21.

Figure 37:
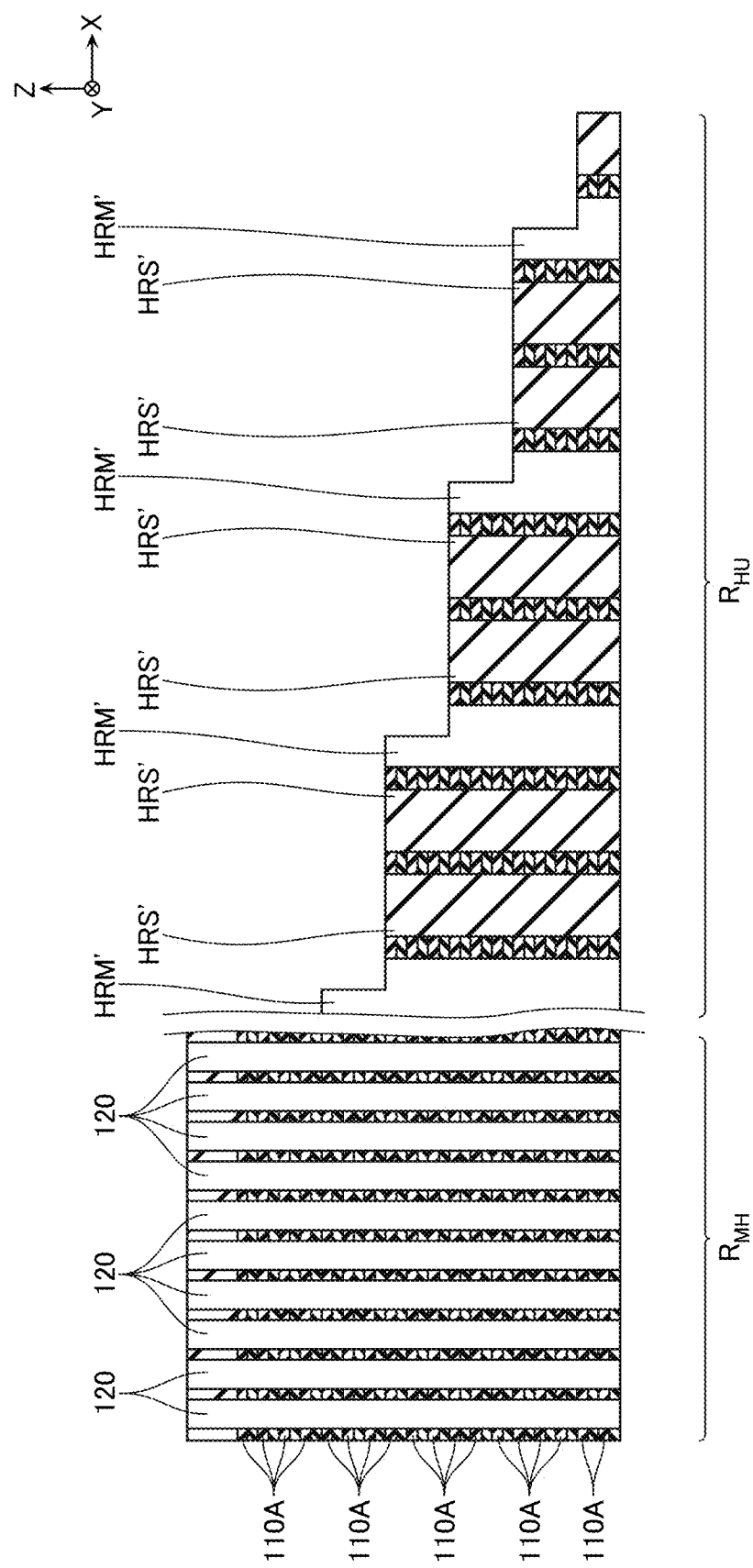
FIG. 37 is a schematic cross-sectional view for describing the same manufacturing method.

Next, for example, as illustrated in FIG. 37, an approximately staircase-shaped structure is formed in the hook-up region $R_{HU}$. This process is basically performed similarly to the process described with reference to FIG. 10. However, in the process corresponding to FIG. 37, not only the sacrifice layer 110A and the insulating layer 101, but parts of the supporting structures HRS', HRM' are also removed.

Figure 38:
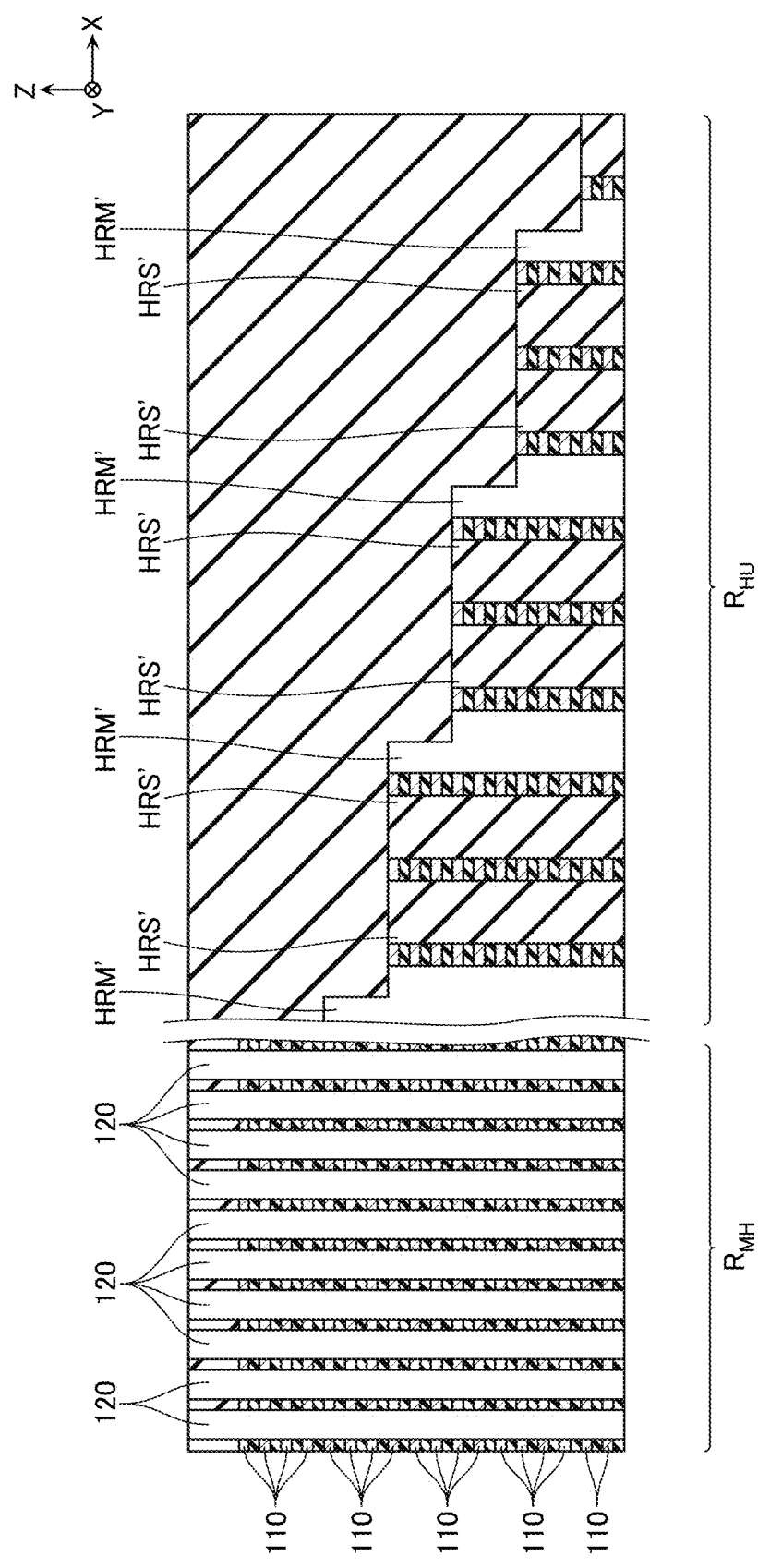
FIG. 38 is a schematic cross-sectional view for describing the same manufacturing method.

Next, the process described with reference to FIG. 11, and the processes described with reference to FIG. 22 to FIG. 29 are performed. Accordingly, a configuration as illustrated in FIG. 38 is formed.

Figure 39:
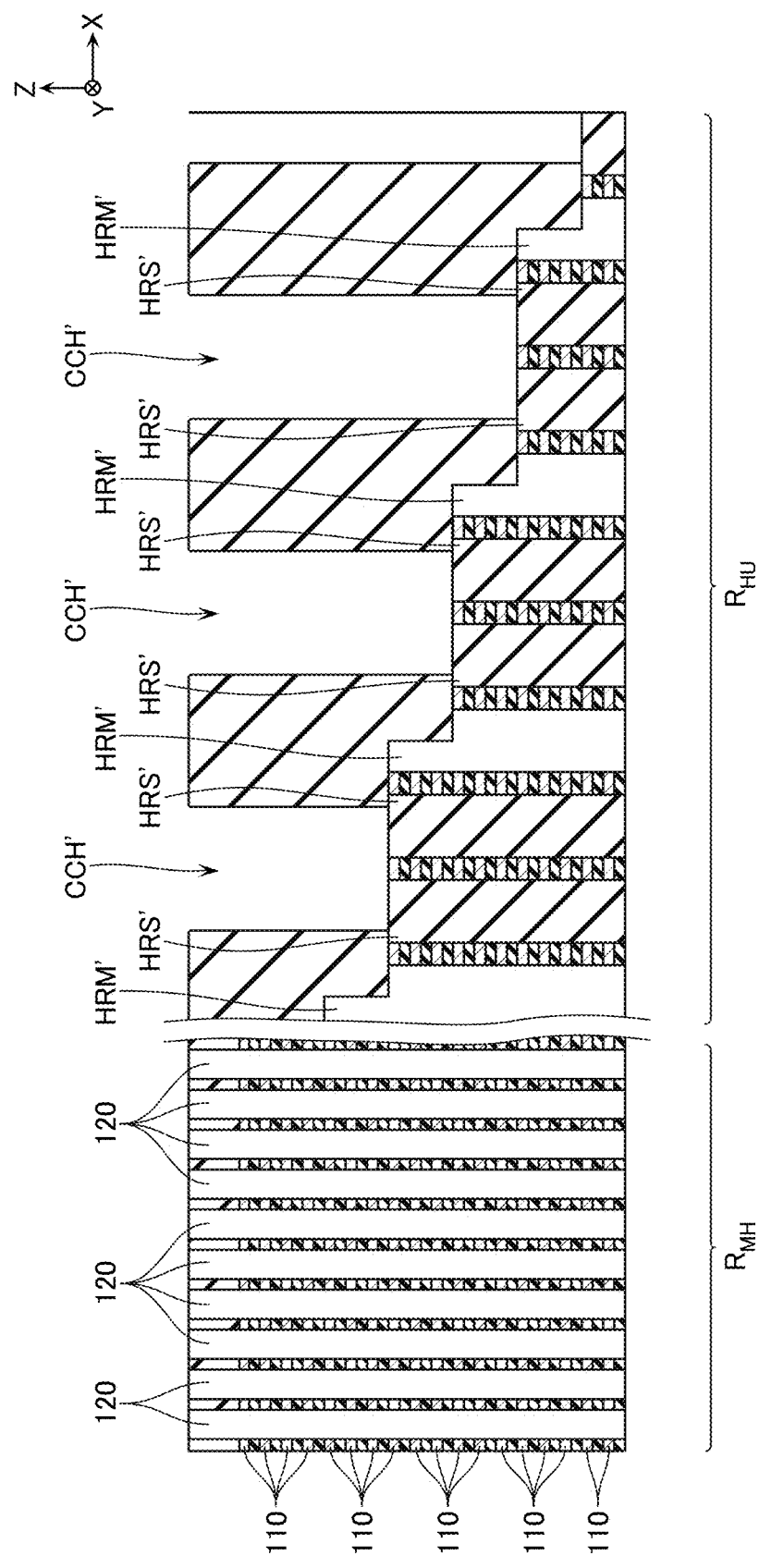
FIG. 39 is a schematic cross-sectional view for describing the same manufacturing method.

Next, for example, as illustrated in FIG. 39, a plurality of contact holes CCH' are formed in positions corresponding to the plurality of contact electrodes CC. The contact hole CCH' is a through hole that extends in the Z-direction, penetrates the insulating layers 101, and exposes the upper surfaces of the conductive layer 110 and the supporting structure HRS'. This process is performed by a method, such as RIE or the like.

Next, for example, as illustrated in FIG. 33, the contact electrode CC is formed inside the contact hole CCH'. This process is performed by CVD or the like.

Subsequently, by forming wirings and the like, the semiconductor memory device according to the second embodiment is formed.

[Effect]

Similarly to the semiconductor memory device according to the first embodiment, the semiconductor memory device according to the second embodiment can preferably support the hollow structure while reducing the occurrence of the level difference as described above.

In the manufacturing process of the semiconductor memory device according to the first embodiment, in the process described with reference to FIG. 12 and FIG. 13, the plurality of memory holes MH and the plurality of via holes HRH are formed. Here, the plurality of memory holes MH each penetrate the same number of the sacrifice layers 110A. On the other hand, all the plurality of via holes HRH penetrate different numbers of sacrifice layers 110A. For such reasons, the plurality of via holes HRH are difficult to be formed uniformly in some cases.

Here, in the manufacturing process of the semiconductor memory device according to the second embodiment, in the process described with reference to FIG. 34, the plurality of memory holes MH and the plurality of via holes HRH all penetrate the same number of the sacrifice layers 110A. Therefore, compared with the semiconductor memory device according to the first embodiment, uniform formation of the plurality of via holes HRH is facilitated.

Third Embodiment

Figure 40:
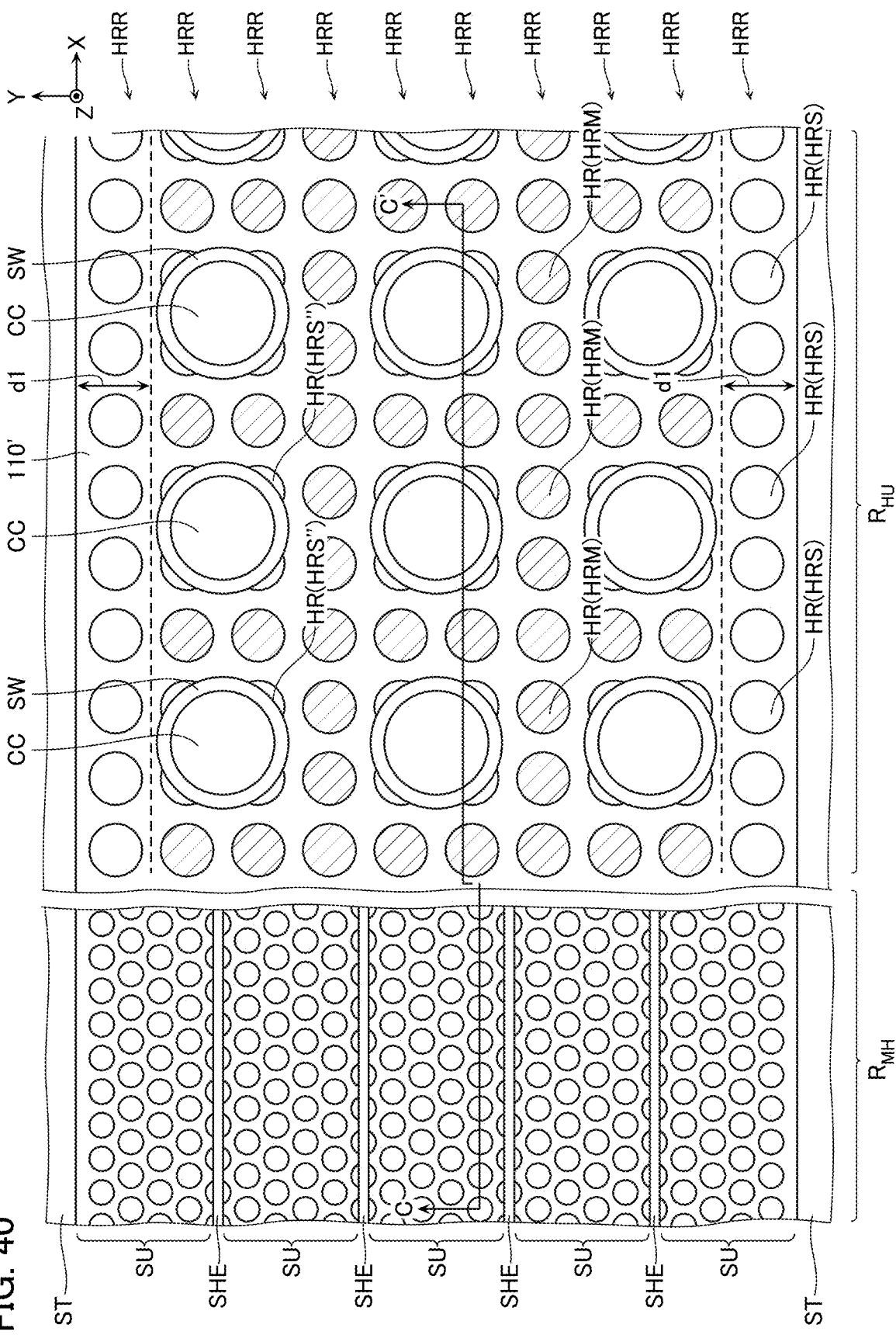
FIG. 40 is a schematic plan view illustrating a part of a configuration of a semiconductor memory device according to a third embodiment.
Figure 41:
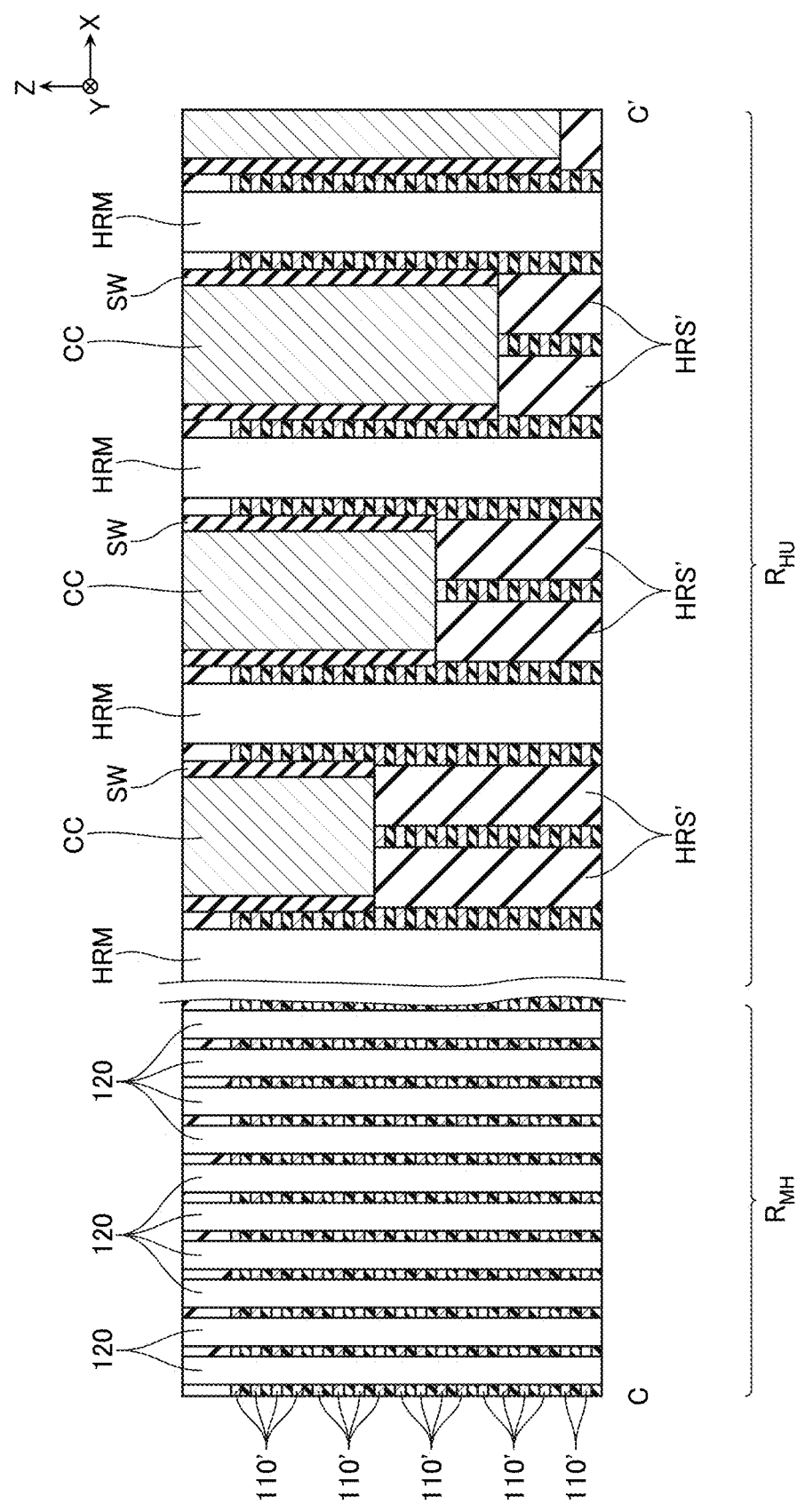
FIG. 41 is a schematic cross-sectional view taking the structure illustrated in FIG. 40 along the line C-C' and viewed along the arrow direction.

Next, with reference to FIG. 40 and FIG. 41, the semiconductor memory device according to the third embodiment is described. FIG. 40 is a schematic plan view illustrating a part of the configuration of the semiconductor memory device according to the third embodiment. FIG. 41 is a schematic cross-sectional view taking the structure illustrated in FIG. 40 along the line C-C' and viewed along the arrow direction.

The semiconductor memory device according to the third embodiment is basically configured similarly to the semiconductor memory device according to the first embodiment.

However, in the third embodiment, an insulating layer SW, such as silicon oxide ($SiO_2$), is disposed on an outer peripheral surface of the contact electrode CC.

The semiconductor memory device according to the third embodiment includes a conductive layer 110' instead of the conductive layer 110. The conductive layer 110' is basically configured similarly to the conductive layer 110. However, the conductive layer 110' surrounds the respective outer peripheral surfaces of the plurality of contact electrodes CC via the plurality of insulating layers SW.

In the example of FIG. 40, the second, third, fifth, sixth, eighth, and ninth supporting structure regions HRR counted from one side in the Y-direction include a plurality of supporting structures HR arranged in a predetermined pitch in the X-direction. A part of these supporting structures HR are disposed in positions overlapping with the contact electrodes CC viewed from the Z-direction. In such positions, supporting structures HRS" are disposed as the supporting structures HR. These supporting structures HRS" are connected to the lower ends of the contact electrodes CC and outer peripheral surfaces of the insulating layers SW. Further, a part of these supporting structures HR are disposed in positions not overlapping with the contact electrodes CC viewed from the Z-direction. In such positions, supporting structures HRM are disposed as the supporting structures HR.

[Manufacturing Method]

Next, with reference to FIG. 42 to FIG. 57, the manufacturing method of the semiconductor memory device according to the third embodiment is described. FIG. 42 to FIG. 57 are schematic cross-sectional views for describing the same manufacturing method, and illustrate cross-sectional surfaces corresponding to FIG. 41.

In the manufacture of the semiconductor memory device according to the embodiment, first, among the manufacturing processes of the semiconductor memory device according to the second embodiment, the processes are performed up to the process described with reference to FIG. 36.

Figure 42:
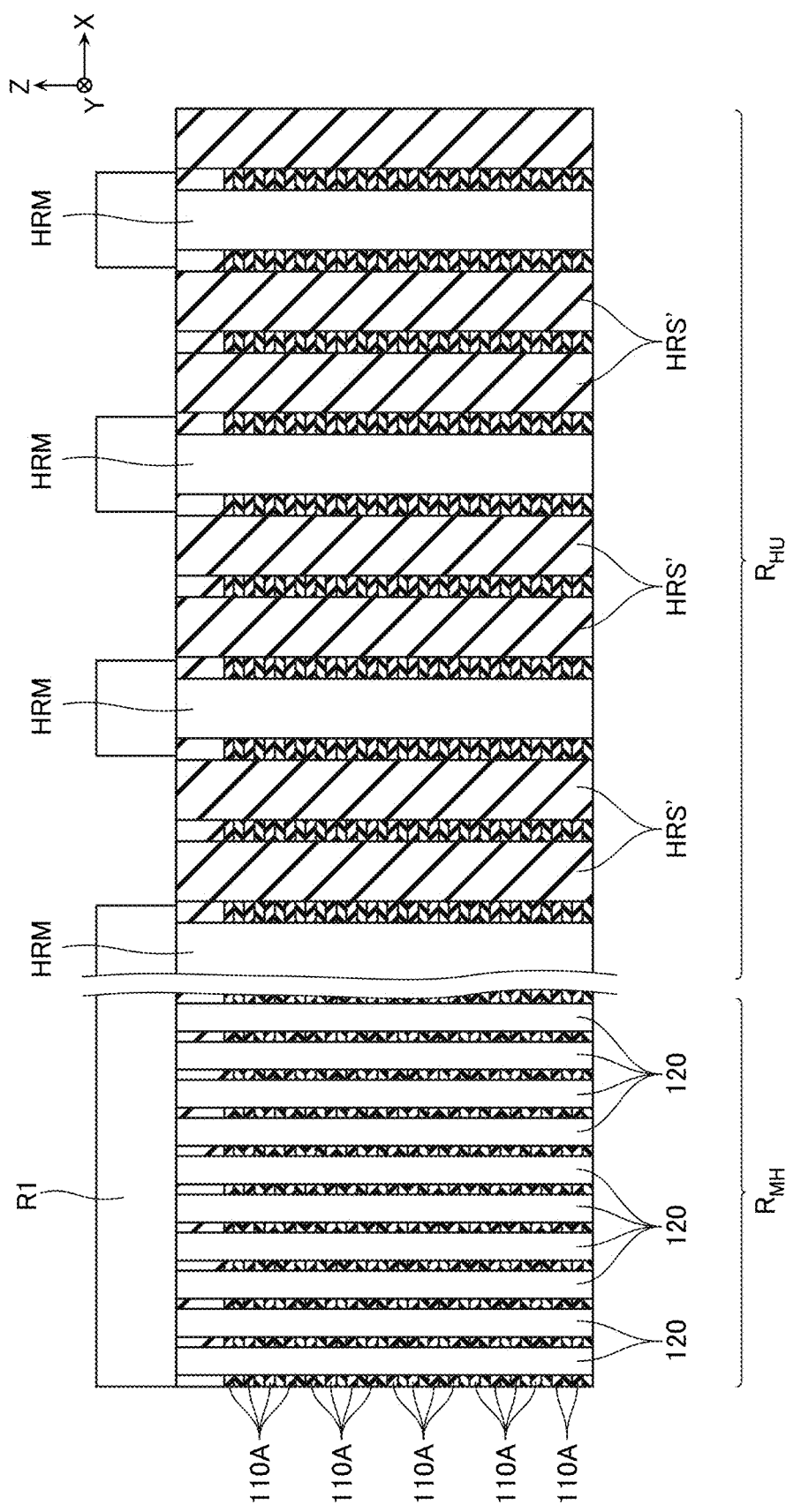
FIG. 42 is a schematic cross-sectional view for describing a manufacturing method of the semiconductor memory device according to the third embodiment.

Next, as illustrated in FIG. 42, a resist R1 is formed on an upper surface of the structure illustrated in FIG. 36. The resist R1 exposes positions corresponding to the plurality of contact electrodes CC, and covers the other regions.

Figure 43:
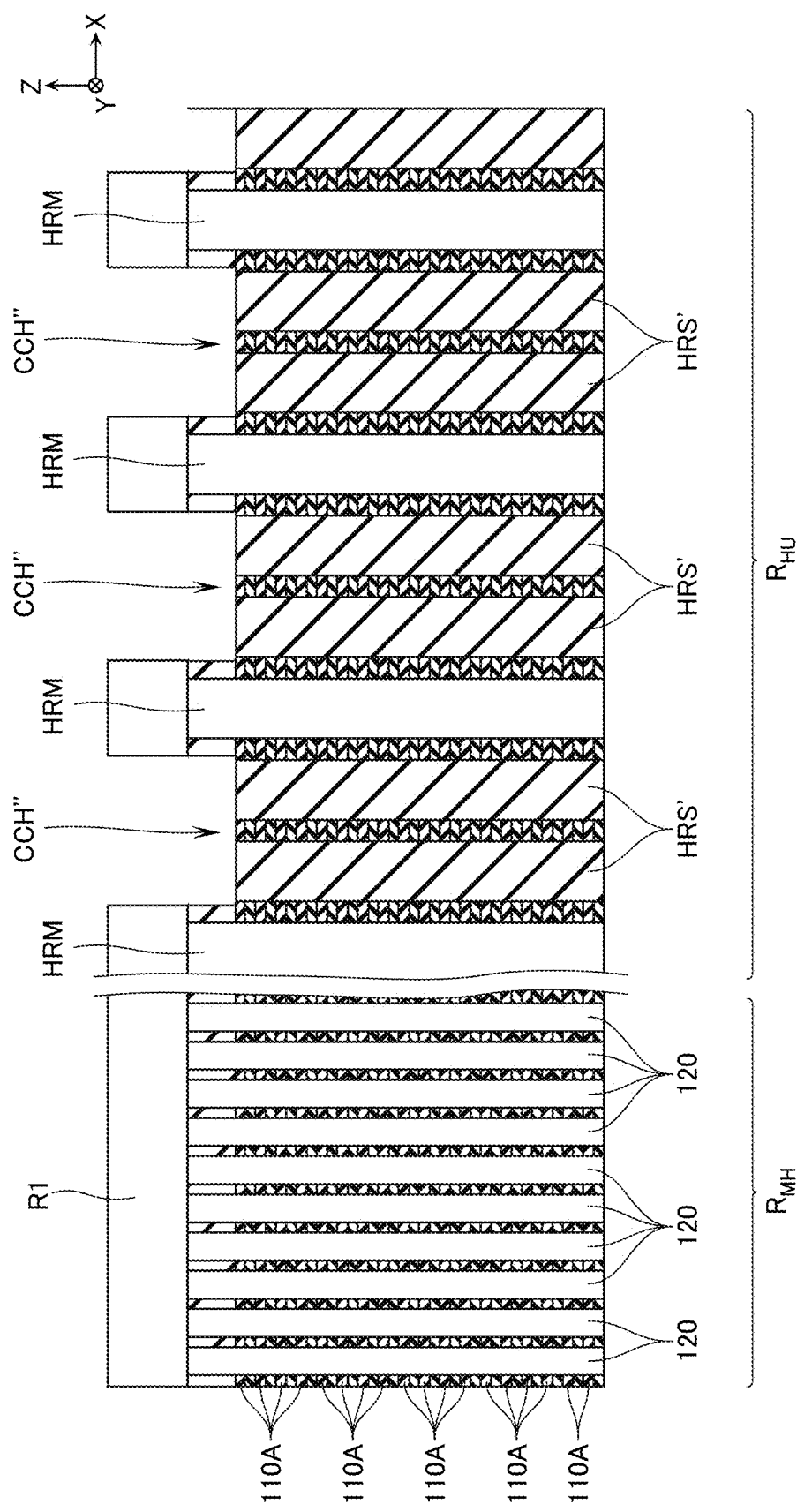
FIG. 43 is a schematic cross-sectional view for describing the same manufacturing method.

Next, as illustrated in FIG. 43, parts of the uppermost insulating layer 101 are removed to expose an upper surface of the first sacrifice layer 110A counted from above. This process is performed by RIE or the like.

Figure 44:
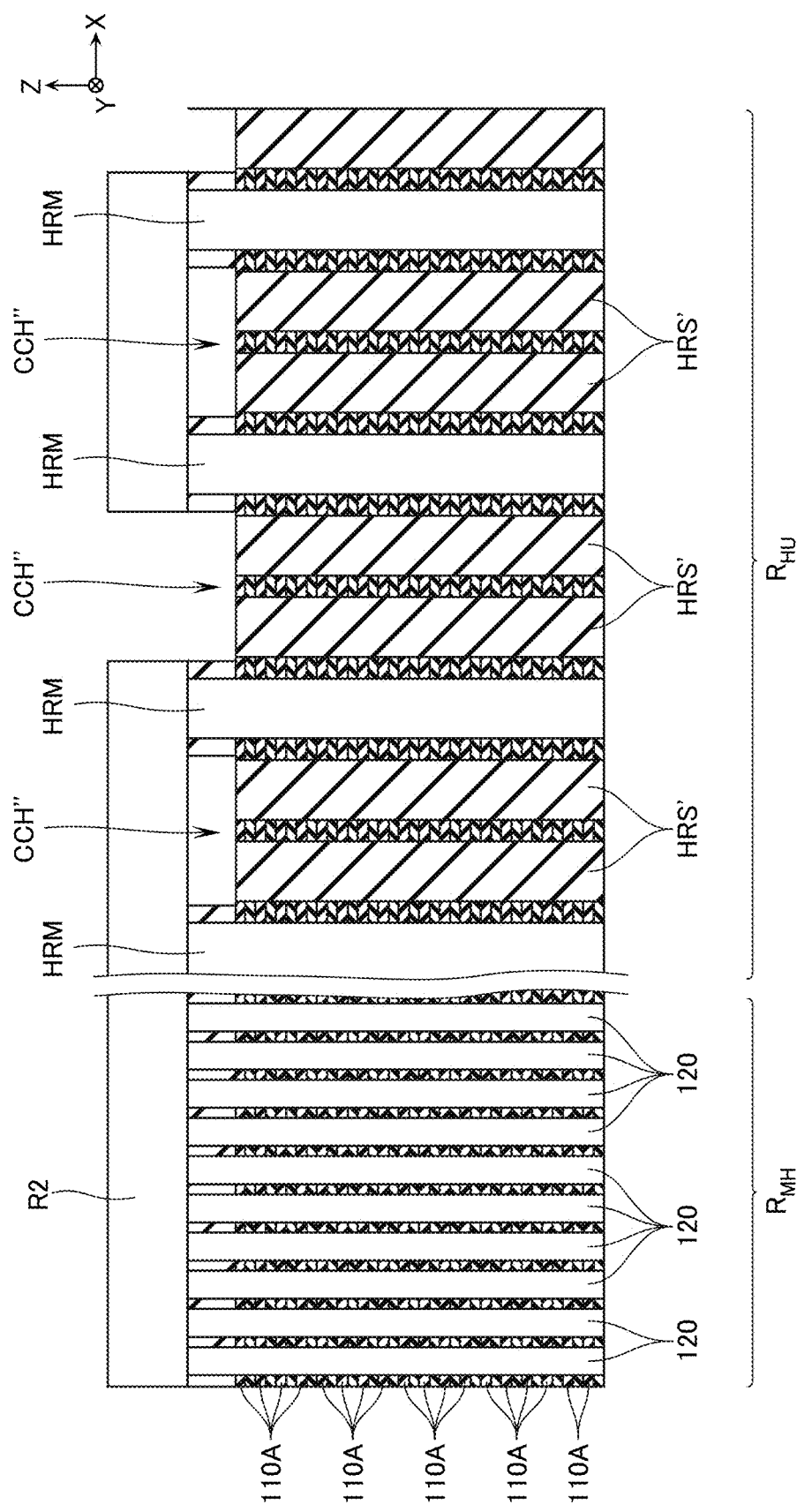
FIG. 44 is a schematic cross-sectional view for describing the same manufacturing method.

Next, as illustrated in FIG. 44, the resist R1 is peeled off to form a resist R2. The resist R2 exposes positions corresponding to the contact electrodes CC connected to even-numbered conductive layers 110' counted from above, among the plurality of contact electrodes CC, and covers the other regions.

Figure 45:
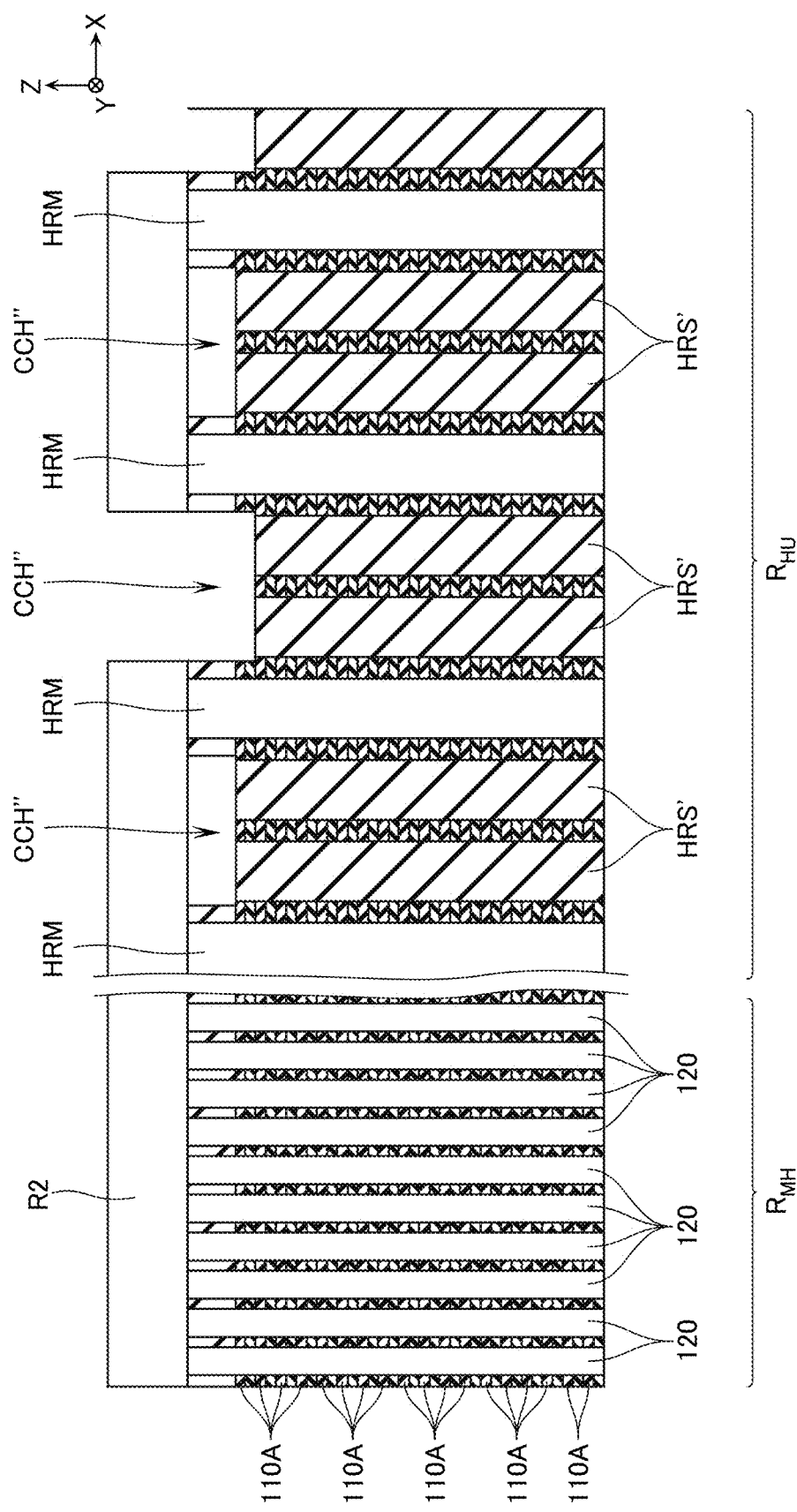
FIG. 45 is a schematic cross-sectional view for describing the same manufacturing method.

Next, as illustrated in FIG. 45, one layer of each of the sacrifice layer 110A and the insulating layer 101 is removed to expose an upper surface of the sacrifice layer 110A. This process is performed by RIE or the like.

Figure 46:
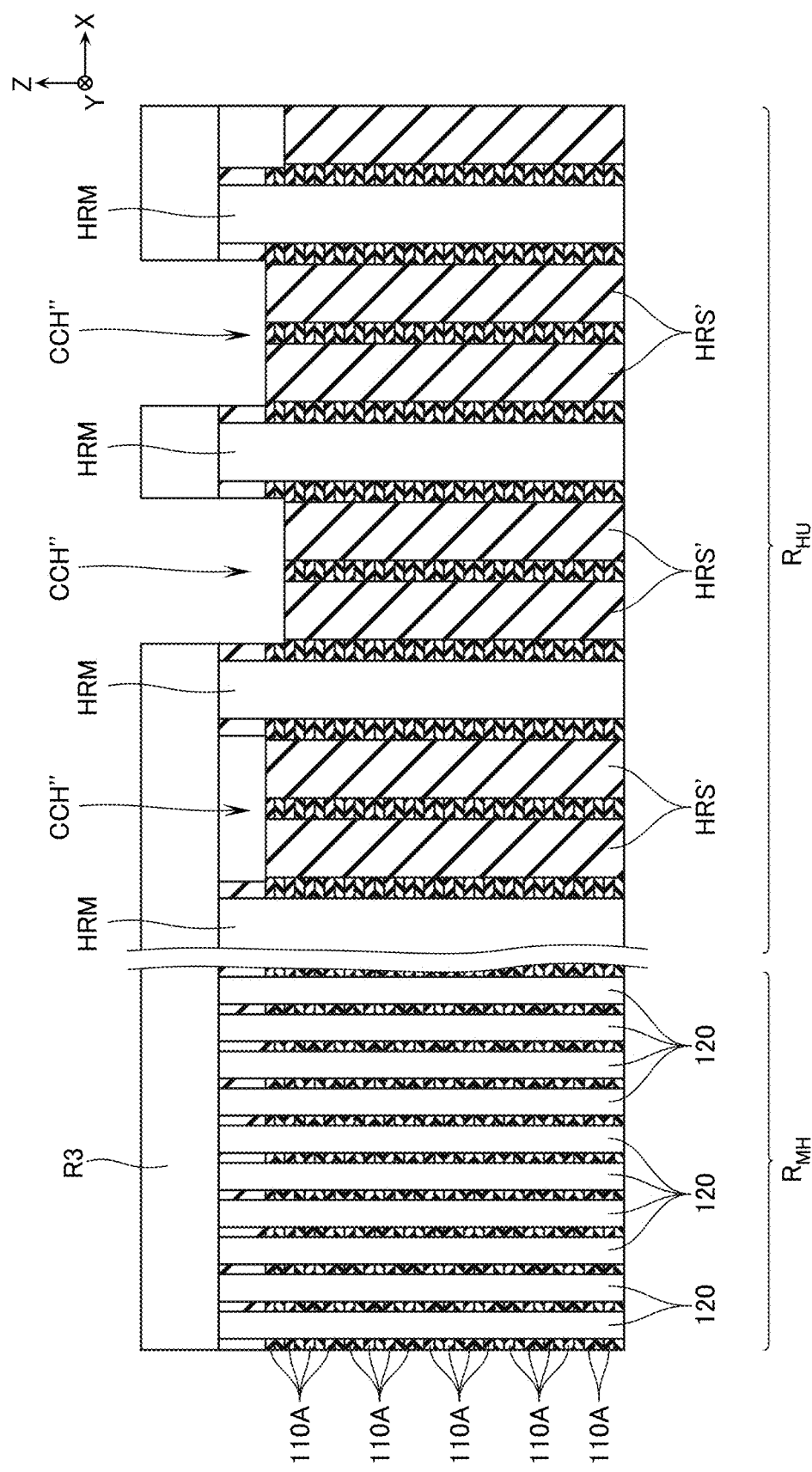
FIG. 46 is a schematic cross-sectional view for describing the same manufacturing method.

Next, as illustrated in FIG. 46, the resist R2 is peeled off to form a resist R3. The resist R3 exposes positions corresponding to the contact electrodes CC connected to the 4n+3-th and 4n+4-th (n is an integer of 0 or more) conductive layers 110' counted from above, among the plurality of contact electrodes CC, and covers the other regions.

Figure 47:
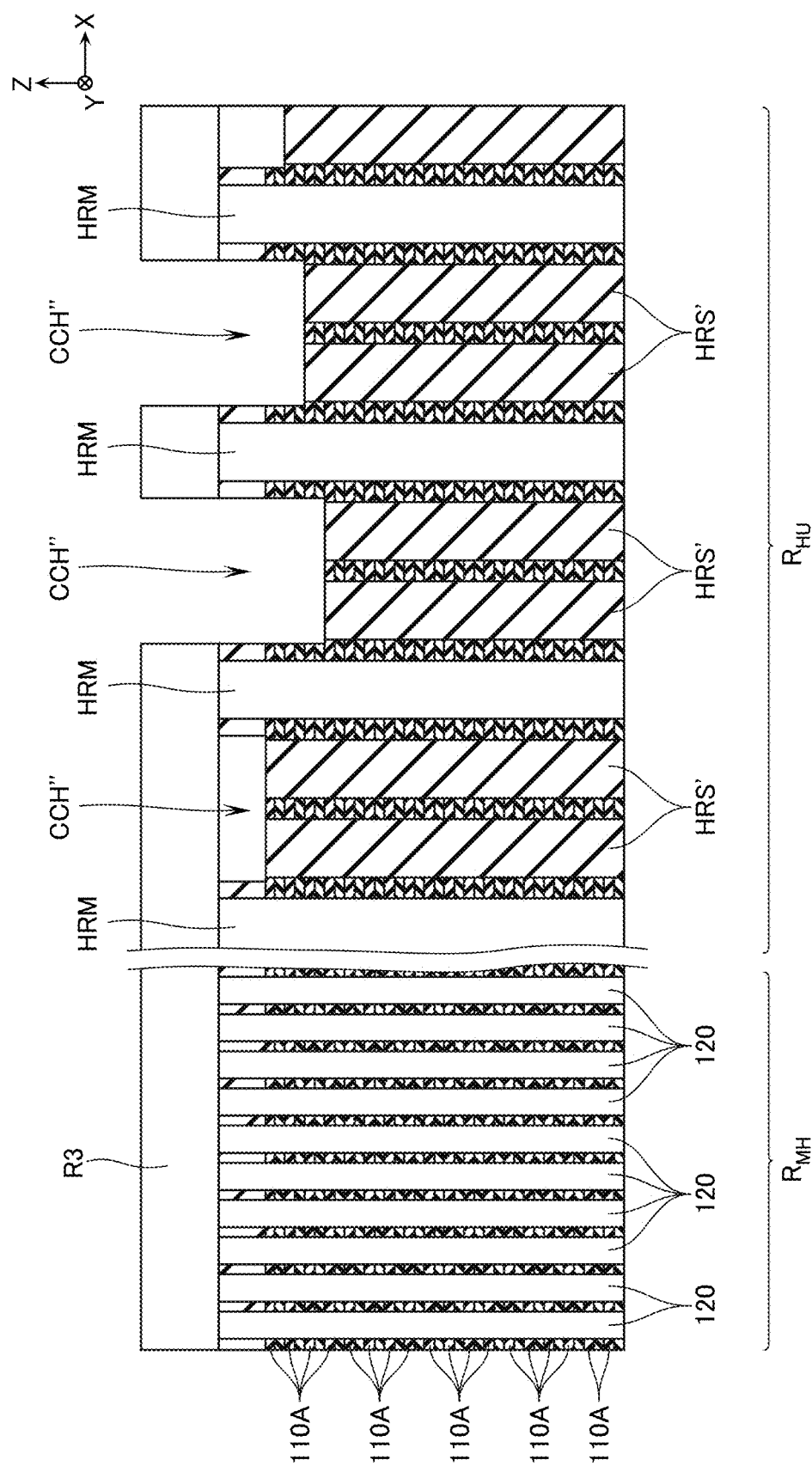
FIG. 47 is a schematic cross-sectional view for describing the same manufacturing method.

Next, as illustrated in FIG. 47, two layers of each of the sacrifice layer 110A and the insulating layer 101 are removed alternately to expose the upper surface of the sacrifice layer 110A. This process is performed by RIE or the like.

Figure 48:
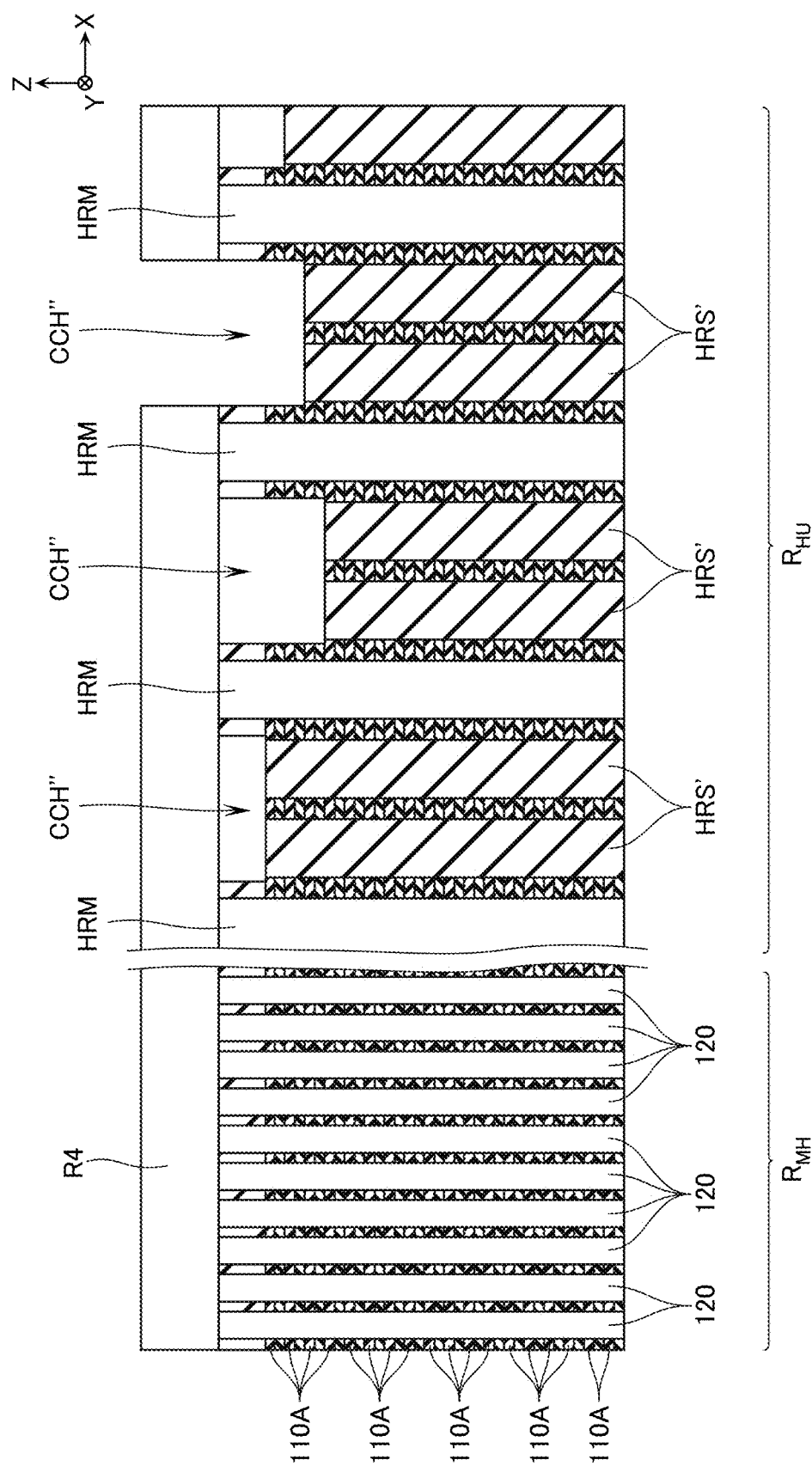
FIG. 48 is a schematic cross-sectional view for describing the same manufacturing method.

Next, as illustrated in FIG. 48, the resist R3 is peeled off to form a resist R4. The resist R4 exposes positions corresponding to the contact electrodes CC connected to the 8n+5-th to 8n+8-th (n is an integer of 0 or more) conductive layers 110' counted from above, among the plurality of contact electrodes CC, and covers the other regions.

Figure 49:
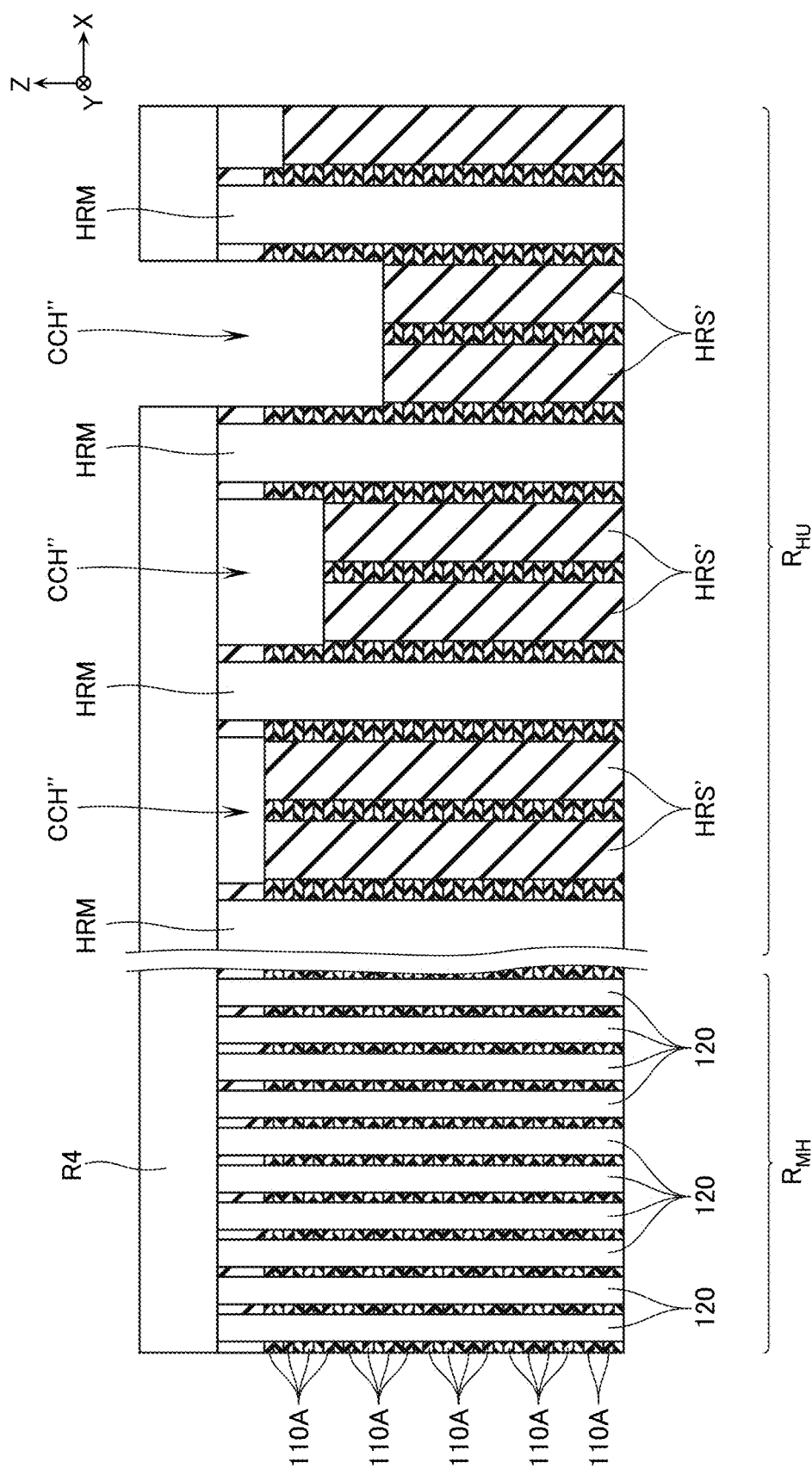
FIG. 49 is a schematic cross-sectional view for describing the same manufacturing method.

Next, as illustrated in FIG. 49, four layers of each of the sacrifice layer 110A and the insulating layer 101 are removed alternately to expose the upper surface of the sacrifice layer 110A. This process is performed by RIE or the like.

Figure 50:
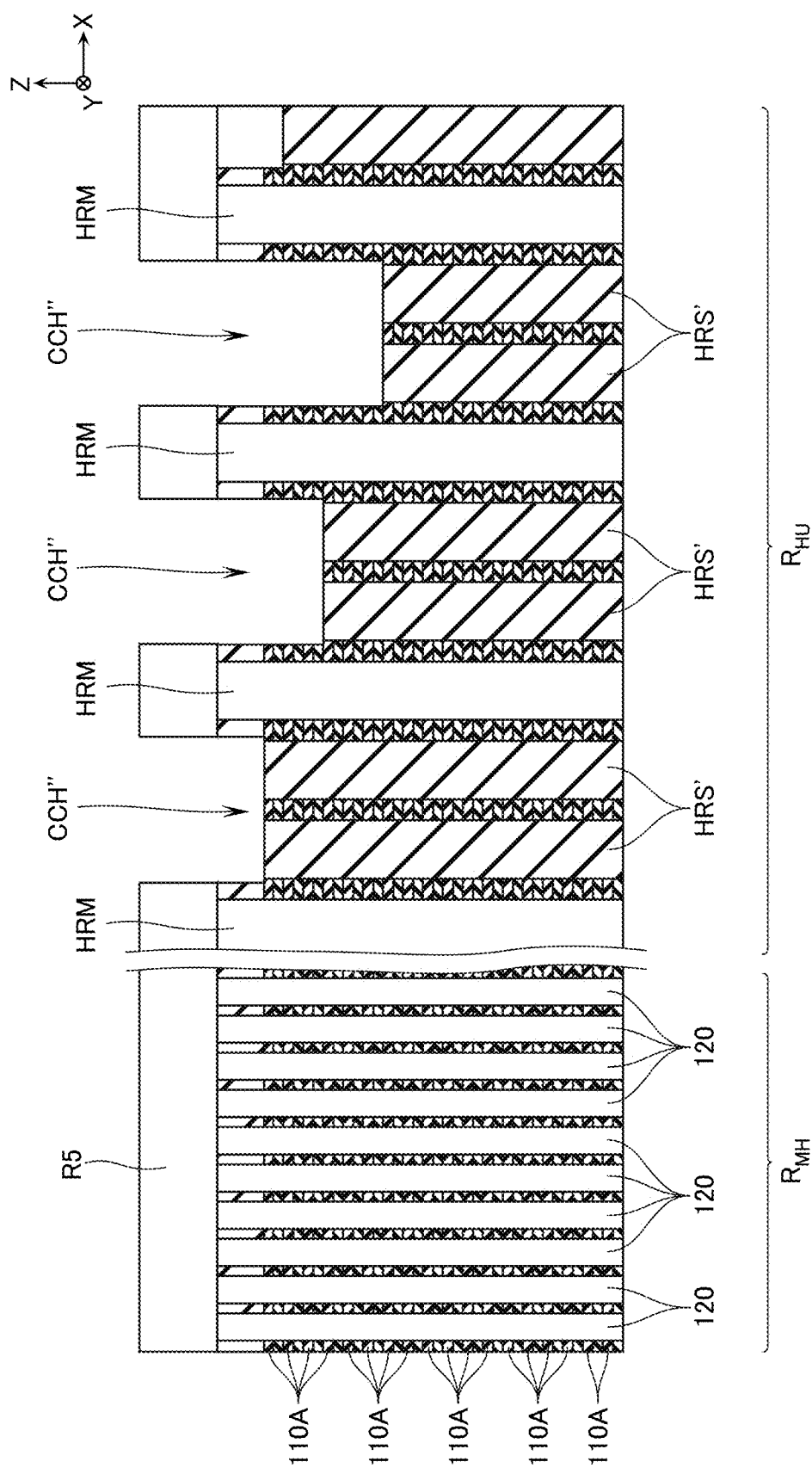
FIG. 50 is a schematic cross-sectional view for describing the same manufacturing method.

Next, as illustrated in FIG. 50, the resist R4 is peeled off to form a resist R5. The resist R5 exposes positions corresponding to the contact electrodes CC connected to the 16n+9-th to 16n+16-th (n is an integer of 0 or more) conductive layers 110' counted from above, among the plurality of contact electrodes CC, and covers the other regions.

Figure 51:
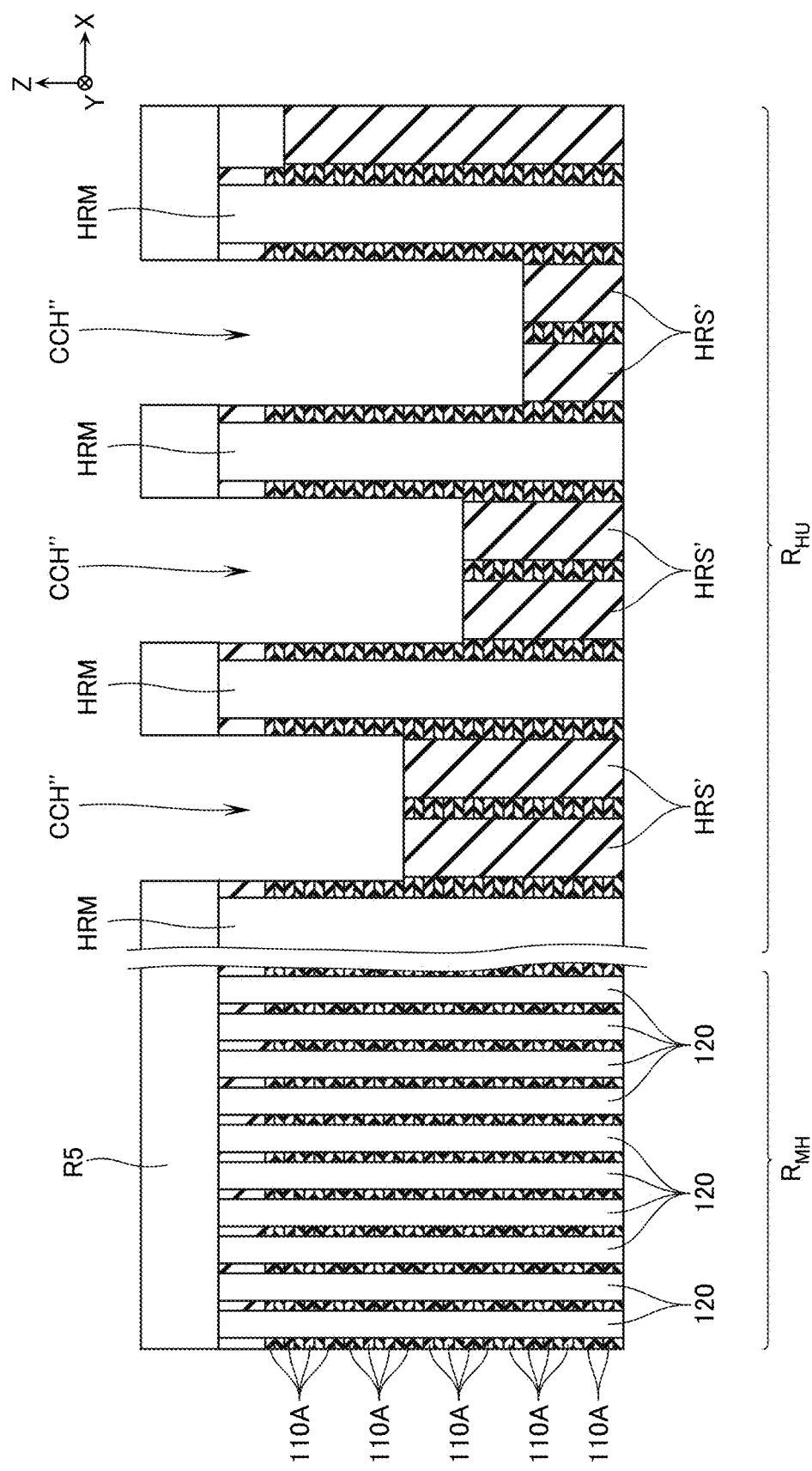
FIG. 51 is a schematic cross-sectional view for describing the same manufacturing method.

Next, as illustrated in FIG. 51, eight layers of each of the sacrifice layer 110A and the insulating layer 101 are removed alternately to expose the upper surface of the sacrifice layer 110A. This process is performed by RIE or the like.

Figure 52:
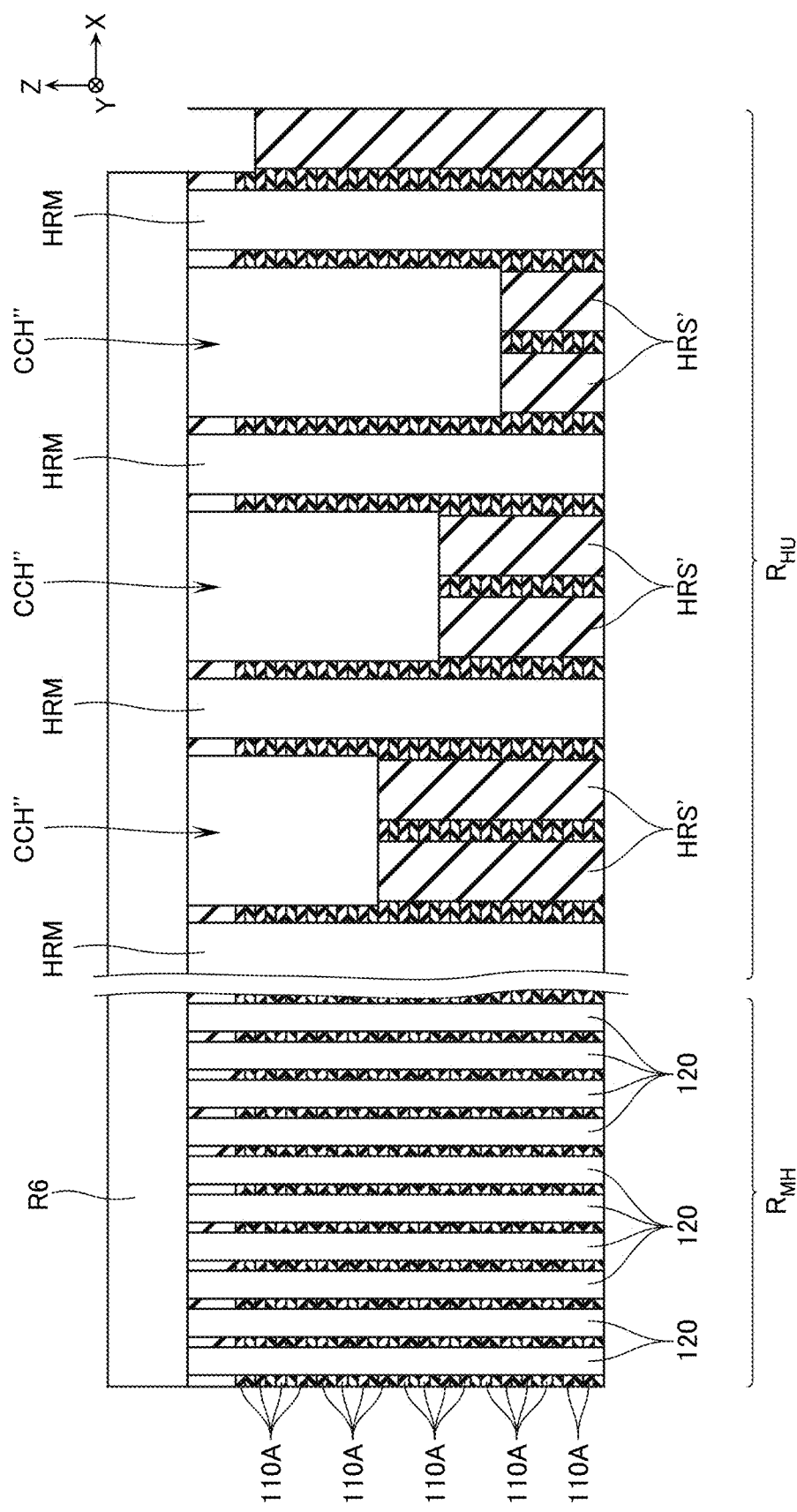
FIG. 52 is a schematic cross-sectional view for describing the same manufacturing method.

Next, as illustrated in FIG. 52, the resist R5 is peeled off to form a resist R6. The resist R6 exposes positions corresponding to the contact electrodes CC connected to the 32n+17-th to 32n+32-th (n is an integer of 0 or more) conductive layers 110' counted from above, among the plurality of contact electrodes CC, and covers the other regions.

Figure 53:
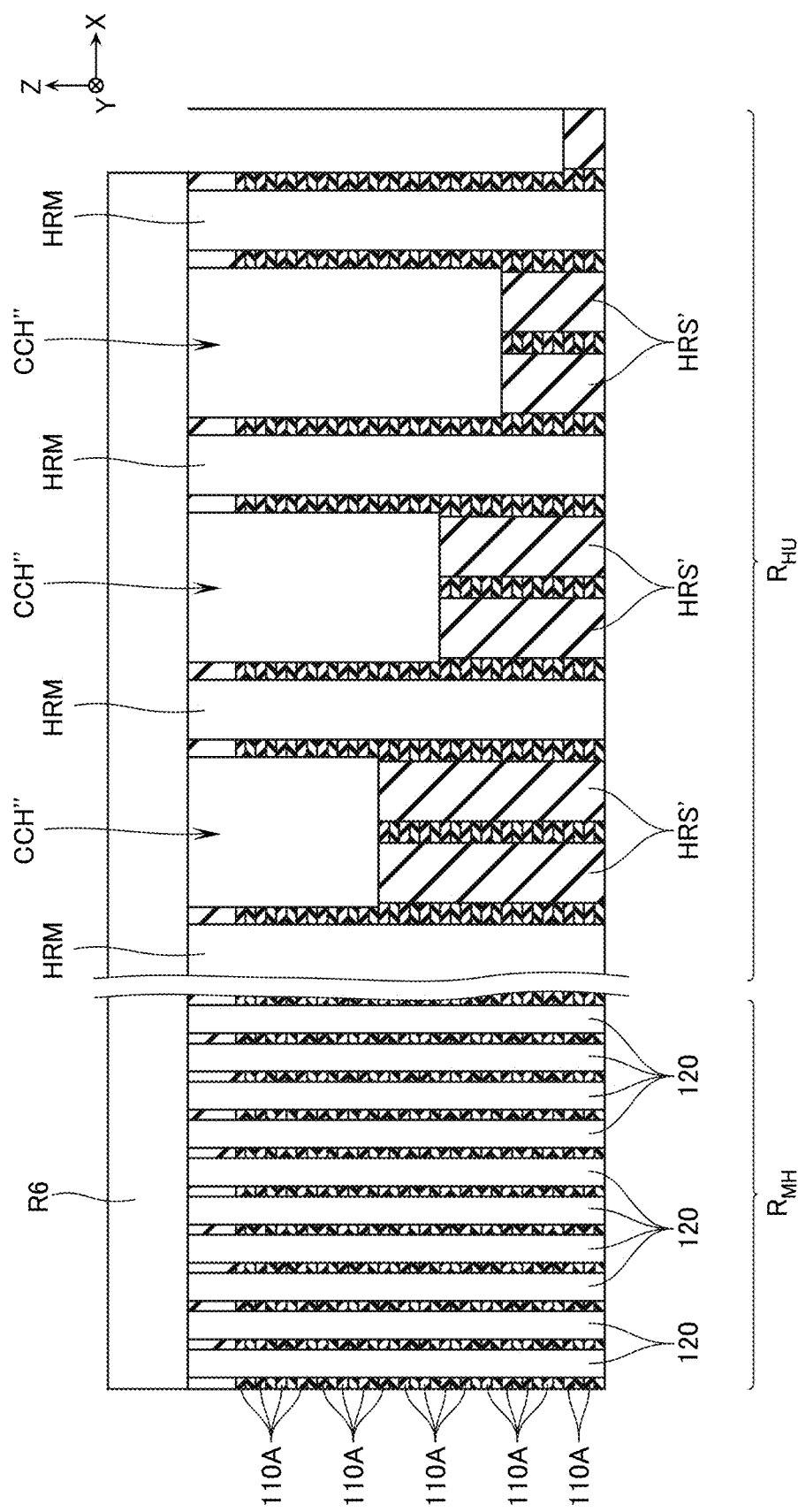
FIG. 53 is a schematic cross-sectional view for describing the same manufacturing method.

Next, as illustrated in FIG. 53, 16 layers of each of the sacrifice layer 110A and the insulating layer 101 are removed alternately to expose the upper surface of the sacrifice layer 110A. This process is performed by RIE or the like.

Figure 54:
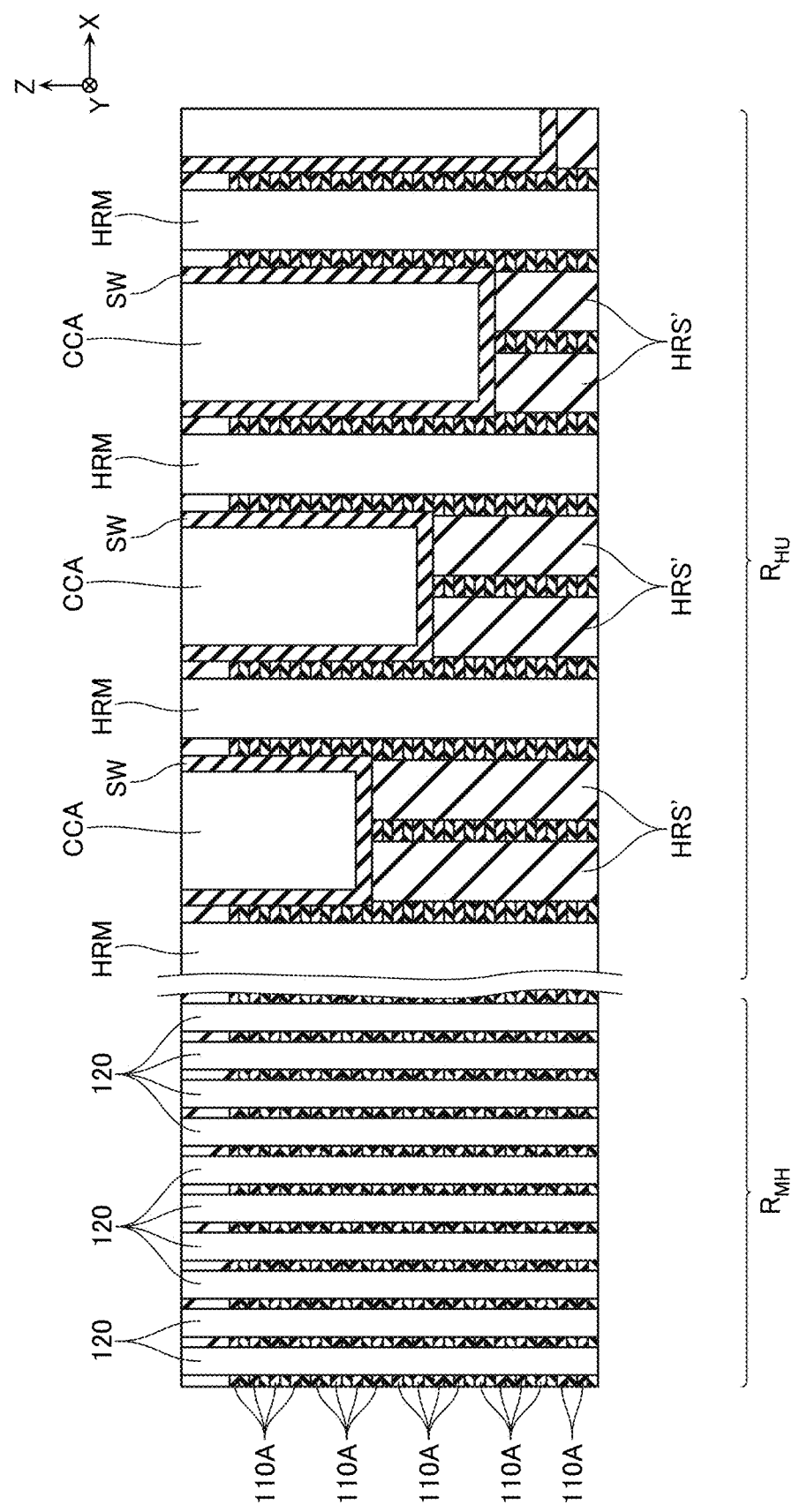
FIG. 54 is a schematic cross-sectional view for describing the same manufacturing method.

Next, as illustrated in FIG. 54, the insulating layer SW is formed on an inner peripheral surface and a bottom surface of a contact hole CCH" formed by the processes described with reference to FIG. 42 to FIG. 53. Further, a sacrifice layer CCA is formed inside the contact hole CCH". This process is performed by CVD or the like.

Figure 55:
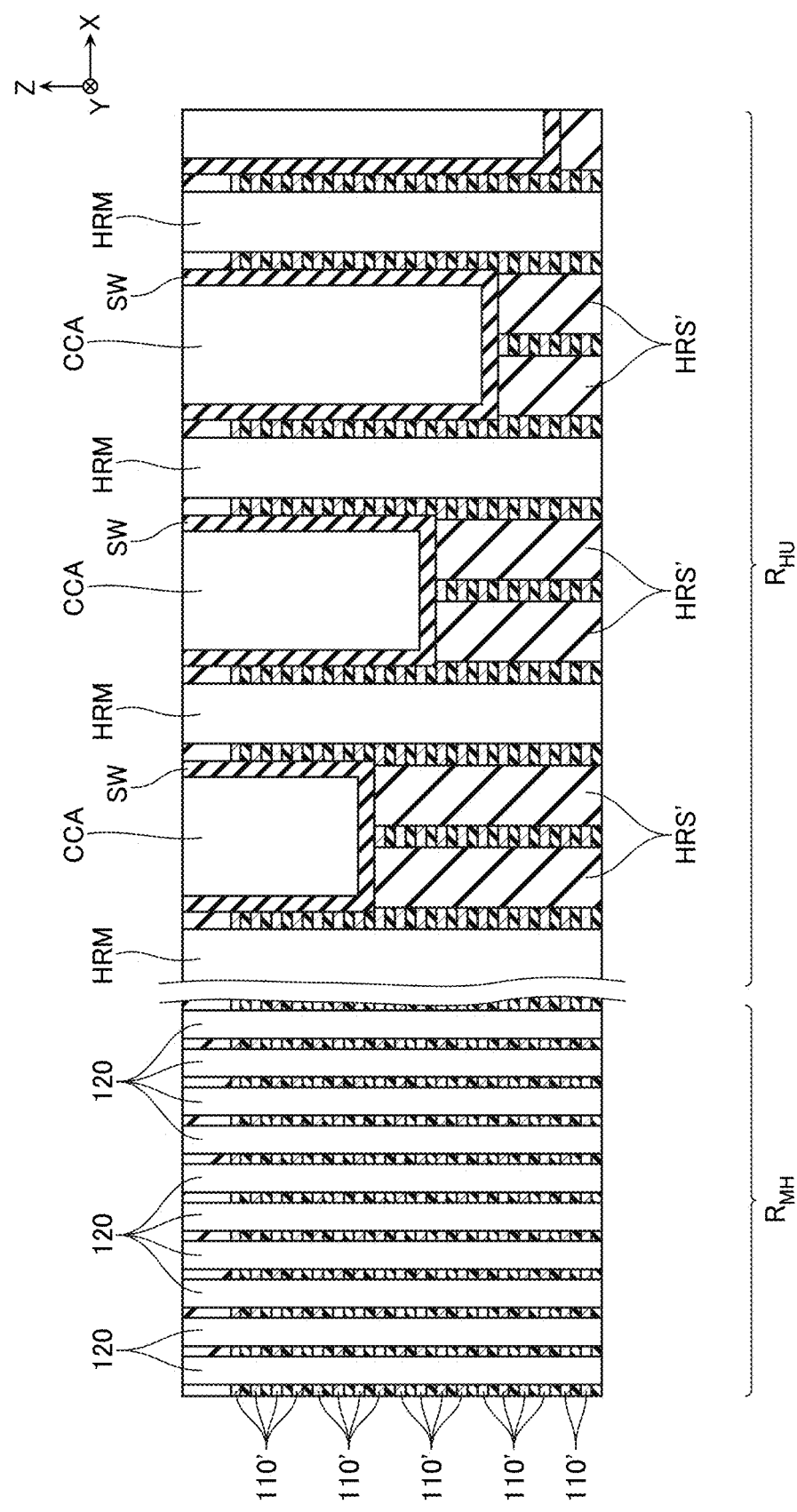
FIG. 55 is a schematic cross-sectional view for describing the same manufacturing method.

Next, among the manufacturing processes of the semiconductor memory device according to the first embodiment, the processes described with reference to FIG. 22 to FIG. 29 are performed. Accordingly, a configuration as illustrated in FIG. 55 is formed.

Figure 56:
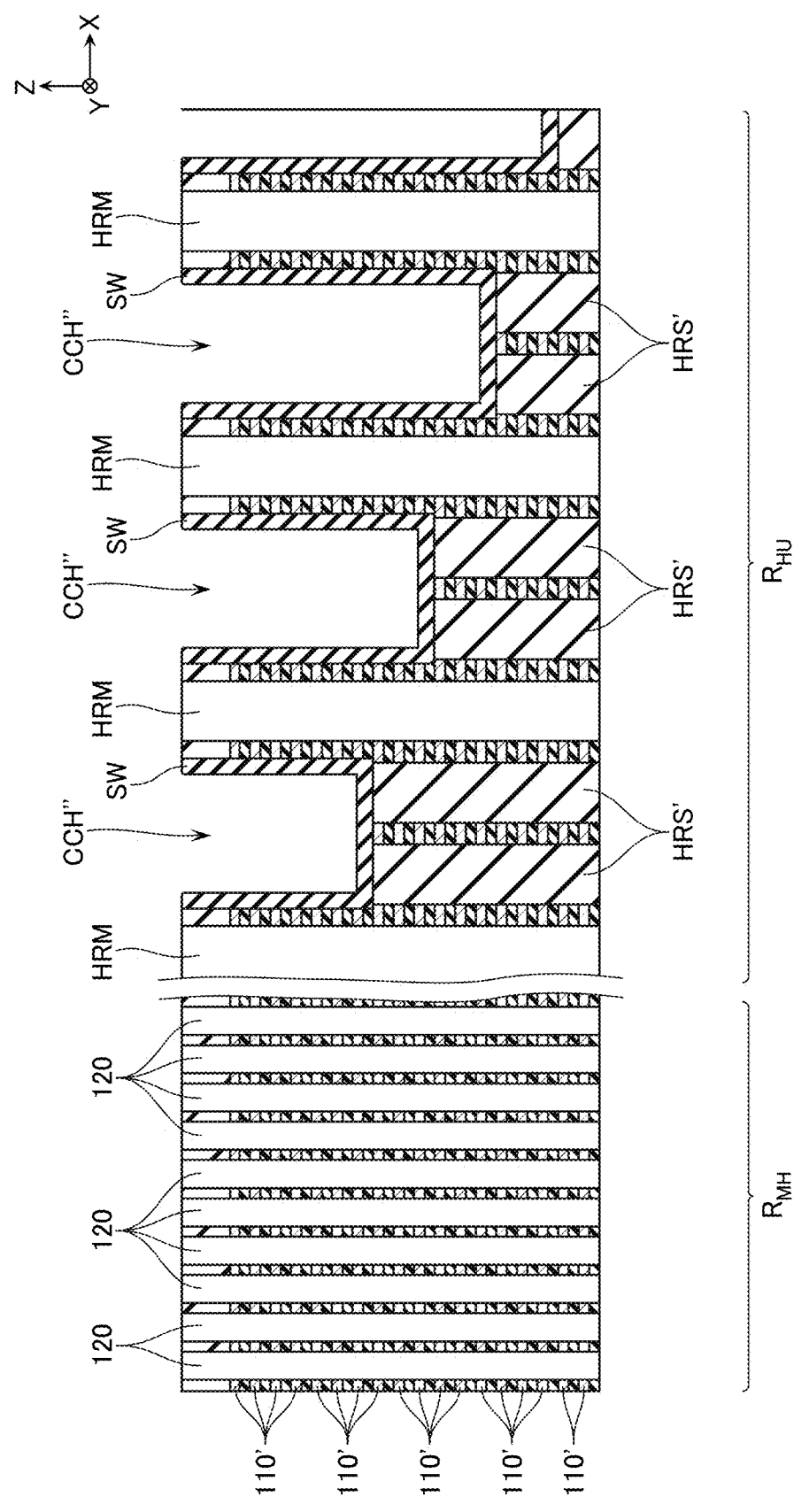
FIG. 56 is a schematic cross-sectional view for describing the same manufacturing method.

Next, as illustrated in FIG. 56, the sacrifice layers CCA are removed. This process is performed by wet etching or the like.

Figure 57:
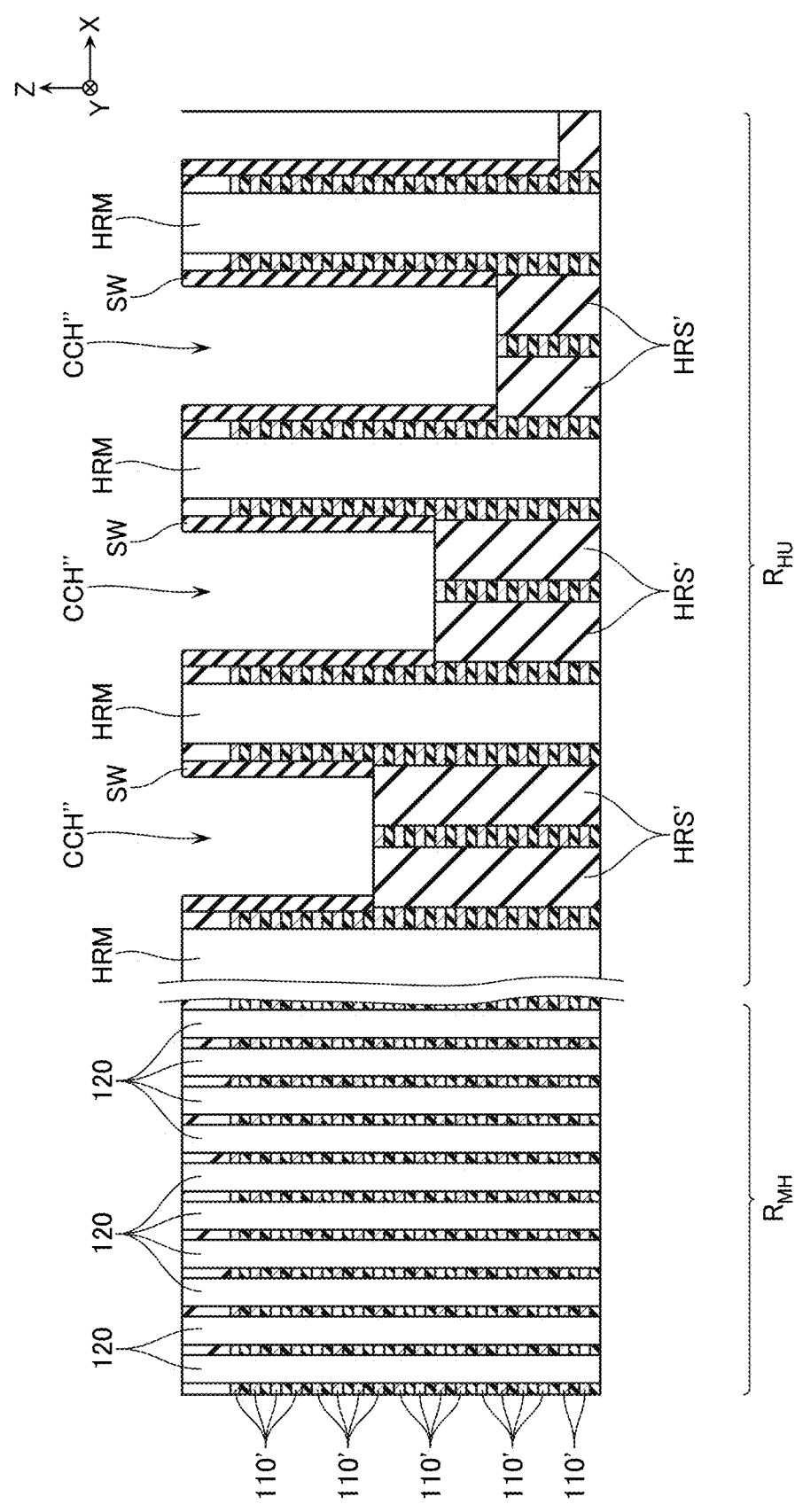
FIG. 57 is a schematic cross-sectional view for describing the same manufacturing method.

Next, as illustrated in FIG. 57, among the insulating layer SW, parts formed on the bottom surfaces of the contact holes CCH" are removed to expose the upper surface of the conductive layer 110'. This process is performed by RIE or the like.

Next, for example, as illustrated in FIG. 41, the contact electrodes CC are formed inside the contact holes CCH". This process is performed by CVD or the like.

Subsequently, by forming wirings and the like, the semiconductor memory device according to the third embodiment is formed.

[Effect]

Similarly to the semiconductor memory device according to the first embodiment, the semiconductor memory device according to the third embodiment can preferably support the hollow structure while reducing the occurrence of the level difference as described above.

Similarly to the semiconductor memory device according to the second embodiment, the semiconductor memory device according to the third embodiment facilitates uniform formation of the plurality of via holes HRH compared with the semiconductor memory device according to the first embodiment.

In the manufacturing process of the semiconductor memory device according to the second embodiment, in the process described with reference to FIG. 37, an approximately staircase-shaped structure is formed in the hook-up region $R_{HU}$. In this process, parts of the supporting structures HRS', HRM', in addition to the plurality of sacrifice layers 110A and the insulating layers 101, are removed. However, the plurality of sacrifice layers 110A, the insulating layers 101, and the supporting structures HRS', HRM' include different materials, and may be difficult to be processed simultaneously in some cases.

Here, in the manufacturing process of the semiconductor memory device according to the third embodiment, the process described with reference to FIG. 37 is not performed. Therefore, the semiconductor memory device according to the third embodiment is more easily manufacturable in some cases, compared with the semiconductor memory device according to the second embodiment.

Fourth Embodiment

Figure 58:
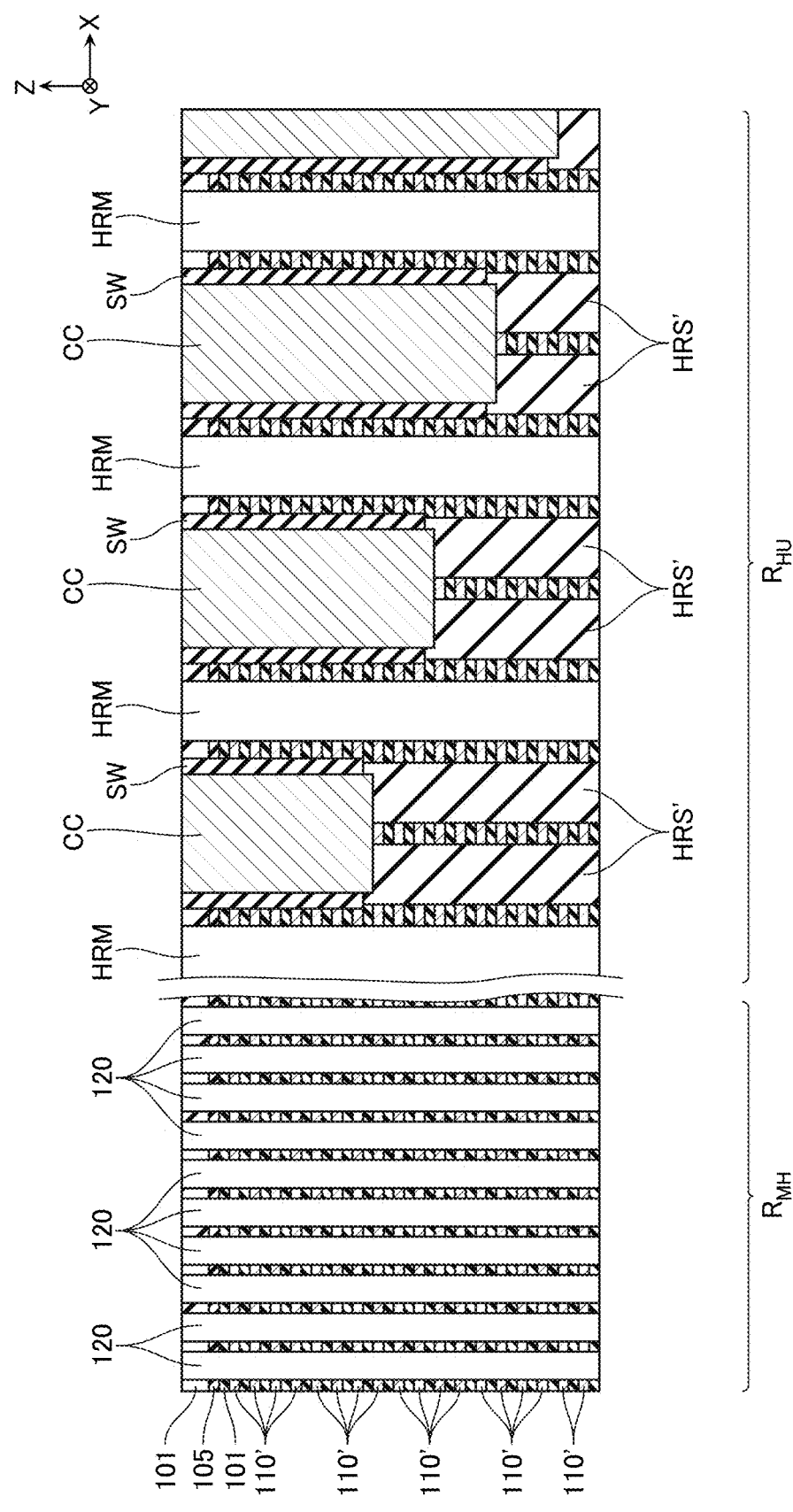
FIG. 58 is a schematic cross-sectional view illustrating a part of a configuration of a semiconductor memory device according to a fourth embodiment.

Next, with reference to FIG. 58, a semiconductor memory device according to the fourth embodiment is described. FIG. 58 is a schematic cross-sectional view illustrating a part of the configuration of the semiconductor memory device according to the fourth embodiment.

The semiconductor memory device according to the fourth embodiment is basically configured similarly to the semiconductor memory device according to the third embodiment.

However, in the fourth embodiment, an insulating layer 105 is disposed above the uppermost conductive layer 110' via the insulating layer 101. The insulating layer 105 may be, for example, an insulating metal oxide film including at least one of aluminum (Al), titanium (Ti), hafnium (Hf), or zirconium (Zr). Further, the insulating layer 105 may be any other insulating layer. The insulating layer 105 may be, for example, a material having higher resistance against phosphoric acid compared with the sacrifice layer 110A. Further, a material of the insulating layer 105 may have a sufficiently large selectivity to the insulating layer 101 when performing, for example, RIE or the like.

In the fourth embodiment, a lower end of the insulating layer SW is disposed above the lower end of the contact electrode CC. Specifically, the lower end of the insulating layer SW is disposed on the upper surface of the insulating layer 101 disposed on an upper surface of the conductive layer 110' connected to the corresponding contact electrode CC.

[Manufacturing Method]

Next, with reference to FIG. 59 to FIG. 75, a manufacturing method of the semiconductor memory device according to the fourth embodiment is described. FIG. 59 to FIG. 75 are schematic cross-sectional views for describing the same manufacturing method, and illustrate cross-sectional surfaces corresponding to FIG. 58.

In the manufacture of the semiconductor memory device according to the embodiment, first, among the manufacturing processes of the semiconductor memory device according to the first embodiment, the processes are performed up to the process described with reference to FIG. 8 and FIG. 9.

Figure 59:
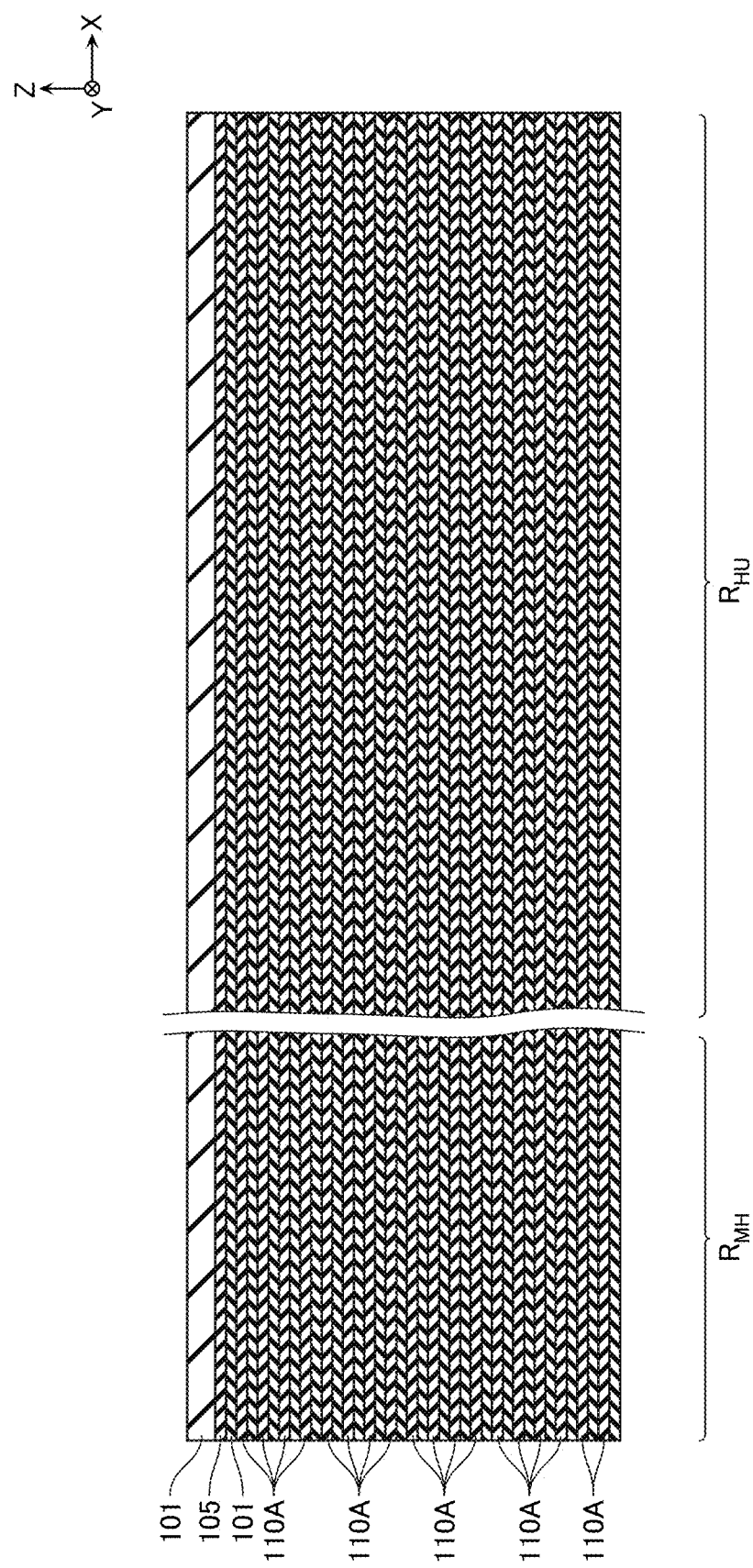
FIG. 59 is a schematic cross-sectional view for describing a manufacturing method of the semiconductor memory device according to the fourth embodiment.

Next, as illustrated in FIG. 59, the insulating layer 101, the insulating layer 105, and the insulating layer 101 are formed on an upper surface of the structure illustrated in FIG. 8 and FIG. 9. This process is performed by CVD or the like.

Next, among the manufacturing processes of the semiconductor memory device according to the second embodiment, the processes are performed up to the process described with reference to FIG. 36.

Figure 60:
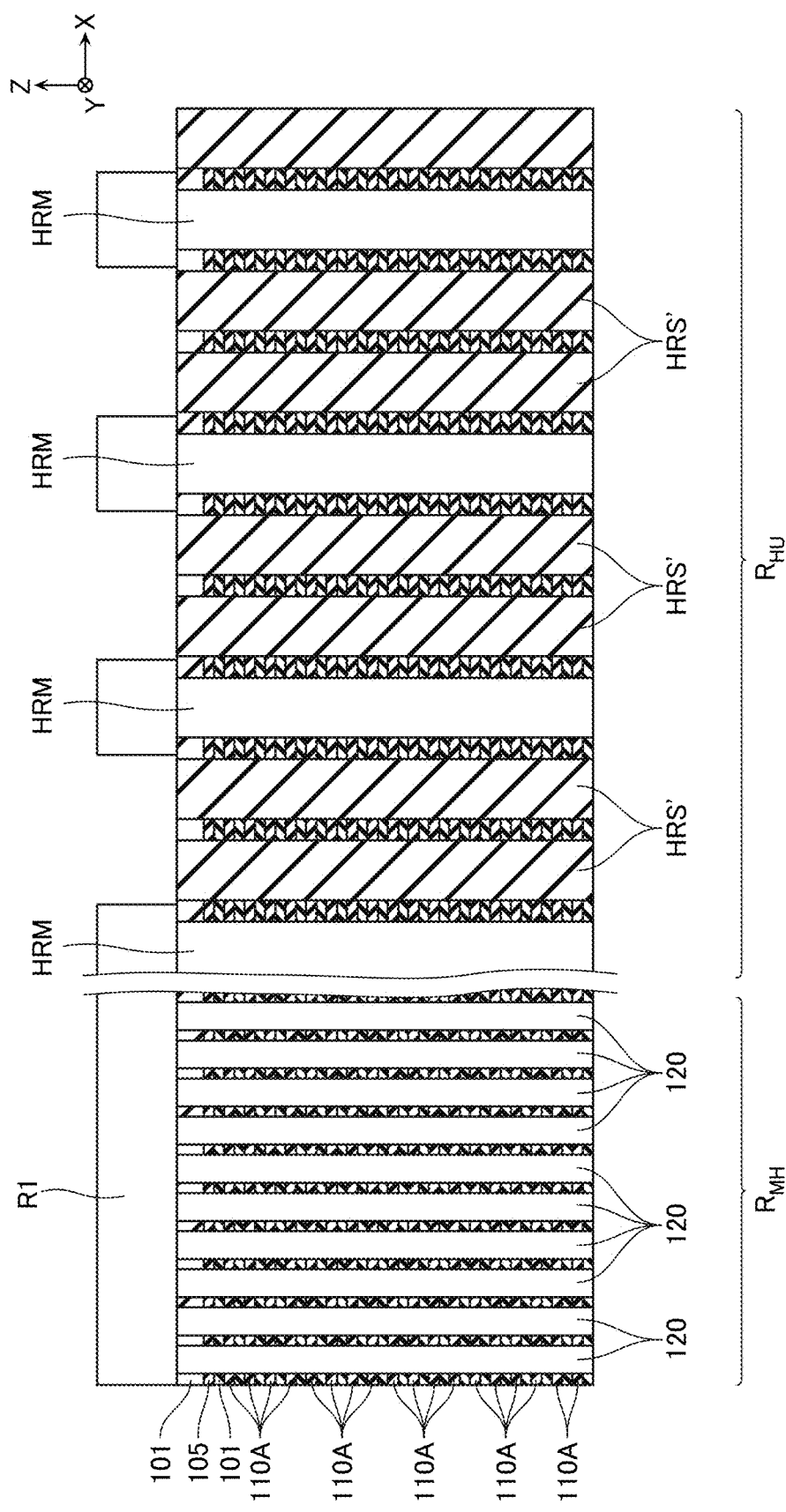
FIG. 60 is a schematic cross-sectional view for describing the same manufacturing method.

Next, as illustrated in FIG. 60, the resist R1 is formed on an upper surface of the structure illustrated in FIG. 36.

Figure 61:
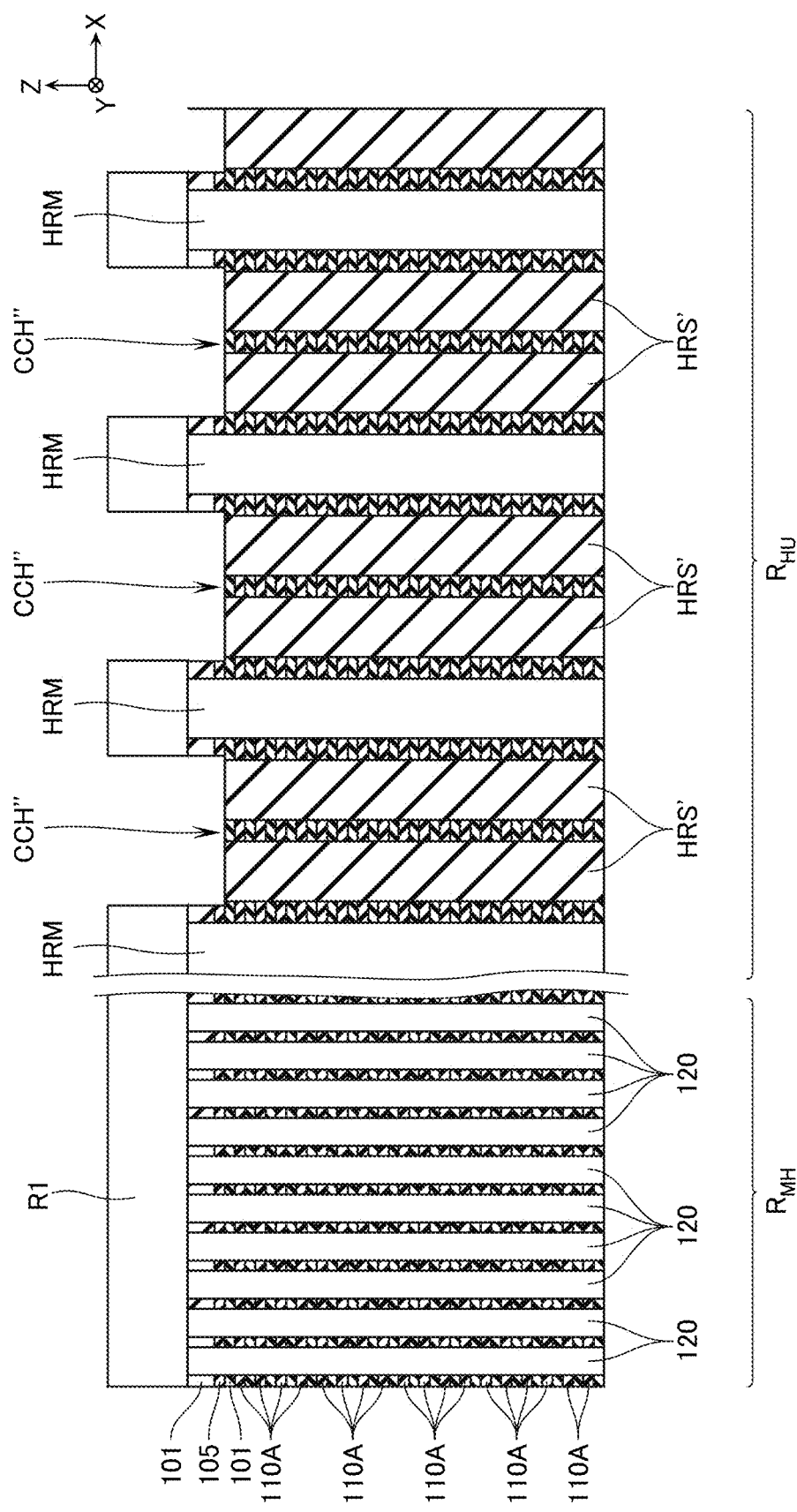
FIG. 61 is a schematic cross-sectional view for describing the same manufacturing method.

Next, as illustrated in FIG. 61, parts of the uppermost insulating layer 101 are removed to expose the upper surface of the insulating layer 105. Further, parts of the insulating layer 105 are removed to expose the upper surface of the insulating layer 101 immediately below the insulating layer 105.

Figure 62:
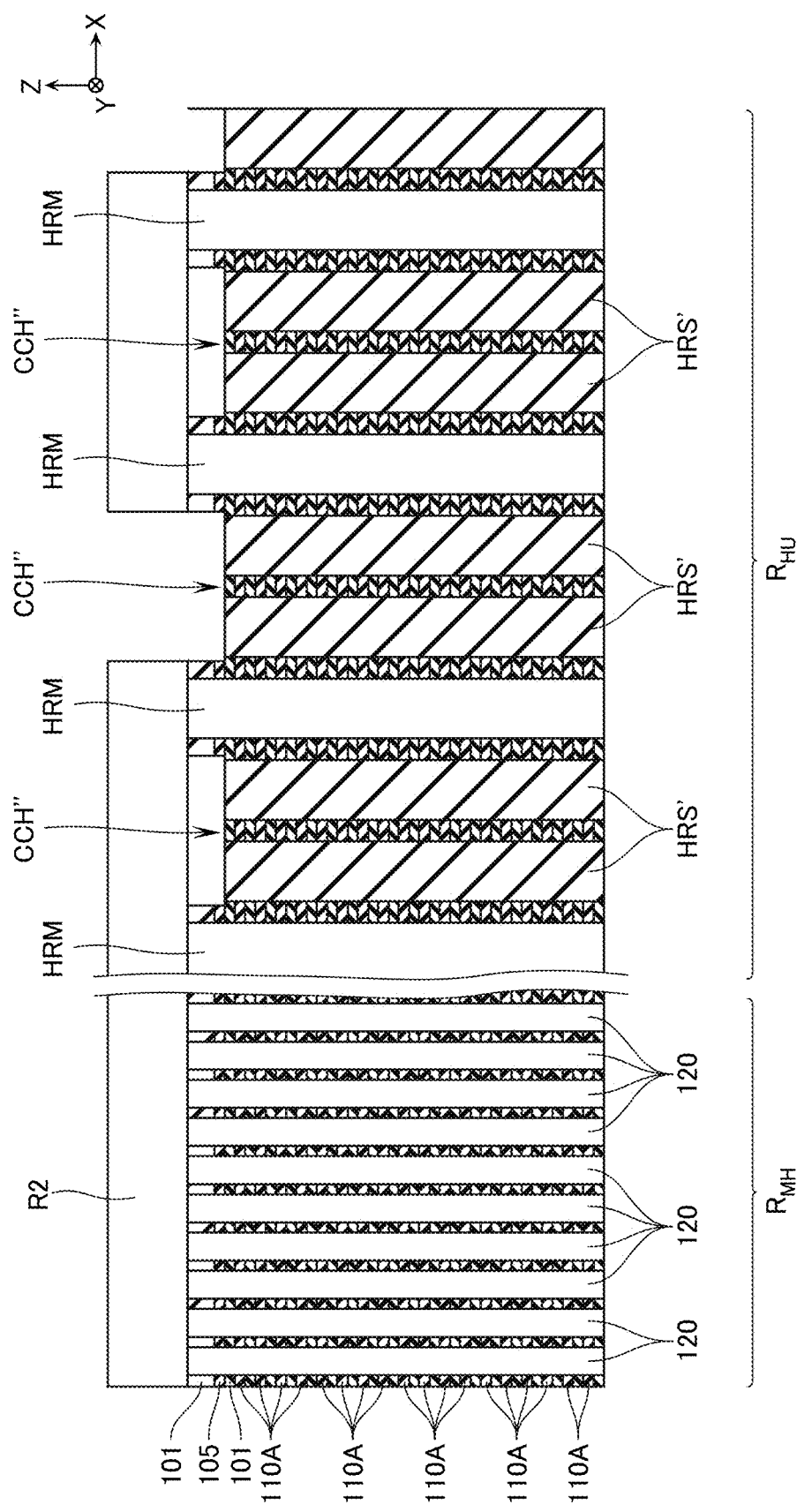
FIG. 62 is a schematic cross-sectional view for describing the same manufacturing method.

Next, as illustrated in FIG. 62, the resist R1 is peeled off to form the resist R2.

Figure 63:
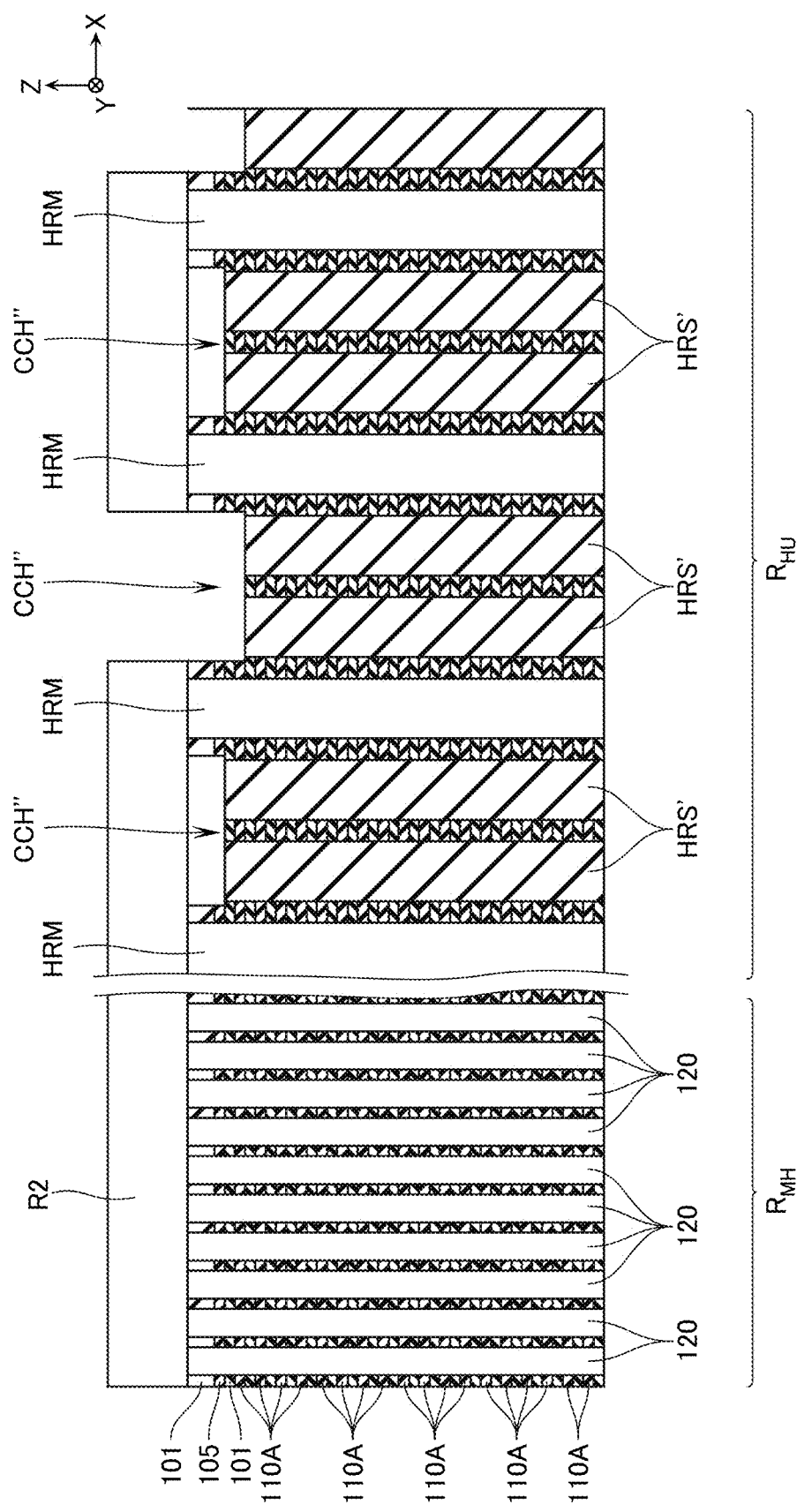
FIG. 63 is a schematic cross-sectional view for describing the same manufacturing method.

Next, as illustrated in FIG. 63, one layer of each of the insulating layer 101 and the sacrifice layer 110A is removed to expose the upper surface of the insulating layer 101. This process is performed by RIE or the like.

Figure 64:
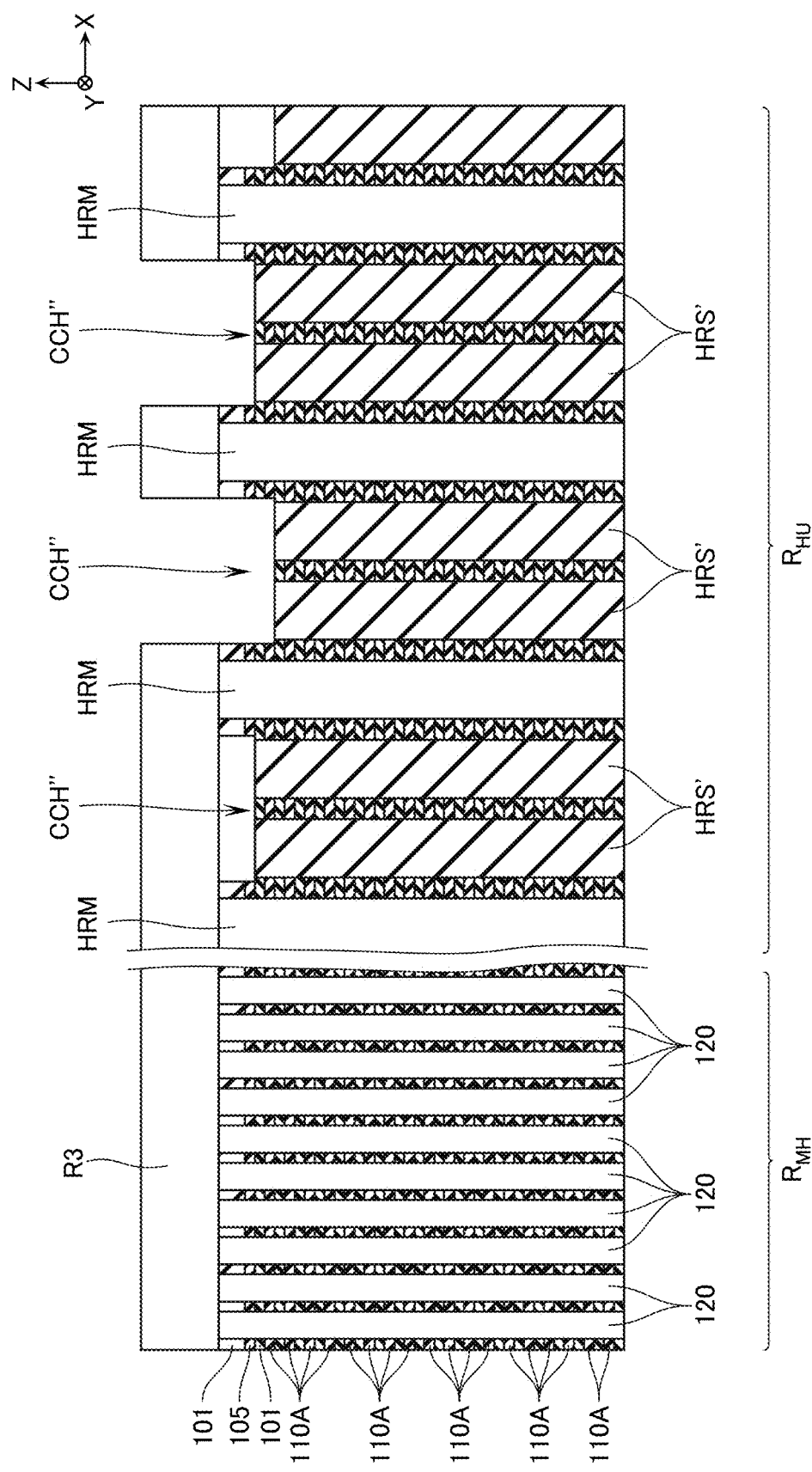
FIG. 64 is a schematic cross-sectional view for describing the same manufacturing method.

Next, as illustrated in FIG. 64, the resist R2 is peeled off to form the resist R3.

Figure 65:
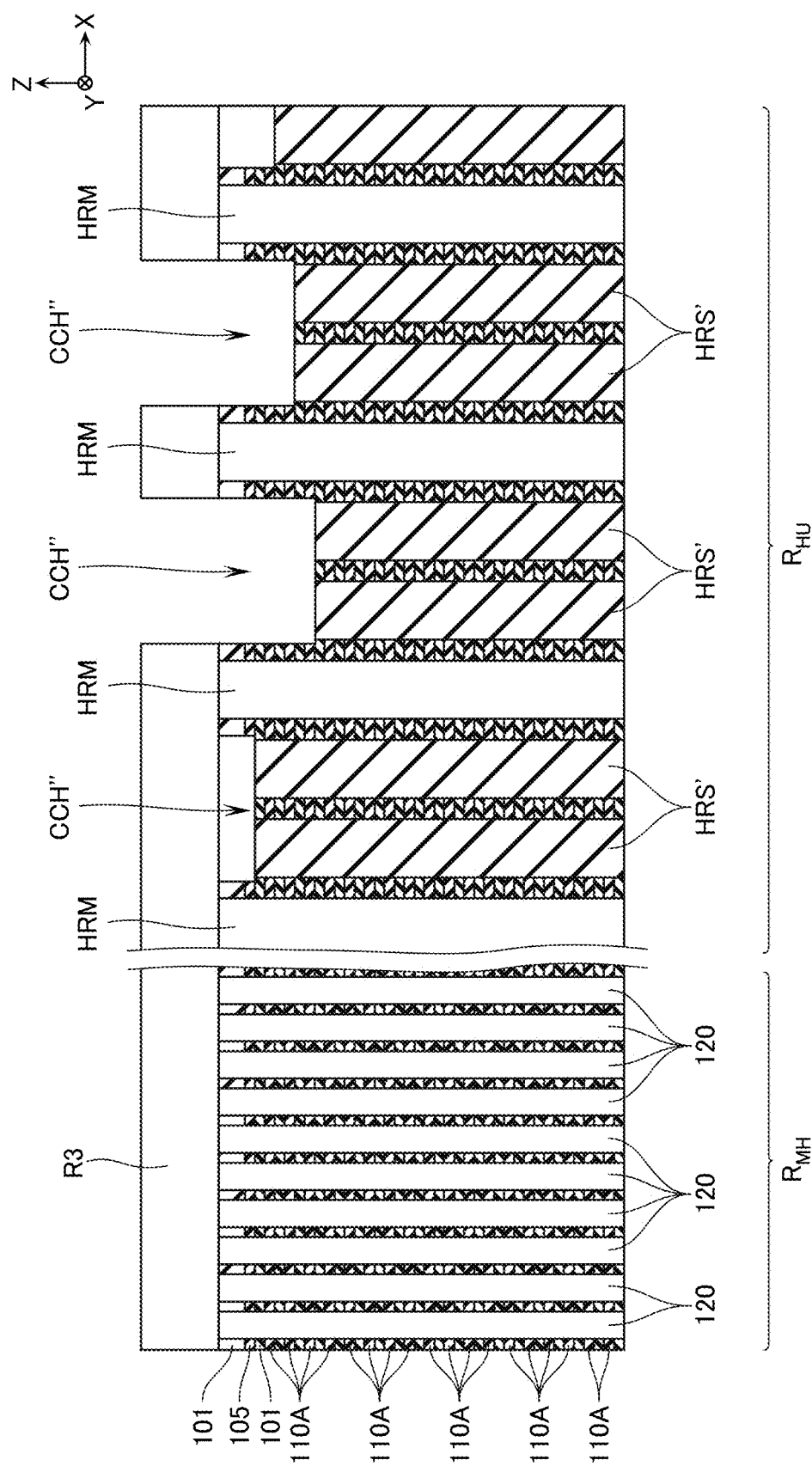
FIG. 65 is a schematic cross-sectional view for describing the same manufacturing method.

Next, as illustrated in FIG. 65, two layers of each of the insulating layer 101 and the sacrifice layer 110A are removed alternately to expose the upper surface of the insulating layer 101. This process is performed by RIE or the like.

Figure 66:
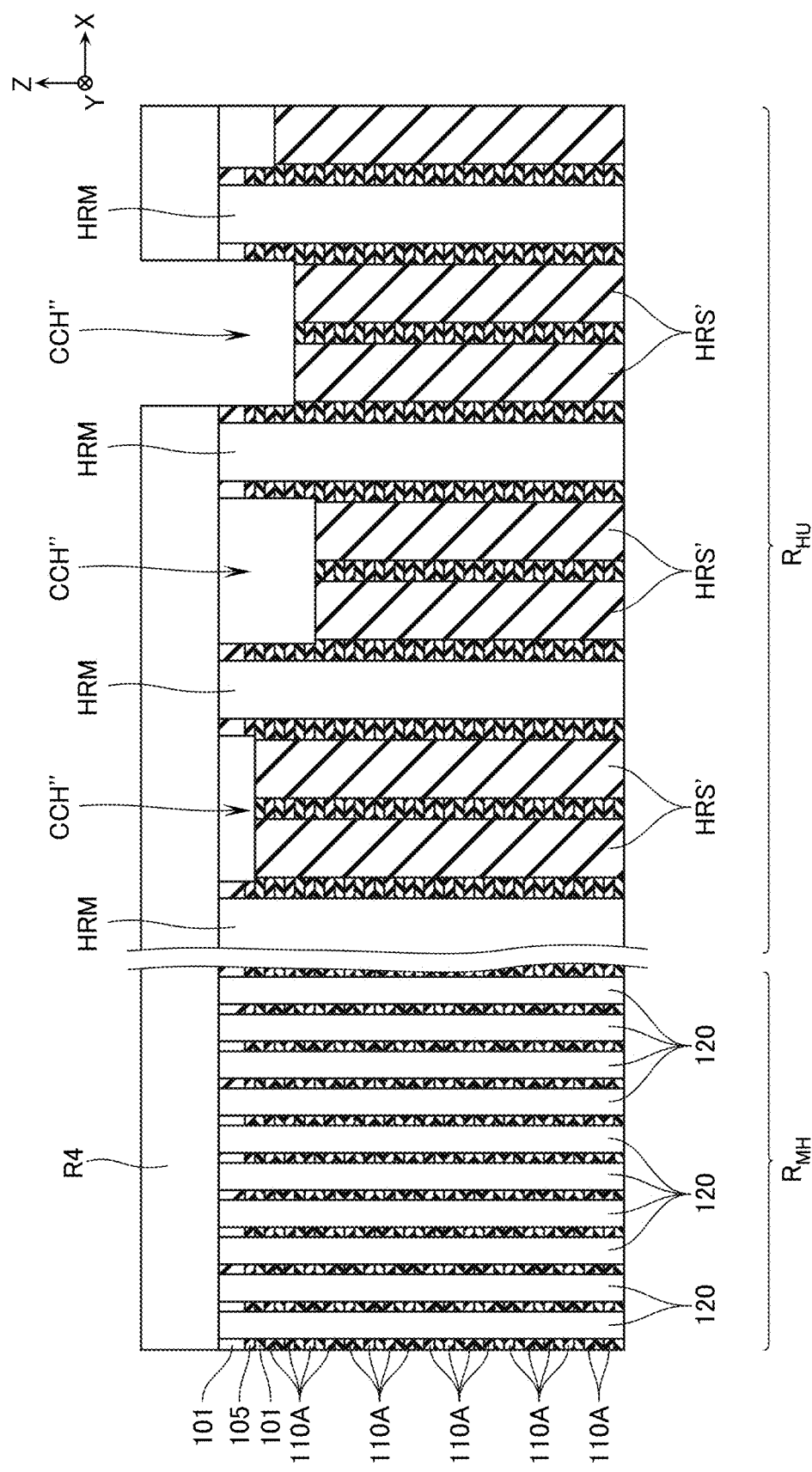
FIG. 66 is a schematic cross-sectional view for describing the same manufacturing method.

Next, as illustrated in FIG. 66, the resist R3 is peeled off to form the resist R4.

Figure 67:
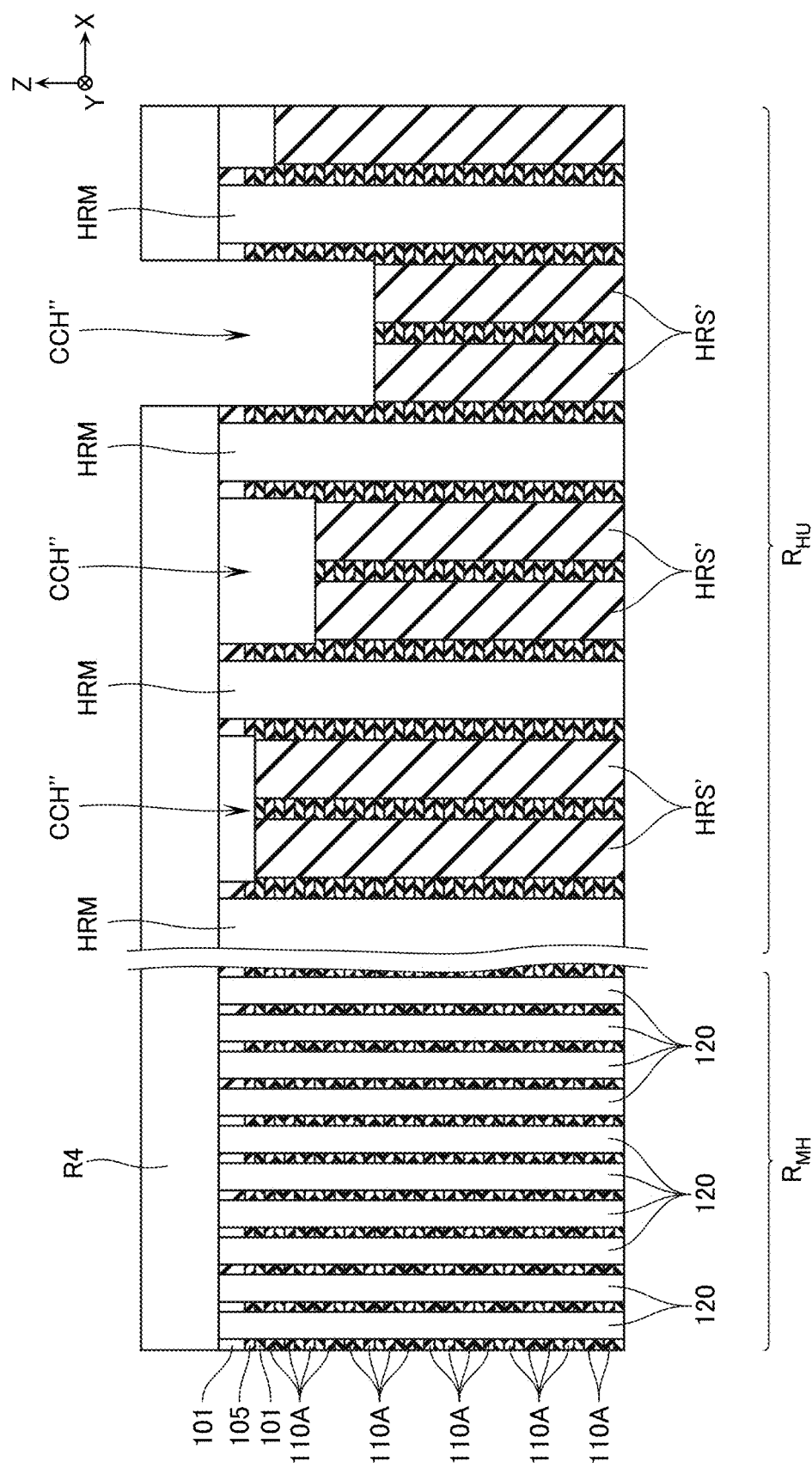
FIG. 67 is a schematic cross-sectional view for describing the same manufacturing method.

Next, as illustrated in FIG. 67, four layers of each of the insulating layer 101 and the sacrifice layer 110A are removed alternately to expose the upper surface of the insulating layer 101. This process is performed by RIE or the like.

Figure 68:
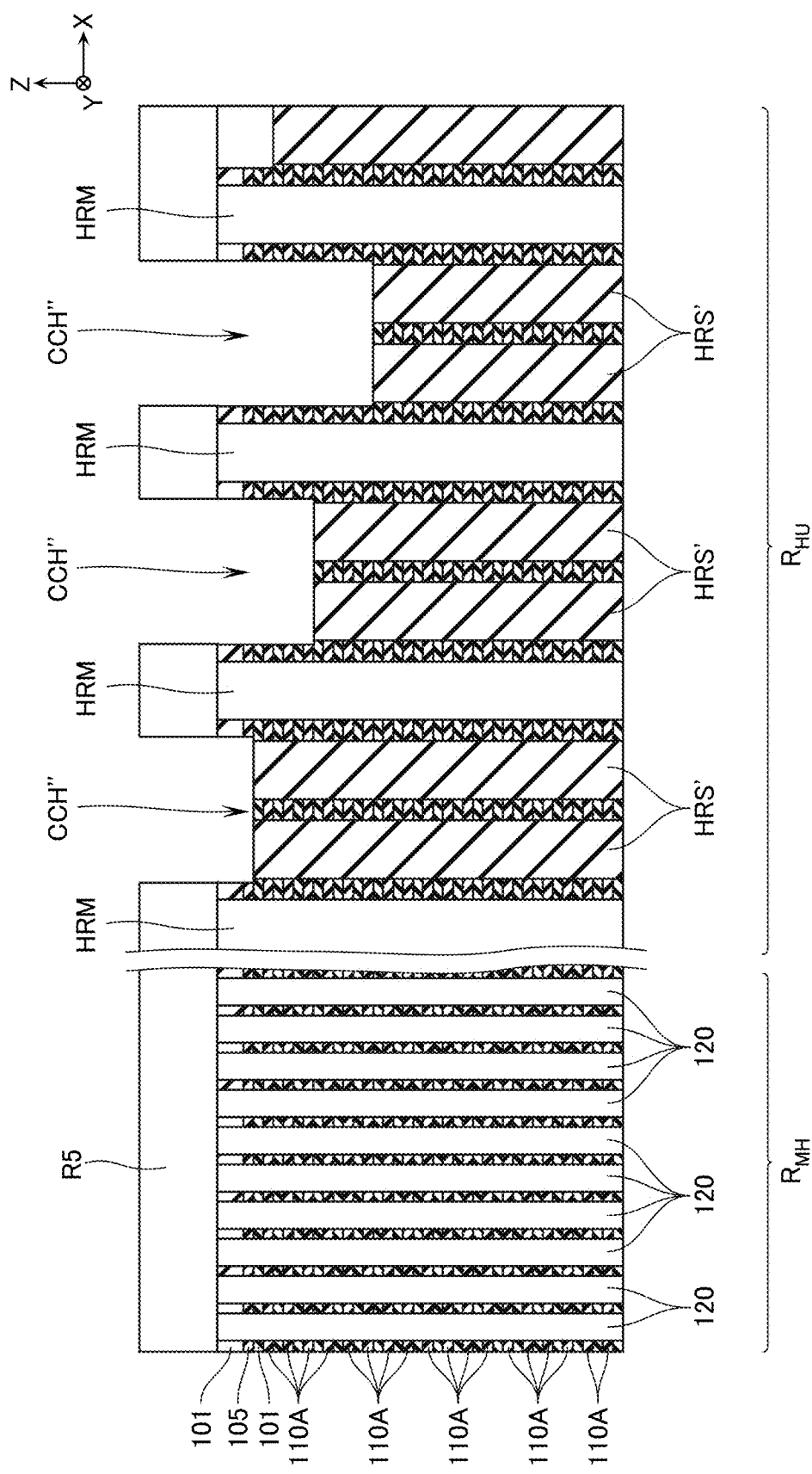
FIG. 68 is a schematic cross-sectional view for describing the same manufacturing method.

Next, as illustrated in FIG. 68, the resist R4 is peeled off to form the resist R5.

Figure 69:
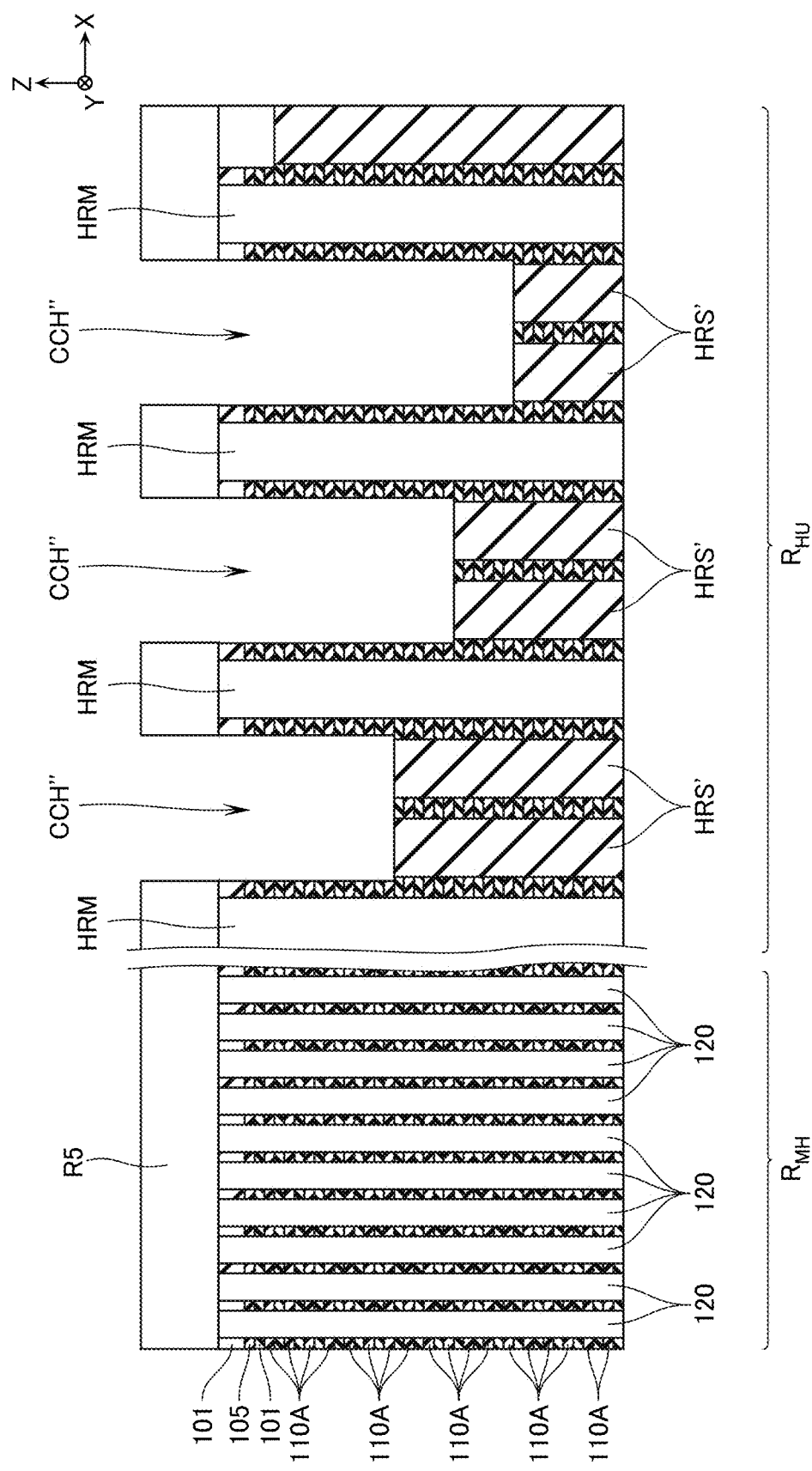
FIG. 69 is a schematic cross-sectional view for describing the same manufacturing method.

Next, as illustrated in FIG. 69, eight layers of each of the insulating layer 101 and the sacrifice layer 110A are removed alternately to expose the upper surface of the insulating layer 101. This process is performed by RIE or the like.

Figure 70:
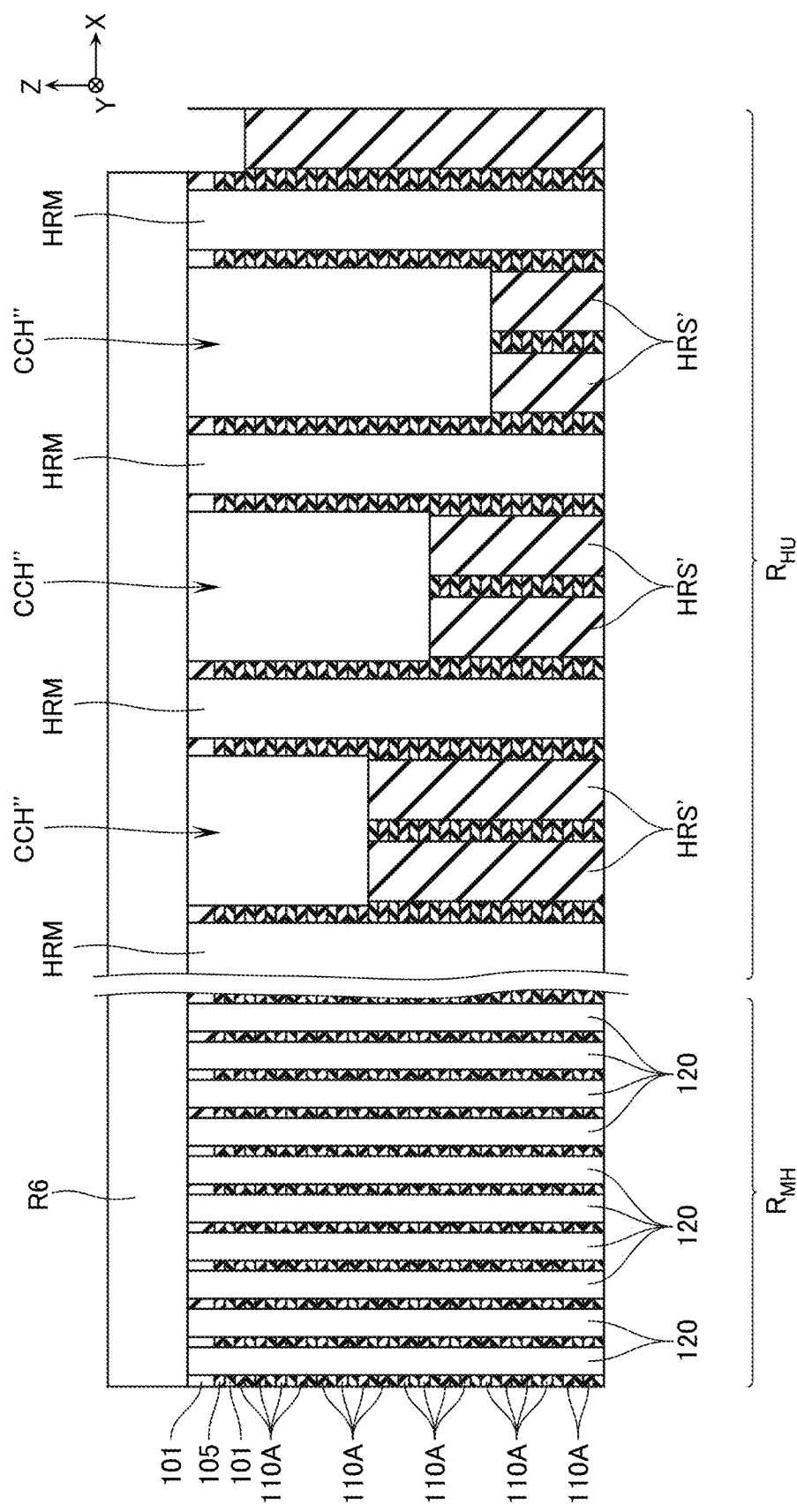
FIG. 70 is a schematic cross-sectional view for describing the same manufacturing method.

Next, as illustrated in FIG. 70, the resist R5 is peeled off to form the resist R6.

Figure 71:
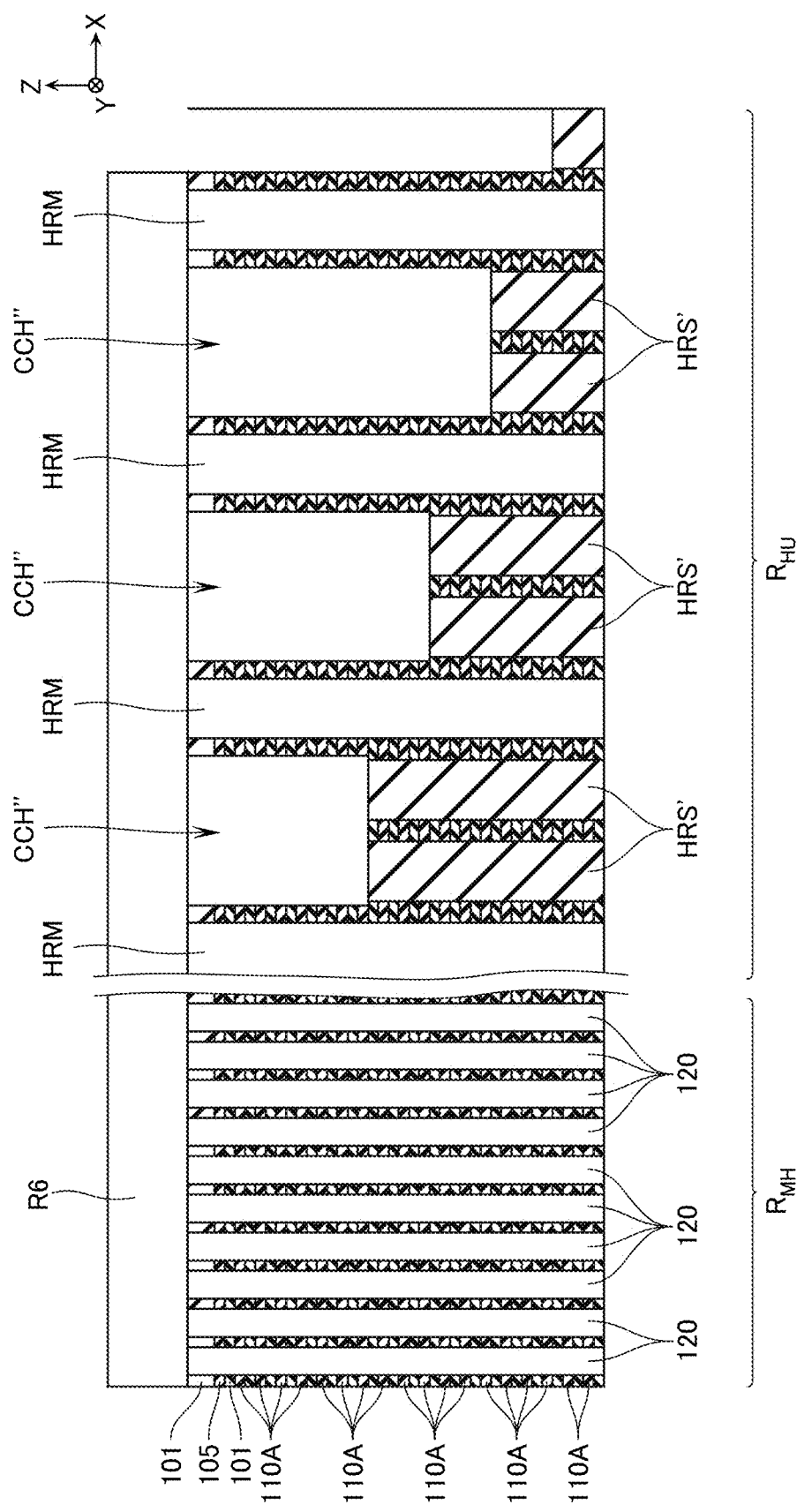
FIG. 71 is a schematic cross-sectional view for describing the same manufacturing method.

Next, as illustrated in FIG. 71, 16 layers of each of the insulating layer 101 and the sacrifice layer 110A are removed alternately to expose the upper surface of the insulating layer 101. This process is performed by RIE or the like.

Figure 72:
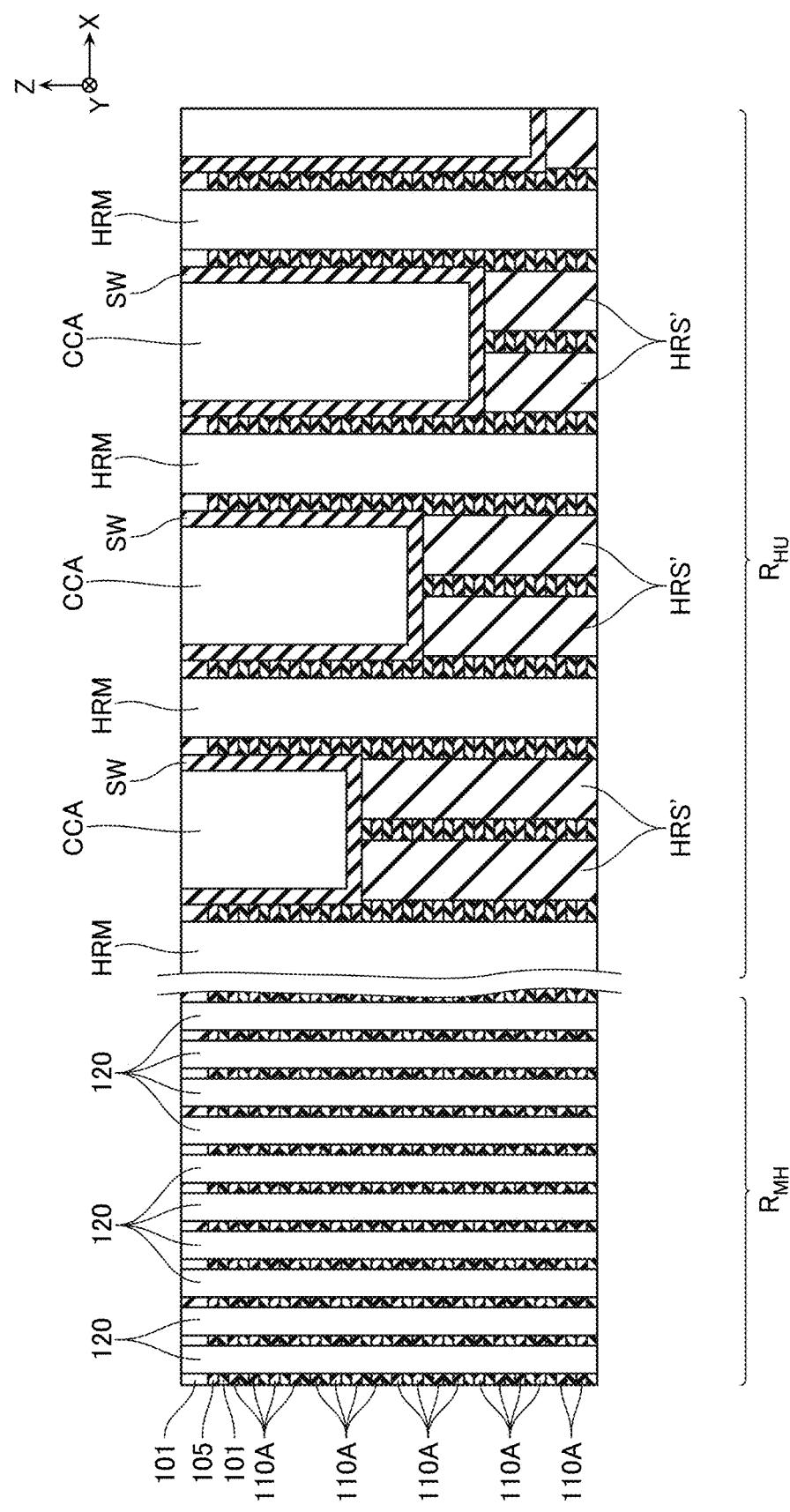
FIG. 72 is a schematic cross-sectional view for describing the same manufacturing method.

Next, as illustrated in FIG. 72, the insulating layer SW is formed on the inner peripheral surface and the bottom surface of the contact hole CCH" formed by the processes described with reference to FIG. 60 to FIG. 71. Further, the sacrifice layer CCA is formed inside the contact hole CCH". This process is performed by CVD or the like.

Figure 73:
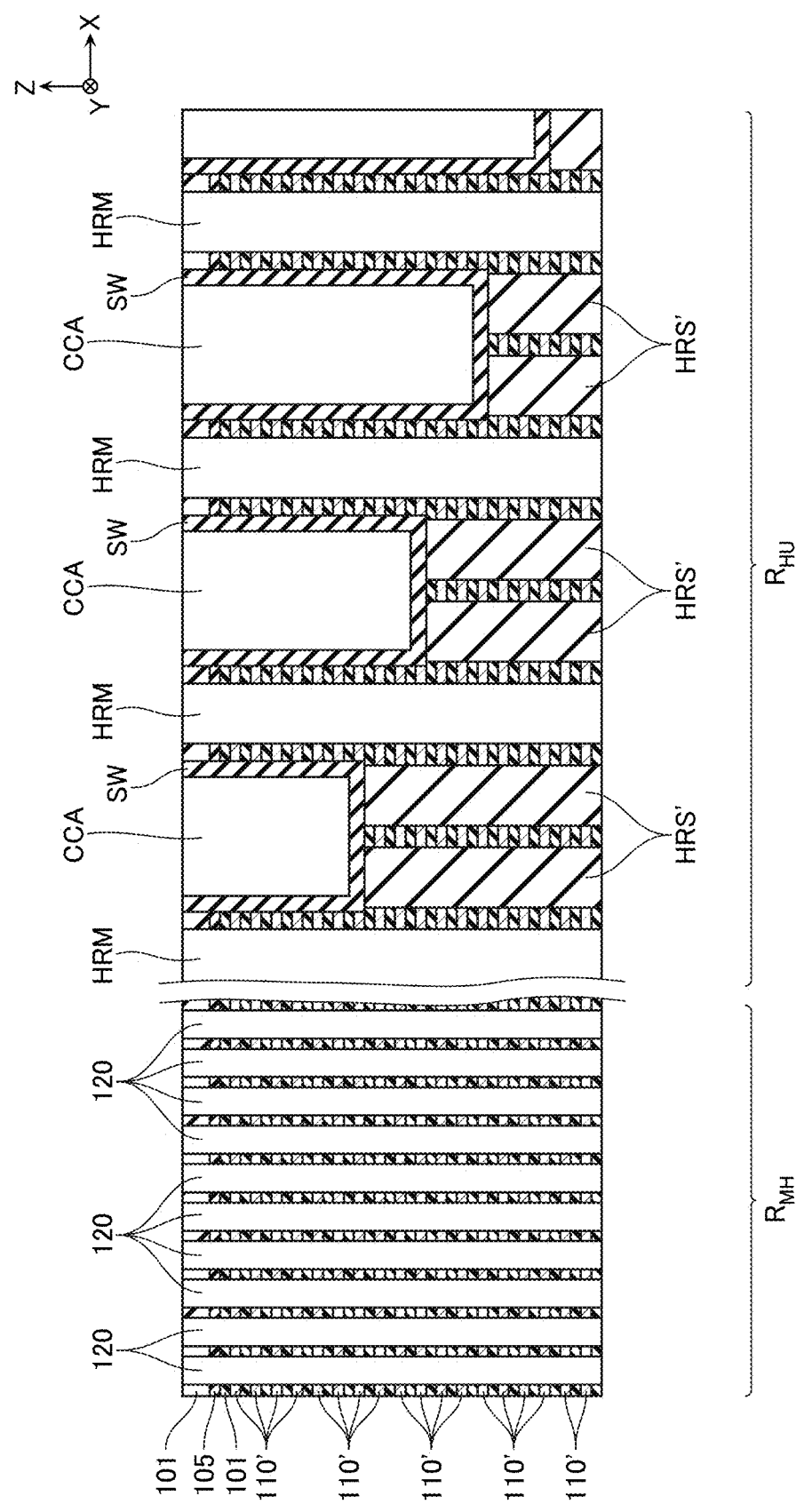
FIG. 73 is a schematic cross-sectional view for describing the same manufacturing method.

Next, among the manufacturing processes of the semiconductor memory device according to the first embodiment, the processes described with reference to FIG. 22 to FIG. 29 are performed. Accordingly, a configuration as illustrated in FIG. 73 is formed.

Figure 74:
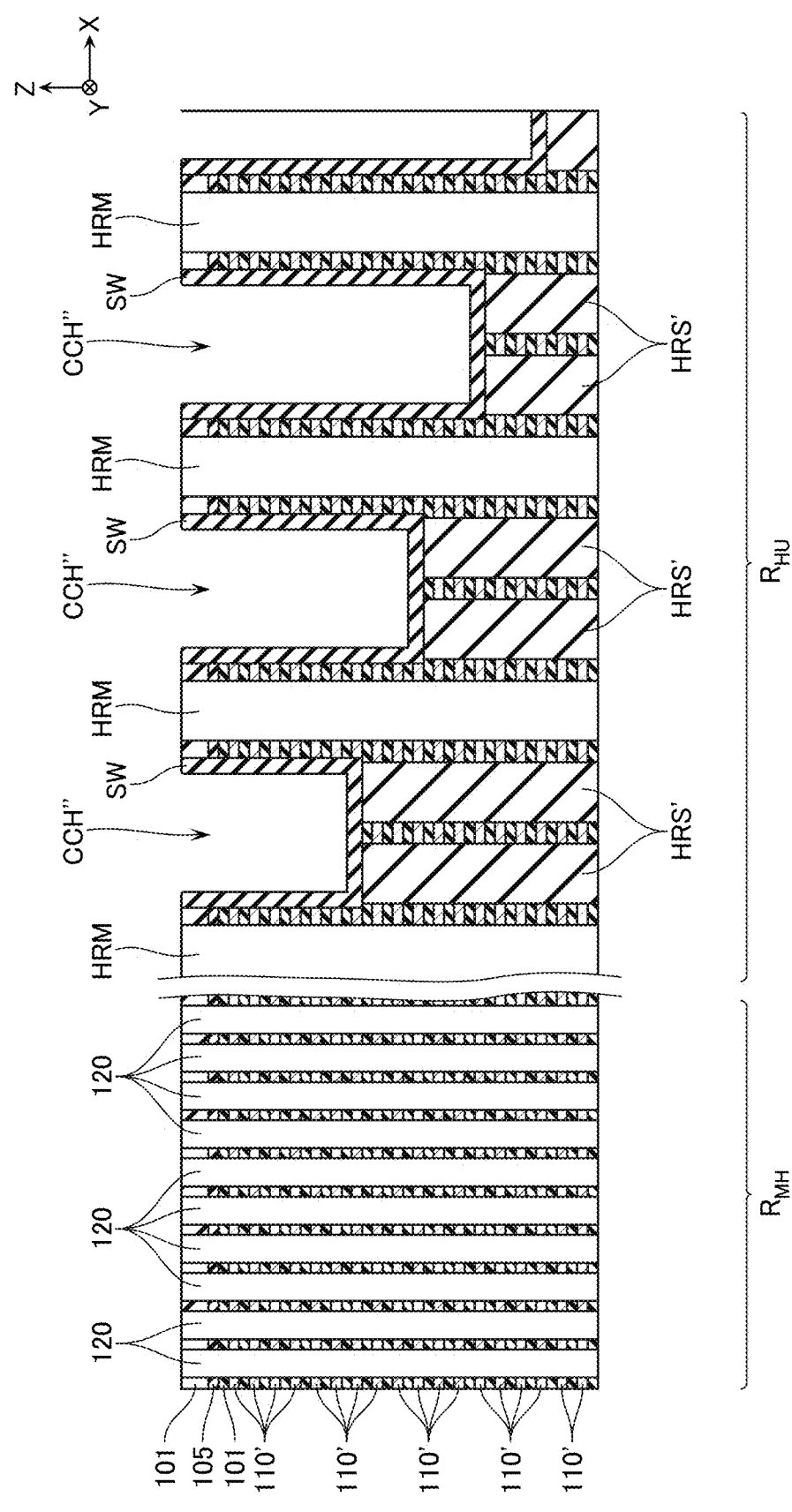
FIG. 74 is a schematic cross-sectional view for describing the same manufacturing method.

Next, as illustrated in FIG. 74, the sacrifice layers CCA are removed. This process is performed by wet etching or the like.

Figure 75:
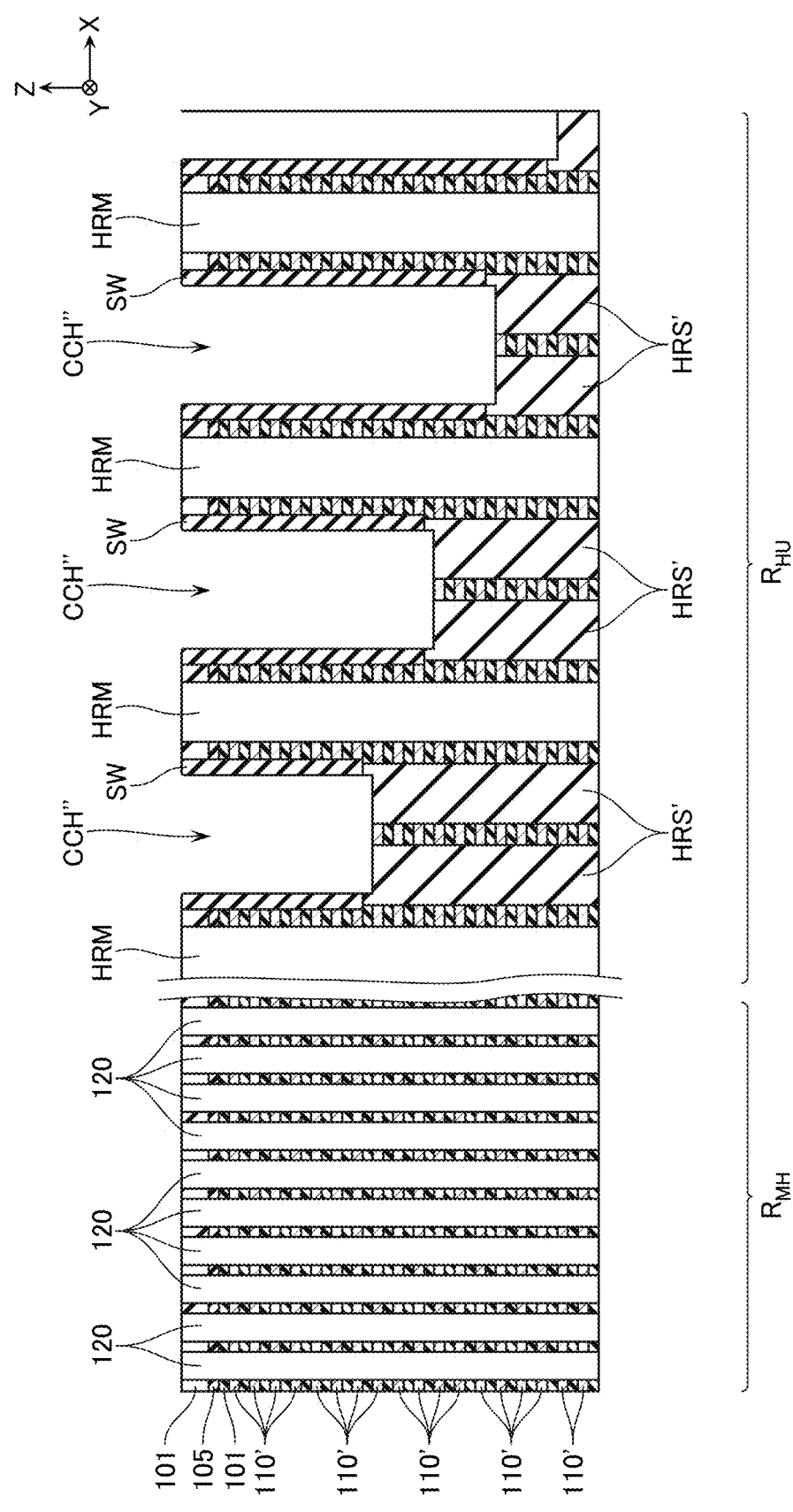
FIG. 75 is a schematic cross-sectional view for describing the same manufacturing method.

Next, as illustrated in FIG. 75, among the insulating layer SW, a part formed on the bottom surface of the contact hole CCH" is removed. Further, one layer of the insulating layer 101 is removed to expose the upper surface of the conductive layer 110'. This process is performed by RIE or Next, for example, as illustrated in FIG. 58, the contact electrodes CC are formed inside the contact holes CCH". This process is performed by CVD or the like.

Subsequently, by forming wirings and the like, the semiconductor memory device according to the fourth embodiment is formed.

[Effect]

Similarly to the semiconductor memory device according to the first embodiment, the semiconductor memory device according to the fourth embodiment can preferably support the hollow structure while reducing the occurrence of the level difference as described above.

Similarly to the semiconductor memory device according to the second embodiment, the semiconductor memory device according to the fourth embodiment facilitates uniform formation of the plurality of via holes HRH, compared with the semiconductor memory device according to the first embodiment.

Similarly to the semiconductor memory device according to the third embodiment, the semiconductor memory device according to the fourth embodiment is more easily manufacturable in some cases compared with the semiconductor memory device according to the second embodiment.

In the manufacturing process of the semiconductor memory device according to the third embodiment, in the processes described with reference to FIG. 43, FIG. 45, FIG. 47, FIG. 49, FIG. 51, and FIG. 53, the upper surface of the sacrifice layer 110A is exposed on the bottom surface of the contact hole CCH". In such processes, the sacrifice layer 110A is used as an etching stopper.

Here, in association with high integration of the semiconductor memory device, a thickness in the Z-direction of the sacrifice layer 110A is gradually decreasing. In such a state, when the sacrifice layer 110A is used as the etching stopper, the thickness in the Z-direction of the sacrifice layer 110A may possibly decrease even more in the processes described with reference to FIG. 43 to FIG. 53. In such a case, for example, in the process described with reference to FIG. 27, the sacrifice layer 110A sometimes cannot be removed preferably. Further, in the process described with reference to FIG. 28, the conductive layer 110' sometimes cannot be formed preferably.

Here, in order to reduce the decrease of thickness in the Z-direction of the sacrifice layer 110A, the insulating layer 101, instead of the sacrifice layer 110A, may be used as the etching stopper. However, in the manufacturing process of the semiconductor memory device according to the third embodiment, in the process described with reference to FIG. 43, the upper surface of the uppermost sacrifice layer 110A is exposed.

Therefore, in the manufacturing method of the semiconductor memory device according to the fourth embodiment, in the process described with reference to FIG. 59, the insulating layer 101, the insulating layer 105, and the insulating layer 101 are formed on the upper surface of the structure illustrated in FIG. 8 and FIG. 9. Further, in the process described with reference to FIG. 61, first, parts of the uppermost insulating layer 101 are removed to expose the upper surface of the insulating layer 105. Further, parts of the insulating layer 105 are removed to expose the upper surface of the insulating layer 101 immediately below the insulating layer 105. Further, in the processes described with reference to FIG. 62 to FIG. 71, the insulating layer 101 instead of the sacrifice layer 110A is used as the etching stopper.

Since such a method does not use the sacrifice layer 110A as the etching stopper, decrease of the thickness in the Z-direction of the sacrifice layer 110A can be reduced. Accordingly, in the process described with reference to FIG. 27, the sacrifice layer 110A can be preferably removed. Further, in the process described with reference to FIG. 28, the conductive layer 110' can be formed preferably. Therefore, the semiconductor memory device according to the fourth embodiment is more easily manufacturable in some cases, compared with the semiconductor memory device according to the third embodiment.

[Others]

The semiconductor memory devices according to the first embodiment to the fourth embodiment have been described above. However, the configurations described above are merely exemplifications, and the specific configuration is adjustable as necessary.

For example, in the example of FIG. 40, between two of the contact electrodes CC mutually adjacent in the X-direction, two supporting structures HRM arranged in the Y-direction are disposed. Further, between two contact electrodes CC mutually adjacent in the Y-direction, two supporting structures HRM arranged in the X-direction are disposed.

Figure 76:
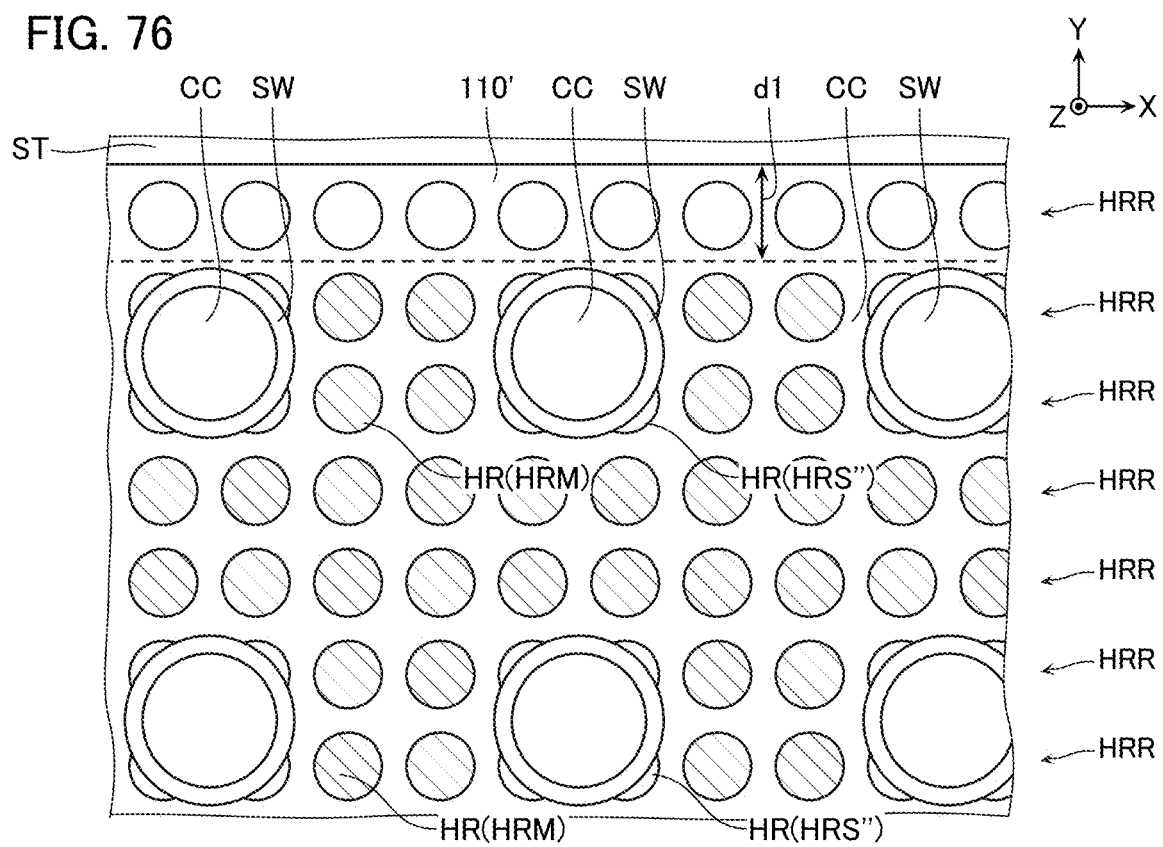
FIG. 76 is a schematic plan view illustrating a part of a configuration of a semiconductor memory device according to another embodiment.

Meanwhile, in the example of FIG. 76, between two contact electrodes CC mutually adjacent in the X-direction, four supporting structures HRM arranged in the X-direction and the Y-direction are disposed. Further, between two contact electrodes CC mutually adjacent in the Y-direction, four of the supporting structures HRM arranged in the X-direction and the Y-direction are disposed.

Figure 77:
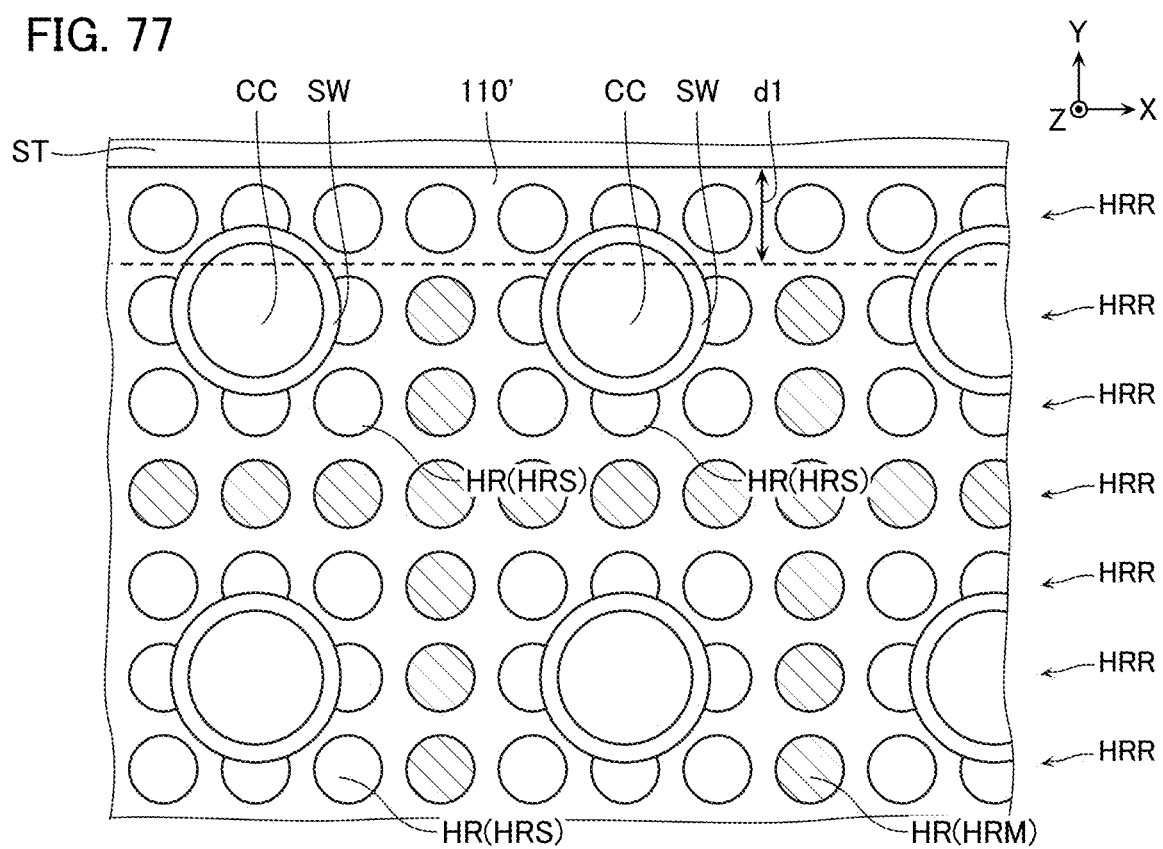
FIG. 77 is a schematic plan view illustrating a part of a configuration of a semiconductor memory device according to another embodiment.

In the example of FIG. 77, for example, between two contact electrodes CC mutually adjacent in the X-direction, three supporting structures HR arranged in the Y-direction are disposed. Further, between two contact electrodes CC mutually adjacent in the Y-direction, three supporting structures HRM arranged in the X-direction are disposed.

In FIG. 2, for example, a plurality (the number is 8 in the example of FIG. 2) of supporting structures HRM arranged successively in the Y-direction are exemplified. Further, a plurality of the supporting structures HRM arranged successively in the X-direction are also exemplified. In such a configuration, approximately 67% of the supporting structures HR disposed in the hook-up region $R_{HU}$ are the supporting structures HRM.

Figure 78:
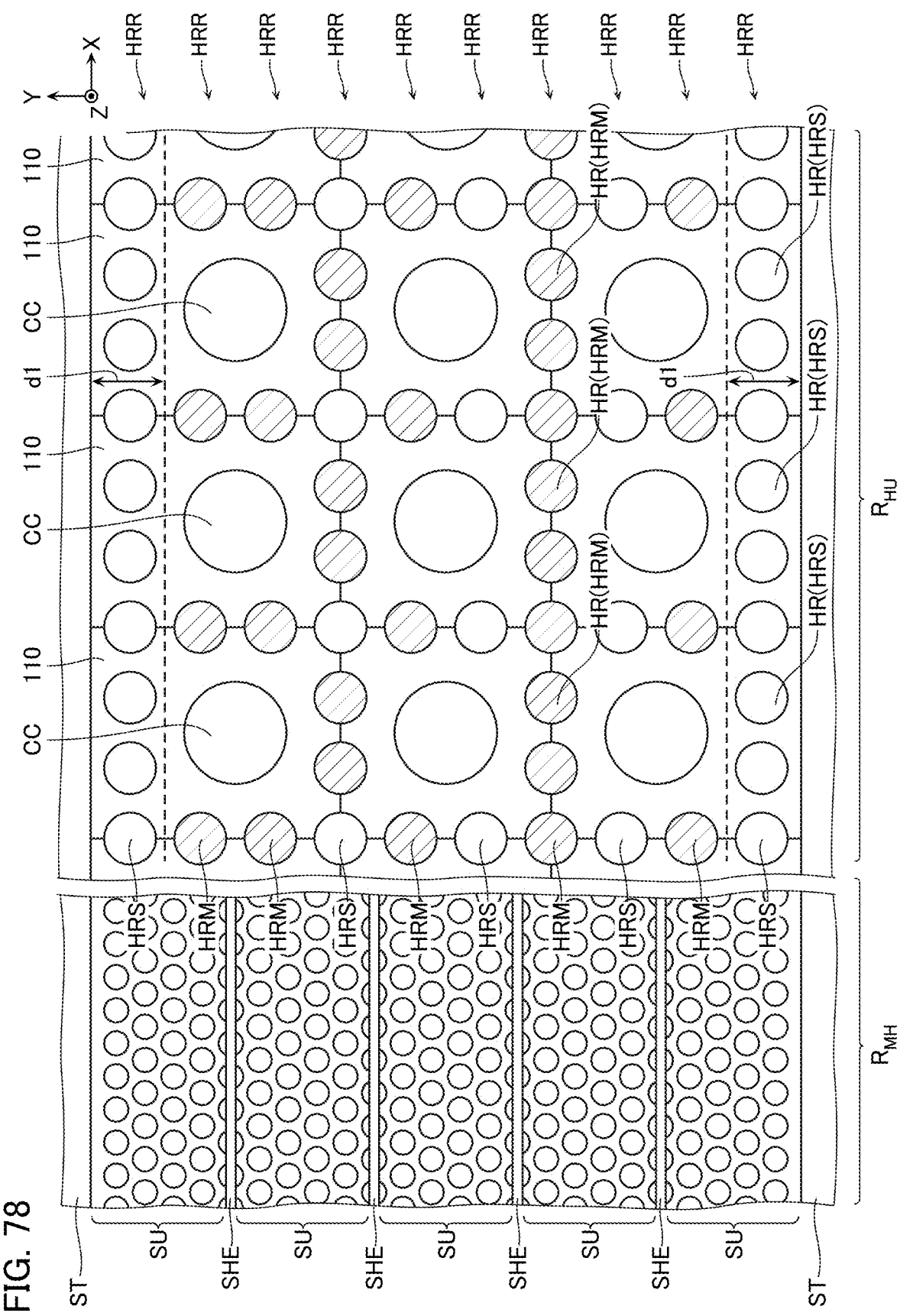
FIG. 78 is a schematic plan view illustrating a part of a configuration of a semiconductor memory device according to another embodiment.

Meanwhile, in FIG. 78, a plurality of the supporting structures HRM and a plurality of the supporting structures HRS arranged alternately in the Y-direction are exemplified. In the example of FIG. 78, among the ten supporting structure regions HRR arranged in the Y-direction, the third and fifth supporting structure regions HRR counted from one side in the Y-direction (such as the Y-direction negative side) include the supporting structures HRM instead of the supporting structures HRS. Further, among a plurality of the supporting structures HR included in the seventh supporting structure region HRR counted from one side in the Y-direction, the 3n+1-th (n is an integer of 0 or more) supporting structures HR counted from one side in the X-direction (such as the X-direction negative side) are the supporting structure HRS while the 3n+2-th and 3n+3-th supporting structures HR are the supporting structures HRM. In such a configuration, approximately 50% of the supporting structures HR disposed in the hook-up region $R_{HU}$ are the supporting structures HRM.

Figure 79:
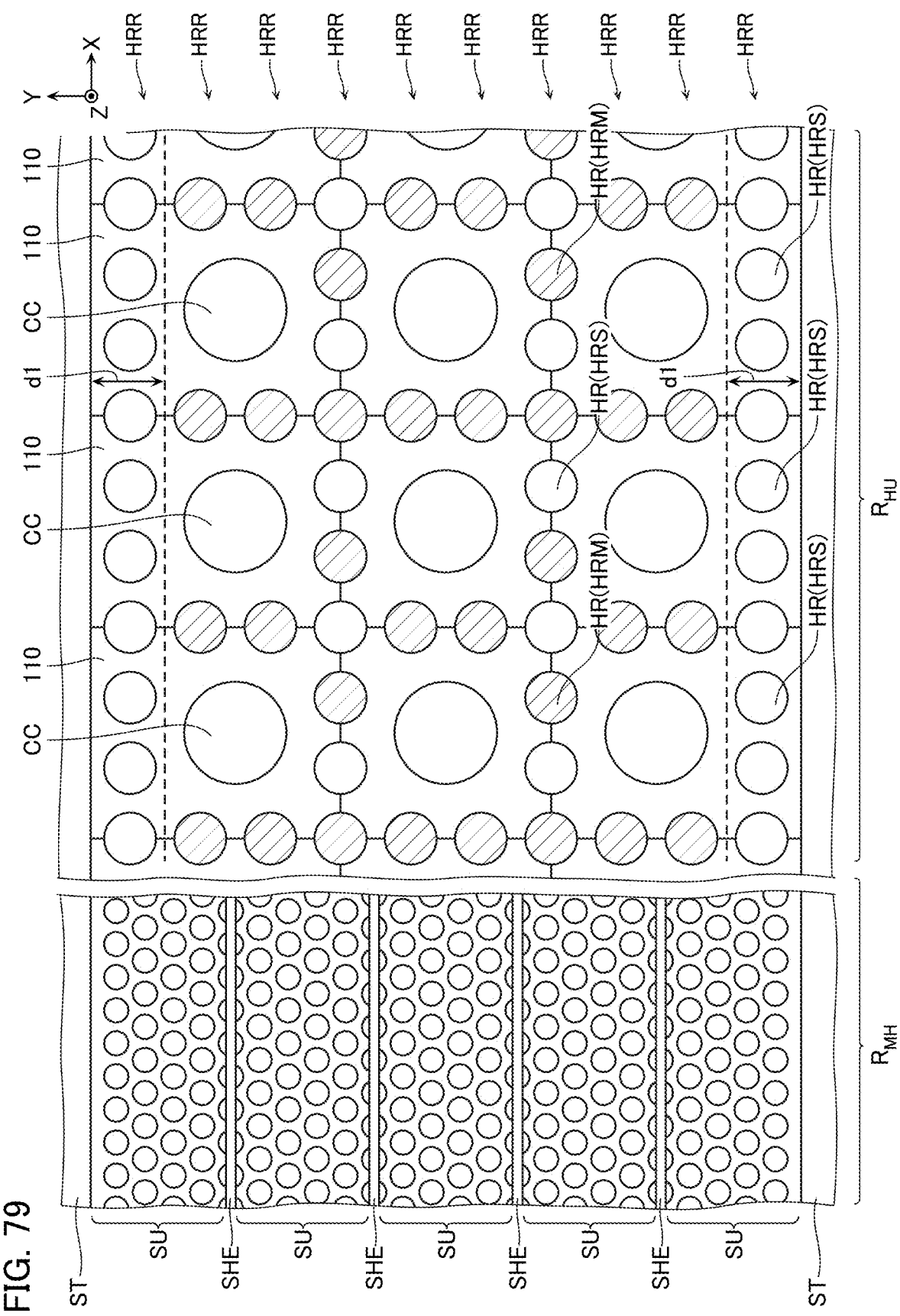
FIG. 79 is a schematic plan view illustrating a part of a configuration of a semiconductor memory device according to another embodiment.

In FIG. 79, a plurality of the supporting structures HRM and a plurality of the supporting structure HRS arranged alternately in the X-direction are exemplified. In the example of FIG. 79, among the ten supporting structure regions HRR arranged in the Y-direction, the fourth and seventh supporting structure regions HRR counted from one side in the Y-direction include a plurality of the supporting structures HRM, HRS arranged alternately in the X-direction. In such a configuration, 50% of the supporting structures HR disposed in the hook-up region $R_{HU}$ are the supporting structures HRM.

Figure 80:
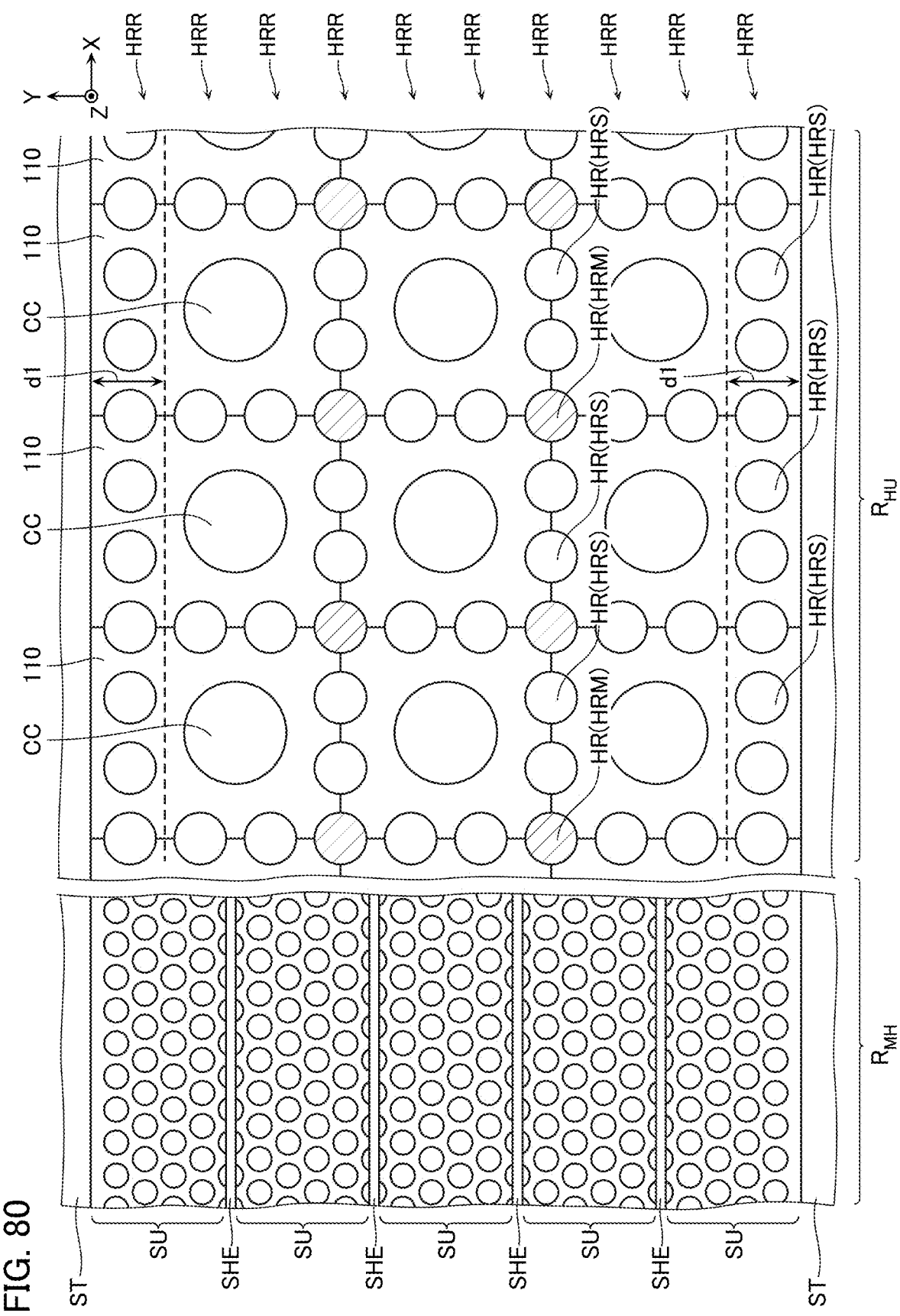
FIG. 80 is a schematic plan view illustrating a part of a configuration of a semiconductor memory device according to another embodiment.

In the example of FIG. 80, in the ten supporting structure regions HRR arranged in the Y-direction, among the fourth and seventh supporting structures HR counted from one side in the Y-direction, the 3n+1-th (n is an integer of 0 or more) supporting structures HR counted from one side in the X-direction are the supporting structures HRM while the 3n+2-th and 3n+3-th supporting structures HR are the supporting structures HRS. Further, the other supporting structure regions HRR include a plurality of supporting structures HRS arranged in the X-direction. In such a configuration, approximately 11% of the supporting structures HR disposed in the hook-up region $R_{HU}$ are the supporting structures HRM.

Figure 81:
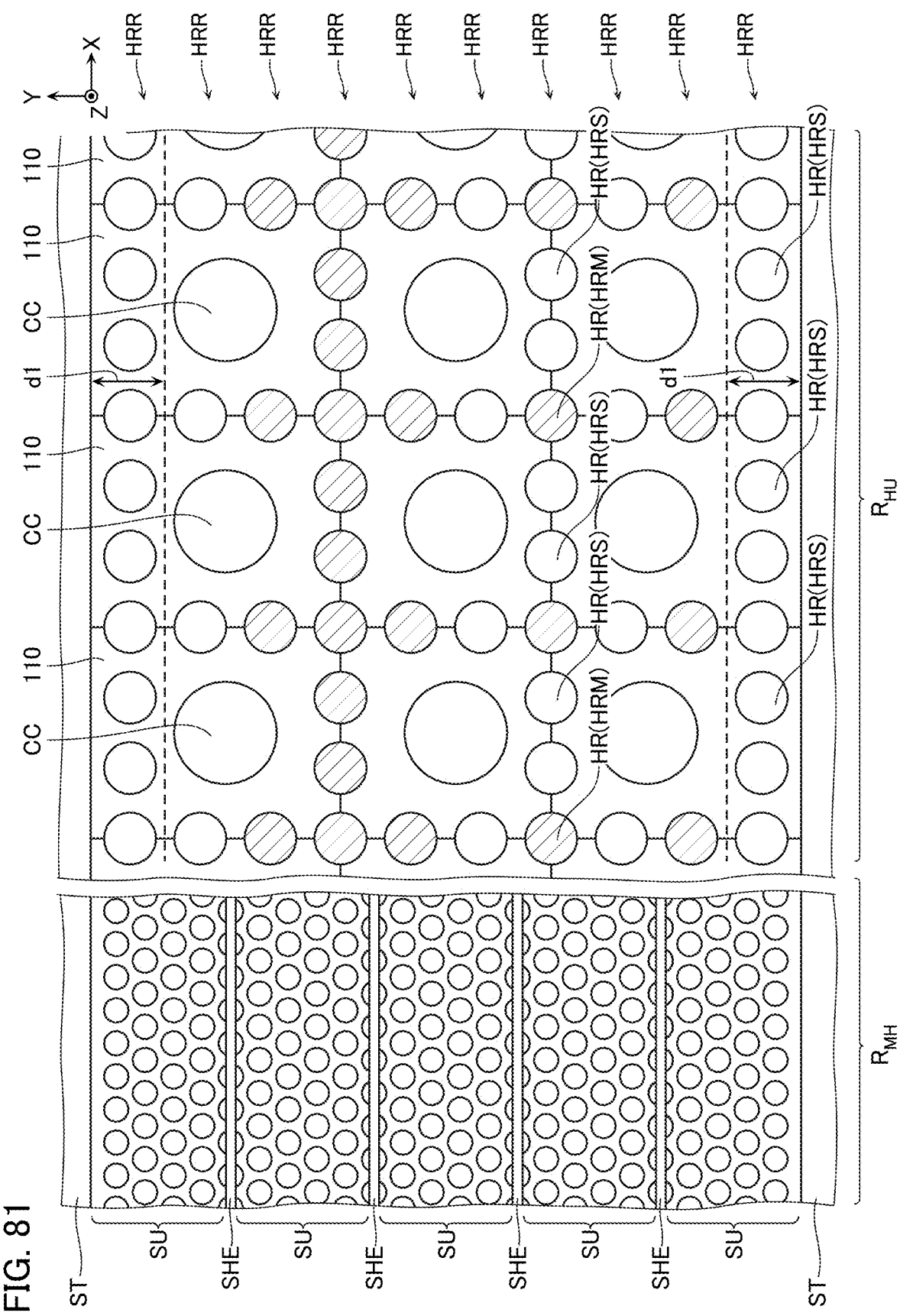
FIG. 81 is a schematic plan view illustrating a part of a configuration of a semiconductor memory device according to another embodiment.

In the example of FIG. 81, among three of the contact electrodes CC arranged in the Y-direction, center positions of the first and third contact electrodes CC in the XY plane counted from one side in the Y-direction are disposed on the Y-direction positive side with respect to center positions of a terrace region of each conductive layer 110 in the XY plane. Further, center positions of the second contact electrodes CC in the XY plane counted from one side in the Y-direction are disposed on the Y-direction negative side with respect to the center positions of the terrace region of each conductive layer 110 in the XY plane. Here, the terrace region means a region not overlapping with other conductive layers 110 when viewed from above, within the upper surface of the conductive layer 110.

In the example of FIG. 81, the first, third, fifth, ninth and tenth supporting structure regions HRR counted from one side in the Y-direction include the plurality of the supporting structures HRS arranged in the X-direction. Further, the second, and sixth to eighth supporting structure regions HRR counted from one side in the Y-direction include the plurality of the supporting structures HRM arranged in the X-direction. Further, in the fourth supporting structures HR counted from one side in the Y-direction, the 3n+1-th supporting structures HR counted from one side in the X-direction are the supporting structures HRM while the 3n+2-th and 3n+3-th supporting structures HR are the supporting structures HRS. In such a configuration, approximately 39% of the supporting structures HR disposed in the hook-up region $R_{HU}$ are the supporting structures HRM.

[Others]

While certain embodiments have been described, these embodiments have been presented by way of example only, and are not intended to limit the scope of the inventions. Indeed, the novel methods and systems described herein may be embodied in a variety of other forms: further, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a substrate including a first region and a second region arranged in a first direction;
   a plurality of first conductive layers arranged in a second direction intersecting with a surface of the substrate, and extending in the first direction across the first region and the second region;
   a first semiconductor layer disposed in the first region, extending in the second direction, and opposed to the plurality of first conductive layers;
   an electric charge accumulating layer disposed between the plurality of first conductive layers and the first semiconductor layer;
   a contact electrode disposed in the second region, extending in the second direction, and connected to one of the plurality of first conductive layers; and
   a plurality of first structures and a plurality of second structures disposed in the second region, extending in the second direction, and having outer peripheral surfaces surrounded by the plurality of first conductive layers, wherein
   the first structure includes:
      a second semiconductor layer extending in the second direction, opposed to the plurality of first conductive layers, and including a semiconductor material in common with the first semiconductor layer; and
      a first insulating layer disposed between the plurality of first conductive layers and the second semiconductor layer, and including an insulating material in common with the electric charge accumulating layer,
   the second structure does not include the semiconductor material or the insulating material, and
   the plurality of second structures are arranged with the plurality of first structures in a third direction intersecting with the first direction and the second direction.

2. The semiconductor memory device according to claim 1, wherein
   the semiconductor material is polycrystalline silicon (Si), and
   the insulating material is silicon nitride (SiN).

3. The semiconductor memory device according to claim 1, wherein
   the second structure includes a second insulating layer including silicon oxide ($SiO_2$).

4. The semiconductor memory device according to claim 1, wherein
   the second region includes:
      a third region having a smaller distance from end portions on one side of the plurality of first conductive layers than a first distance in the third direction;
      a fourth region having a smaller distance from end portions on the other side of the plurality of first conductive layers than the first distance in the third direction; and
      a fifth region disposed between the third region and the fourth region, wherein
   the plurality of first structures are disposed in the fifth region,
   at least a part of the plurality of second structures are disposed in the third region, and
   at least a part of the plurality of second structures are disposed in the fourth region.

5. The semiconductor memory device according to claim 4, wherein
   a third structure extending in the first direction and the second direction is formed in one side and the other side in the third direction of the plurality of first conductive layers.

6. The semiconductor memory device according to claim 1, wherein
   each of the plurality of first structures is disposed between two contact electrodes mutually adjacent in the first direction.

7. The semiconductor memory device according to claim 1, wherein
   at least a part of the plurality of second structures are in contact with the contact electrode.

8. The semiconductor memory device according to claim 1, wherein
   a third insulating layer including silicon oxide ($SiO_2$) is disposed on an outer peripheral surface of the contact electrode.

9. A semiconductor memory device comprising:
   a substrate including a first region and a second region arranged in a first direction;

a plurality of first conductive layers arranged in a second direction intersecting with a surface of the substrate, and extending in the first direction across the first region and the second region;

a first semiconductor layer disposed in the first region, extending in the second direction, and opposed to the plurality of first conductive layers;

an electric charge accumulating layer disposed between the plurality of first conductive layers and the first semiconductor layer;

a contact electrode disposed in the second region, extending in the second direction, and connected to one of the plurality of first conductive layers; and a metal oxide film disposed in the second region, and surrounding an outer peripheral surface of the contact electrode, wherein the outer peripheral surface of the contact electrode is surrounded by at least a part of the plurality of first conductive layers.

10. The semiconductor memory device according to claim 9, wherein
the metal oxide film is farther from the substrate than the plurality of first conductive layers.

11. The semiconductor memory device according to claim 10, comprising:
a fourth insulating layer arranged in one side and the other side in the second direction of the metal oxide film.

12. The semiconductor memory device according to claim 11, wherein
the metal oxide film is a material having higher resistance against phosphoric acid compared with silicon nitride ($Si_3N_4$) and having a large selectivity to the fourth insulating layer when etching.

13. The semiconductor memory device according to claim 9, wherein
the metal oxide film includes at least one of aluminum (Al), titanium (Ti), hafnium (Hf) or zirconium (Zr).

14. A semiconductor memory device comprising:
a substrate including a first region and a second region arranged in a first direction;

a plurality of first conductive layers arranged in a second direction intersecting with a surface of the substrate, and extending in the first direction across the first region and the second region;

a first semiconductor layer disposed in the first region, extending in the second direction, and opposed to the plurality of first conductive layers;

an electric charge accumulating layer disposed between the plurality of first conductive layers and the first semiconductor layer;

a contact electrode disposed in the second region, extending in the second direction, and connected to one of the plurality of first conductive layers; and a metal oxide film disposed in the second region, and surrounding an outer peripheral surface of the contact electrode, wherein the metal oxide film is farther from the substrate than the plurality of first conductive layers.

15. The semiconductor memory device according to claim 14, comprising:
a fourth insulating layer arranged in one side and the other side in the second direction of the metal oxide film.

16. The semiconductor memory device according to claim 14, wherein
the metal oxide film is a material having higher resistance against phosphoric acid compared with silicon nitride ($Si_3N_4$) and having a large selectivity to the fourth insulating layer when etching.

17. The semiconductor memory device according to claim 14, wherein
the metal oxide film includes at least one of aluminum (Al), titanium (Ti), hafnium (Hf) or zirconium (Zr).

* * * * *